United States Patent
Chen et al.

(10) Patent No.: US 10,096,537 B1
(45) Date of Patent: Oct. 9, 2018

(54) THERMAL MANAGEMENT SYSTEMS, METHODS FOR MAKING, AND METHODS FOR USING

(71) Applicant: Microfabrica Inc., Van Nuys, CA (US)

(72) Inventors: Richard T. Chen, Woodland Hills, CA (US); Will J. Tan, Pasadena, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

(21) Appl. No.: 15/475,074

(22) Filed: Mar. 30, 2017

Related U.S. Application Data

(66) Continuation-in-part of application No. 15/431,760, filed on Feb. 13, 2017, which is a continuation-in-part of application No. 15/283,013, filed on Sep. 30, 2016, Substitute for application No. 62/235,547, filed on Sep. 30, 2015.

(60) Provisional application No. 62/294,389, filed on Feb. 12, 2016, provisional application No. 62/321,848, filed on Apr. 13, 2016, provisional application No. 62/357,275, filed on Jun. 30, 2016, provisional application No. 62/355,557, filed on Jun. 28, 2016, provisional application No. 62/321,840, filed on Apr. 13, 2016, provisional application No. 62/316,470, filed on Mar. 31, 2016, provisional application No. 62/274,056, filed on Dec. 31, 2015.

(51) Int. Cl.
*H01L 23/34* (2006.01)
*H01L 23/427* (2006.01)
*F28D 15/04* (2006.01)

(52) U.S. Cl.
CPC ............ *H01L 23/427* (2013.01); *F28D 15/04* (2013.01)

(58) Field of Classification Search
CPC .... H01L 23/427; H01L 23/4275; F28D 15/04
USPC ........................................................ 257/715
See application file for complete search history.

(56) References Cited

U.S. PATENT DOCUMENTS

| | | |
|---|---|---|
| 5,190,637 A | 3/1993 | Guckel |
| 5,864,466 A | 1/1999 | Remsburg |
| 6,027,630 A | 2/2000 | Cohen |
| 6,064,572 A | 5/2000 | Remsburg |
| 6,675,875 B1 | 1/2004 | Zhu |
| 6,793,007 B1 | 9/2004 | Frankel |
| 6,827,135 B1 | 12/2004 | Frankel |
| 7,133,286 B2 | 11/2006 | Schmidt |
| 7,156,159 B2 | 1/2007 | Zhou |
| 7,190,580 B2 | 3/2007 | Schmidt |
| 7,218,519 B2 | 5/2007 | Prasher |
| 7,227,257 B2 | 6/2007 | List |

(Continued)

*Primary Examiner* — Tu-Tu Ho
(74) *Attorney, Agent, or Firm* — Dennis R. Smalley

(57) ABSTRACT

Embodiments of the present invention are directed to heat transfer arrays, cold plates including heat transfer arrays along with inlets and outlets, and thermal management systems including cold-plates, pumps and heat exchangers. These devices and systems may be used to provide thermal management or cooling of semiconductor devices and particularly such devices that produce high heat concentrations. The heat transfer arrays may include microjets, microchannels, fins, and even integrated microjets and fins. Other embodiments of the invention are directed to heat spreaders (e.g. heat pipes or vapor chambers) that provide enhanced thermal management via enhanced wicking structures and/or vapor creation and flow structures. Other embodiments provide enhanced methods for making such arrays and spreaders.

19 Claims, 34 Drawing Sheets

(56) References Cited

U.S. PATENT DOCUMENTS

| | | |
|---|---|---|
| 7,334,630 B2 | 2/2008 | Laser |
| 7,432,592 B2 | 10/2008 | Lu |
| 7,607,470 B2 | 10/2009 | Heffington |
| 7,731,079 B2 | 6/2010 | Simons |
| 7,806,168 B2 | 10/2010 | Zhou |
| 7,842,553 B2 | 11/2010 | List |
| 7,928,565 B2 | 4/2011 | Michel |
| 7,978,473 B2 | 7/2011 | Simons |
| 8,012,808 B2 | 9/2011 | Lu |
| 8,037,927 B2 | 10/2011 | Schuette |
| 8,232,637 B2 | 7/2012 | Glaser |
| 8,378,322 B2 | 2/2013 | Jongewaard |
| 8,488,323 B2 | 7/2013 | Peterson |
| 8,528,628 B2 | 9/2013 | Robinson |
| 8,723,146 B2 | 5/2014 | Jongewaard |
| 8,912,643 B2 | 12/2014 | Browne |
| 9,337,121 B2 | 5/2016 | Nam |
| 9,347,987 B2 | 5/2016 | Maveety |
| 9,448,278 B2 | 9/2016 | Maveety |
| 9,668,334 B2 | 5/2017 | Giovanniello |
| 9,848,509 B2 | 12/2017 | Shedd |
| 2010/0309940 A1* | 12/2010 | Lee ............ H01S 5/02469 372/34 |
| 2015/0237767 A1 | 8/2015 | Shedd |

* cited by examiner

A ≥ 300 microns (e.g. 600 - 1000 microns)

B ≥ 300 microns (e.g. 600 - 1000 microns)

C = 30 - 200 microns
D = 30 - 150 microns
E = 30 - 100 microns
F = 50 - 100 microns
G = 80 - 300 microns H = 100 - 300 microns
I = 50 - 200 microns
J = 50 - 200 microns
K = 50 - 100 microns

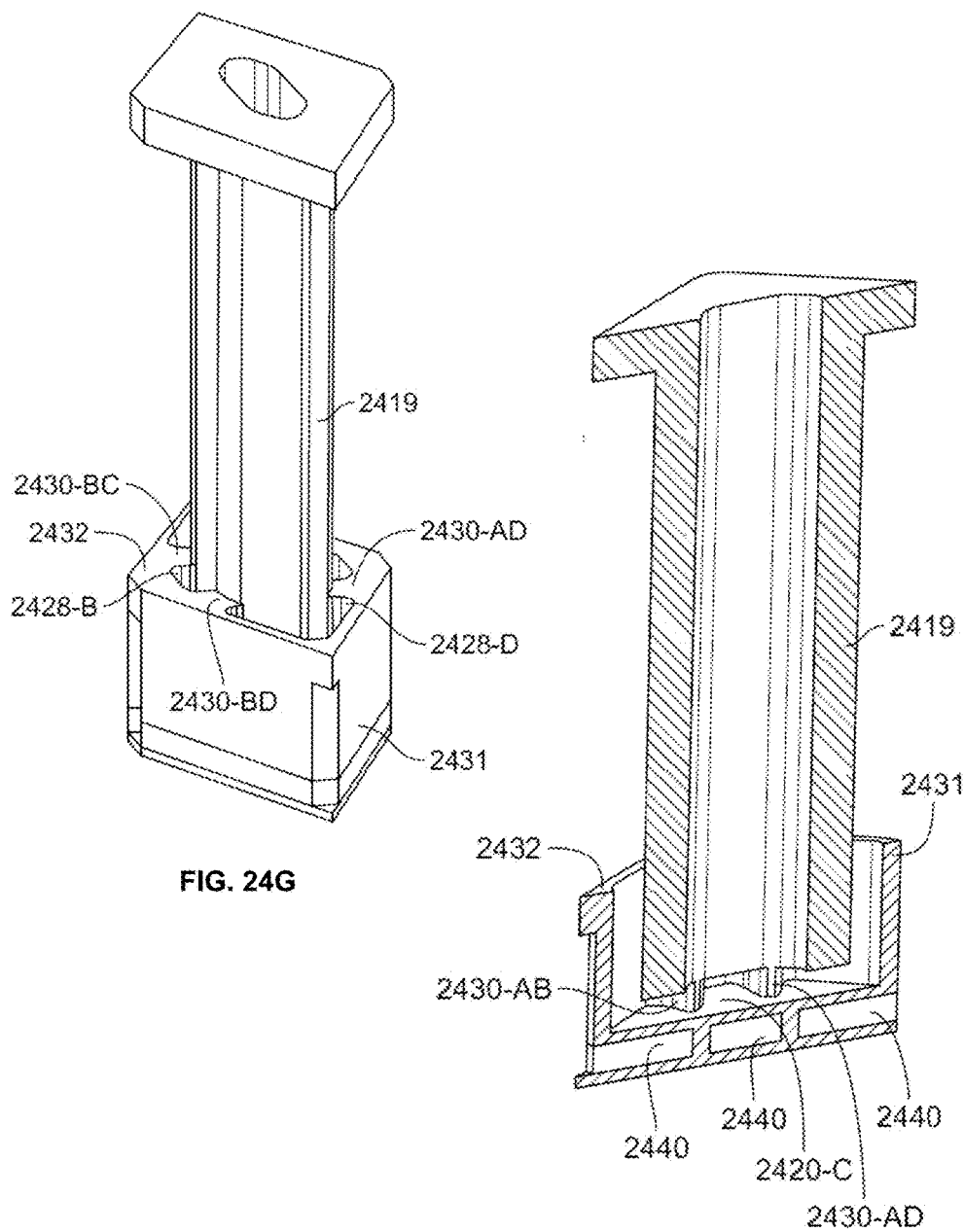

Support columns

Vapor escape channels

THERMAL MANAGEMENT SYSTEMS, METHODS FOR MAKING, AND METHODS FOR USING

RELATED APPLICATIONS

This application is a continuation-in-part of U.S. patent application Ser. No. 15/431,760, filed Feb. 13, 2017 which claims benefit of the following U.S. Provisional Patent Applications:
(1) 62/294,389 filed Feb. 12, 2016,
(2) 62/321,848 filed Apr. 13, 2016, and
(3) 62/357,275 filed Jun. 30, 2016.
The '760 application is a continuation-in-part of U.S. patent application Ser. No. 15/283,013, filed Sep. 30, 2016 which in turn claims benefit of the following U.S. Provisional Patent Applications:
(1) 62/355,557 filed Jun. 28, 2016,
(2) 62/321,840 filed Apr. 13, 2016,
(3) 62/316,470 filed Mar. 31, 2016,
(4) 62/274,056 filed Dec. 31, 2015, and
(5) 62/235,547 filed Sep. 30, 2015.
Each of these referenced applications is incorporated herein by reference as if set forth in full herein.

FIELD OF THE INVENTION

The present invention relates to (1) microscale or millimeter scale heat transfer devices and systems that include active (i.e. externally pumped) single phase heat sink or cold plate devices having improved thermal conductance, (2) passive two-phase vapor chamber or heat pipe systems, or (3) active two-phase pumped vapor chamber or heat pipe systems. Some embodiments of the present invention also relate to the field of electrochemically fabricating multi-layer micro-scale or mesoscale three dimensional structures, parts, components, or devices where each layer is formed from a plurality of deposited materials and more specifically to use of such methods in forming microscale transfer arrays, passive heat pipes or vapor chambers (i.e. such devices that use direct conduction of heat or evaporation and capillary action to transport heat via a heat transfer liquid), or active heat pipes or vapor chambers (i.e. such devices that use external or forced pumping of a heat transfer liquid instead of relying on capillary action alone to recharge evaporation regions with a vaporizable heat transfer liquid).

BACKGROUND OF THE INVENTION

Electrochemical Fabrication:
An electrochemical fabrication technique for forming three-dimensional structures from a plurality of adhered layers has been and is being commercially pursued by Microfabrica® Inc. (formerly MEMGen Corporation) of Van Nuys, Calif. under the process names EFAB™ and MICA FREEFORM®.

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, August 1998.
(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.
(3) A. Cohen, "3-D Micromachining by Electrochemical Fabrication", Micromachine Devices, March 1999.
(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
(8) A. Cohen, "Electrochemical Fabrication (EFAB™)", Chapter 19 of The MEMS Handbook, edited by Mohamed Gad-El-Hak, CRC Press, 2002.
(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition process for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.
2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

One method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). In such a process at least one CC mask is used for each unique cross-sectional pattern that is to be plated.

The support for a CC mask may be a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In some implementations, a single structure, part or device may be formed during execution of the above noted steps or in other implementations (i.e. batch processes) multiple identical or different structures, parts, or devices, may be built up simultaneously.

In preparation for performing the selective deposition of the first operation, the conformable portion of the CC mask is placed in registration with and pressed against a selected portion of (1) the substrate, (2) a previously formed layer, or (3) a previously deposited material forming a portion of the given layer that is being created. The pressing together of the CC mask and relevant substrate, layer or material occurs in such a way that all openings, in the conformable portions of the CC mask contain plating solution. The conformable material of the CC mask that contacts the substrate, layer, or material acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 10.

The CC mask plating process is distinct from a "through-mask" plating process in that in a through-mask plating process the separation of the masking material from the substrate would occur destructively. Furthermore in a through mask plating process, openings in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned state. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal Layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along with the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example, it is indicated that the plating base may consist of 150 angstroms of titanium and 150 angstroms of nickel where both are applied by sputtering.

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

Thermal Management

Current and next generation high performance electronic devices are reaching such high heat flux levels that new liquid cooling strategies are required. To tackle this problem, liquid cooled micro-heat exchangers have been in development for some time though they have not seen wide commercial penetration. One reason for this is that these next generation micro-cooling systems with complex inner geometries require equally complex manufacturing technologies in order to fabricate them. This being the case, many micro-cooling concepts have been conceptualized using CFD modelling tools though they cannot be implemented without appropriate manufacturing technology to realize them physically.

SUMMARY OF THE INVENTION

Some embodiments of the invention are directed to heat transfer arrays that may be placed in contact with or in proximity to operating semiconductors to provide enhanced cooling or heat dissipation. These heat transfer arrays may take the form of microjet arrays, hybrid microchannel microjet arrays, integrated fin and microjet arrays, and even hybrid microchannel and integrated fin and microjet arrays. In combination with appropriate inlet and outlet headers and or manifolds these heat transfer arrays might be called cold plates or active heat sinks. In combination with pumps, heat exchangers, appropriate functional connections (e.g. tubing, channels), optional filters, optional sensors (e.g. pressure, temperature, flow, and the like), and optional storage reservoirs, and the like these cold plates become (individually or in groups) may form thermal management control systems.

In some embodiments, heat transfer arrays and their formation take advantage of the unmatched heat transfer coefficients and surface temperature uniformity associated with impinging microjets arrays together with the high surface area per unit volume associated with microchannels as can be implemented using multi-layer, multi-material electrochemical deposition (i.e. electrodeposition or electroless deposition) methods. Heat transfer arrays and inlet and outlet header or manifold design may be modeled using computational fluid dynamics (CFD) using, for example ANSYS Fluent Version 16.2 in combination with the capabilities of Microfabrica's MICA Freeform process. In some embodiments an extreme target heat flux of 1000 W/cm2 was considered along with a maximum surface temperature of 65° C. and a maximum surface temperature variation of below 10° C. Hydraulically, pressure drop was considered along with an overall volumetric flow rate limitation of 0.5 L/min for a 4 mm×4 mm package. In some embodiments, the heat transfer array was simulated using single phase laminar flow solver in Fluent and simulation of inlet ant outlet headers. The simulations were multi-physics in nature as they included the heat flow throughout the internal sold metallic structures as well as the thermal field within the fluid. The designs of some embodiments, as simulated achieved their design goals, with a surface average heat transfer coefficient of 360 kW/m$^2$K, for a flow rate of 0.5 L/min, and pressure drop of 1 atm. With an imposed heat flux of 1000 W/cm2 this translates into a maximum surface temperature less than 58° C. and a surface temperature variation as small as 6° C.

It is an object of some embodiments of the invention to provide an improved micro-scale or millimeter scale thermal management devices including a variations of liquid (e.g. water) cooled heat transfer arrays.

It is an object of some embodiments of the invention to provide for the fabrication of such heat transfer array devices using multi-layer multi-material electrochemical fabrication methods.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case with regard to some aspects.

In a first aspect of the invention, a microjet heat transfer array, comprises: (a) a plurality of microjet structures for directing fluid from at least one group inlet onto at least one surface of a primary heat exchange region, wherein the primary heat exchange region is selected from the group consisting of: (1) a surface of a heat source or a plurality of separated surfaces of a heat source, (2) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um, and (4) at least one surface of a solid that is in intimate contact with a surface or a plurality of separate surfaces of a heat source; and (b) a plurality of post jetting flow paths to direct the fluid from the primary heat exchange region to at least one group outlet, wherein the at least one surface of the primary heat exchange region onto which jetting occurs is closer, in the jetting direction, to the surface or the plurality of separate surfaces of the heat source than are the plurality of post jetting flow paths.

In a second aspect of the invention, a hybrid microjet and microchannel heat transfer array, comprises: (a) a plurality of microjet structures for directing a heat transfer fluid from at least one group inlet onto at least one surface of a primary heat exchange region selected from the group consisting of: (1) a surface of a heat source or a plurality of separated surfaces of a heat source, (2) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um), and (4) at least one surface of a solid that is in intimate contact with a surface or a plurality of separate surfaces of a heat source; and (b) a plurality of post jetting microchannel flow paths to direct the heat transfer fluid from the primary heat exchange region to at least one group outlet, wherein the at least one surface of the primary heat exchange region onto which jetting occurs is closer, in the jetting direction, to the surface or the plurality of separate surfaces of the heat source than are the microchannel flow paths.

Numerous variations of the first and second aspects of the invention exist and include, for example: (1) the array of the second aspect wherein the at least one surface on to which jetting occurs comprises a plurality of jetting well surfaces with each jetting well surface surrounded by walls that direct fluid away from the jetting well surface into the microchannel flow paths; (2) the array of the first variation wherein each of the plurality of jetting surfaces is configured to directly receive jetted fluid from a single jet orifice; (3) the array of the second aspect where each of the plurality of jetting surfaces is configured to directly receive jetted fluid from a group consisting of two or more jet orifices; (4) the array of any of first or second aspects or first to third variations wherein the jets have elongated cross-sectional configurations (i.e. in a plane perpendicular to a jetting direction) with a length to width aspect ratio selected from the group consisting of (i)<=10 to 1, (ii)<=5 to 1, (iii)<=3 to 1, or (iv)<=2 to 1; (5) the array of the fourth variation wherein the length of the elongated cross-sectional configurations have an orientation that extends parallel to a primary flow direction of the fluid as the fluid flows from an inlet to the plurality of microjets; (6) the array of the second aspect, or any of the first to fifth variations as they depend directly or indirectly from the second aspect wherein the microchannels direct fluid received from the jetting structures along paths that flow past outside walls of the microjet structures initially in a direction that is substantially anti-parallel to the direction of jetting and then in a direction that is substantially perpendicular to the direction of jetting; (7) the array of the first variation, or any of second to sixth variations as they depend from the first variation, wherein the inlet is spaced further from the surface on to which jetting occurs than does a flow path through the microchannels after the fluid leaves the jetting wells; (8) the array of any of the first or second aspects or first to seventh variations wherein the device is configured to interface with a heat source that comprises a semiconductor device; (9) the array of any of the first or second aspects or first to eighth variations wherein the device comprises a component selected from the group consisting of (A) an IC; (B) a microprocessor; (C) an SOC; (D) an RFIC, e.g. an RF transmitter or RF receiver; (E) an optical transmitter or receiver; (F) a power amplifier; (G) a GPU; (H) a CPU; (I) a DSP; (J) an ASIC; (K) an APU; (L) an LED; (M) a laser diode; (N) a power electronic device, e.g. a power inverter or a power converter; (O) a photonic device, (P) a propulsion system; (Q) a solar array, e.g. for a micro satellite; (R) a radiator, e.g. for a micro satellite; (S) an engine of a micro drone; (T) a spacecraft component such as an SSPA; (U) a traveling wave tube amplifier; (V) a package that holds one or more of the devices of (A)-(T), and (W) a stack or plurality of stacks of devices sandwiched between separated heat transfer arrays or interleaved with multiple heat transfer arrays; (10) the array of either of the first or second aspects any of variations (1)-(7) wherein the density of jets is varies spatially, at least in part, based on spatial heat generation of the semiconductor device, wherein the jetting structures are placed laterally closer together in the regions where average heat production is highest compared to areas where heat production is lowest; (11) the array of any variations (8), or (9) or (10) as they depend from variation (8), wherein the majority of the heat exchange from a solid to the fluid occurs via a surface of a first metal and wherein selected portions of the array are formed from a second metal of higher thermal conductive than the first metal such that heat conductivity has a whole is improved relative to the heat conductivity if the second metal were replaced with the first metal; (12) the array of either aspect (1) or (2) or variations (1) to (11) wherein regions on to which jetted fluid impinges are strengthened with a material different from that used to form the side walls of the jetting structures; (13) the array of either aspect (1) or (2) or variations (1) to (12) wherein the array comprises a plurality of adhered planar layers of at least one material where successive layers can be distinguished by stair-stepped configurations and wherein layers extend laterally in a cross-sectional dimension and a layer stacking axis is substantially perpendicular to a direction of fluid jetting; (14) the array of either aspect (1) or (2) or variations (1) to (13) wherein the heat to be removed requires a heat flux, from at least a portion of the primary heat transfer region, selected from the group consisting of (i) >=200 W/cm², (ii) >=400 W/cm² and (iii) >=800 W/cm²); (15) the array of either aspect (1) or (2) or variations (1) to (14) wherein the temperature of the surface or the plurality of separate surfaces of the heat source are to be held to a temperature selected from the group consisting of (i)<=100° C., (ii)<=80° C., and (iii)<=65° C.; (16) the array of either aspect (1) or (2) or variations (1) to (15) wherein a variation in temperature over the surface or the plurality of surfaces of the heat source is to be held a temperature selected from the group consisting of (i) <=20° C., (ii)<=15° C., and (iii)<=10° C.; (17) the array of either aspect (1) or (2) or variations (1) to (16) wherein a flow of the heat transfer fluid through the array is selected from the group consisting of (i)<=2.0 L/min per 4 mm×4 mm area covered by the array, (ii)<=1 L/min per 4 mm×4 mm area covered by the array, and (iii)<=0.5 L/min per 4 mm×4 mm area covered by the array; (18) the array of either aspect (1) or (2) or variations (1) to (17) wherein the heat source has a surface area covered by the array selected from the group consisting of (i)<=900 sq mm, (ii)<=400 sq mm, (iii)<=100 sq mm, (iv)<=25 sq. mm, (v)<=20 sq. mm, and (vi)<=16 sq. mm; (19) the array of aspect 2, and the first-eighteenth variations as they depend directly or indirectly from aspect 2 wherein at least a portion of the plurality of microjetting structures provide flow paths with a cross-sectional dimension in the range of 15 to 300 um and more preferably in the range of 30-200 um; (20) the array the second aspect or any of the first to nineteenth variations as they depend directly or indirectly from aspect 2 wherein at least a portion of the post jetting microchannels have a cross-sectional dimension in the range of 15-300 um and more preferably in the range of 30-150 um; (21) the array of either the first or second aspects or any of the first to twentieth variations wherein distal ends of a plurality of jetting structures are spaced from the at least one surface of the primary heat exchange region by length in the range of 15-200 um and preferably in the range of 30-100 um; (22) the array of either the first or second aspect or any of the first to twenty-first variations wherein a first height of at least a plurality of post jetting microchannels is in the range of 40 to 600 um and more preferably in the range of 80-300 um, and wherein the first height is measured along a portion of the microchannels that directs fluid flow in a direction substantially anti-parallel to a direction of flow of fluid through the jetting structures; (23) the array of either the first or second aspect and any of the first to twenty-second variations wherein a height of at least a plurality of the jetting structures is in the range of 300 um to 1 mm and more preferably in the range of 400-800 um; (24) the array of either the first or second aspect or any of the first to twenty-third variations wherein a height of at least a plurality of the jets is in the range of 300 um to 1 mm and more preferably in the range of 400-800 um wherein a second height of at least a plurality of post jetting microchannels is in the range of 300-2000 um and more preferably in the range of 600-1000 um, wherein the second height is measured along a portion of the microchannels that directs fluid flow in a direction substantially perpendicular to the direction of flow of fluid through the jetting structures; (25) the array of either the first or second aspect or any of the first to twenty-fourth variations wherein a jetting well height extends from the at least one surface of the primary heat exchange region to a height that is above a height at which fluid exits the jetting structures; (26) the array of either the first or second aspect or any of the first to twenty-fifth variations wherein the array is configured to use a heat transfer fluid that is a liquid; (27) the array of the twenty-sixth variation wherein the liquid comprises water; (28) The array of either the twenty-sixth or twenty-seventh variation wherein the water does not undergo a phase change during a process of cooling a semiconductor; (29) the array of either the first or second aspect and any of the first to twenty-eighth variations wherein a solid material separating two adjacent jetting wells comprises a core material surrounded at least partially by a shell material wherein the core material has a higher thermal conductivity than does the shell material and also has a lower yield strength; or (30) the array of either the first or second aspect or any of the first to twenty-ninth variations wherein the plurality of jetting structures function as fins that contact the at least one surface of the at least one primary heat exchange region whereby a lowest portion of the plurality of jetting structures is in solid-to-solid contact with the at least one surface of the primary heat exchange region while at least one opening exists in the jetting structures above the at least one surface of the primary heat exchange region such that the jetted fluid is free from an enclosing jetting channel within the jetting structure to impinge on the at least one surface of the primary heat exchange region.

In a third aspect of the invention, a microjet heat transfer array, comprises: (a) plurality of fins with each fin providing an embedded microjet for directing fluid from at least one group inlet onto at least one surface of a primary heat exchange region selected from the group consisting of: (1) a surface of a heat source or a plurality of separated surfaces of a heat source, (2) at least one surface in proximity to one or more heat source surfaces wherein a separation between the at least one surface onto which jetting occurs and a surface or a plurality of surfaces of a heat source is selected from the group consisting of (i)<=200 um, (ii)<=100 um, (iii)<=50 um, (iv)<=20 um, and (v)<=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i),=200 um, (ii)<=100 um, (iii)<=50 um, (iv)<=20 um, and (v)<=10 um), and (4) at least one surface of a solid that is in intimate contact with a surface or a plurality of separate surfaces of a heat source; (b) a plurality of post jetting microchannel flow paths to direct the fluid from the primary heat exchange region to at least one group outlet, wherein the plurality of fins provide a solid conductive heat flow path from the at least one surface onto which jetting occurs.

Numerous variations of the third aspect exist including, for example: (1) the array of the third aspect wherein the surface onto which jetting occurs is closer, in the jetting direction, to the heat source than are the plurality of post jetting microchannel flow paths; (2) the array of the third aspect wherein each fin provides a plurality of conductive solid contact paths directly to the surface of the primary heat exchange region onto which jetting occurs; or (3) the array of the third aspect wherein each fin has an elongated cross-sectional configuration. Other variations are similar to those noted for the first and second aspects of the invention so long as those variations do not contradict or otherwise nullify the features of the third aspect.

In a fourth aspect of the invention, a micro cold plate, comprises: (a) at least one group fluid inlet; (b) at least one group fluid outlet; (c) a microjet heat transfer array, comprising: (1) a plurality of microjet structures for directing fluid from at least one group fluid inlet onto at least one surface of a primary heat exchange region, wherein the primary heat exchange region is selected from the group consisting of: (A) a surface of a heat source or a plurality of separated surfaces of a heat source, (B) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (C) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um, and (D) at least one surface of a solid that is in intimate contact with a surface or a plurality of separate surfaces of a heat source; and (2) a plurality of post jetting flow paths to direct the fluid from the primary heat exchange region to at least one group fluid outlet, wherein the at least one surface of the primary heat exchange region onto which jetting occurs is closer, in the jetting direction, to the surface or the plurality of separate surfaces of the heat source than are the plurality of post jetting flow paths.

In a fifth aspect of the invention, a micro cold plate, comprises: (a) at least one group fluid inlet; (b) at least one group fluid outlet; (c) a hybrid microjet and microchannel heat transfer array, comprising: (1) a plurality of microjet structures for directing a heat transfer fluid from the at least one group fluid inlet onto at least one surface of a primary heat exchange region selected from the group consisting of: (A) a surface of a heat source or a plurality of separated surfaces of a heat source, (B) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (C) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um), and (D) at least one surface of a solid that is in intimate contact with a surface or a plurality of separate surfaces of a heat source; and (2) a plurality of post jetting microchannel flow paths to direct the heat transfer fluid from the primary heat exchange region to at least one group fluid outlet, wherein the at least one surface of the primary heat exchange region onto which jetting occurs is closer, in the jetting direction, to the surface or the plurality of separate surfaces of the heat source than are the microchannel flow paths.

Numerous variations of the fourth and fifth aspects of the invention exist. Some such variations are analogous to the variations of the first and second aspects as well as to variations of those variations, mutatis mutandis, for example where the variation would apply to a cold plate as opposed to a heat transfer array.

In a sixth aspect of the invention, a micro cold plate, comprises: (a) at least one group fluid inlet; (b) at least one group fluid outlet; (c) a microjet heat transfer array, comprising: (1) plurality of fins with each fin providing an embedded microjet for directing fluid from the at least one group fluid inlet onto at least one surface of a primary heat exchange region selected from the group consisting of: (A) a surface of a heat source or a plurality of separated surfaces of a heat source, (B) at least one surface in proximity to one or more heat source surfaces wherein a separation between the at least one surface onto which jetting occurs and a surface or a plurality of surfaces of a heat source is selected from the group consisting of (i)<=200 um, (ii)<=100 um, (iii) <=50 um, (iv)<=20 um, and (v)<=10 um; (C) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i),=200 um, (ii)<=100 um, (iii)<=50 um, (iv)<=20 um, and (v)<=10 um), and (D) at least one surface of a solid that is in intimate contact with a surface or a plurality of separate surfaces of a heat source; and (2) a plurality of post jetting microchannel flow paths to direct the fluid from the primary heat exchange region to the at least one group fluid outlet, wherein the plurality of fins provide a solid conductive heat flow path from the at least one surface onto which jetting occurs.

Numerous variations of the sixth aspect of the invention exist. Some such variations are analogous to those noted for above for the third aspect of the invention, mutatis mutandis, for example where the variation would apply to a cold plate as opposed to a heat transfer array. Other variations are similar to those noted for the fourth and fifth aspects of the invention so long as those variations do not contradict or otherwise nullify the features of the sixth aspect.

In a seventh aspect of the invention, a thermal management system for a semiconductor device, comprises: (1) at least one micro cold plate, comprising: (a) at least one fluid inlet header or manifold; (b) at least one fluid outlet header or manifold; (c) a microjet heat transfer array, comprising: (I) a plurality of microjet structures for directing fluid from at least one fluid inlet header or manifold onto at least one surface of a primary heat exchange region, wherein the primary heat exchange region is selected from the group consisting of: (A) a surface of a heat source or a plurality of separated surfaces of a heat source, (B) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (C) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um, and (D) at least one surface of a solid that is in intimate contact with a surface or a plurality of separate surfaces of a heat source; and (II) a plurality of post jetting flow paths to direct the fluid from the primary heat exchange region to at least one outlet header or manifold, wherein the at least one surface of the primary heat exchange region onto which jetting occurs is closer, in the jetting direction, to the surface or the plurality of separate surfaces of the heat source than are the plurality of post jetting flow paths; (2) at least one flow path to move heated fluid, directly or indirectly, from the from the fluid outlet header or manifold of the at least one micro cold plate to a heat exchanger; (3) at least one flow path to move cooled fluid, directly or indirectly, from the heat exchanger back into the inlet header or manifold of the at least one micro cold plate; and (4) at least one pump functionally configured to direct the fluid through the at least one cold plate to the heat exchanger and back to the at least one cold plate.

In an eighth aspect of the invention, a thermal management system for a semiconductor device, comprises: (1) at least one micro cold plate, comprising: (a) at least one fluid inlet header or manifold; (b) at least one fluid outlet header or manifold; (c) a hybrid microjet and microchannel heat transfer array, comprising: (I) a plurality of microjet structures for directing a heat transfer fluid from the at least one fluid inlet header or manifold onto at least one surface of a primary heat exchange region selected from the group consisting of: (A) a surface of a heat source or a plurality of separated surfaces of a heat source, (B) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (C) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um), and (D) at least one surface of a solid that is in intimate contact with a surface or a plurality of separate surfaces of a heat source; and (II) a plurality of post jetting microchannel flow paths to direct the heat transfer fluid from the primary heat exchange region to the at least one outlet header or manifold, wherein the at least one surface of the primary heat exchange region onto which jetting occurs is closer, in the jetting direction, to the surface or the plurality of separate surfaces of the heat source than are the microchannel flow paths; (2) at least one flow path to move heated fluid, directly or indirectly, from the from the fluid outlet header or manifold of the at least one micro cold plate to a heat exchanger; (3) at least one flow path to move cooled fluid, directly or indirectly, from the heat exchanger back into the inlet header or manifold of the at least one micro cold plate; (4) at least one pump functionally configured to direct the fluid through the at least one cold plate to the heat exchanger and back to the at least one cold plate.

Numerous variations of the seventh and eighth aspects of the invention exist. Some such variations are analogous to the variations of the first and second aspects as well as to variations of those variations, mutatis mutandis, for example where the variations would apply to a system as opposed to a heat transfer array. Additional variations, include, for example: (1) a filter being located along the flow path between the outlet and the pump; (2) a filter being located along the flow path between pump and the inlet; (3) a filter being located along the flow path between pump and the heat exchanger; (4) the pump being mounted to a header or manifold of the cold plate; (5) the pump being spaced from the cold plate; (6) at least one temperature sensor and a control system for turning on the pump when a detected temperature is greater than a high temperature set point; (7) at least one temperature sensor and a control system for turning off the pump when a detected temperature is less than a low temperature set point; (8) the system comprises a plurality of microjet arrays with at least two of the arrays spaced from one another to remove heat from separated portions of a single integrated circuit; (9) the system comprises a plurality of microjet arrays with at least two of the arrays spaced from one another to remove heat from two different integrated circuits; (10) at least one pressure sensor to monitor fluid pressure in the flow paths; (11) the micro cold plate comprises a single structure that provides both the inlet header or manifold and the outlet header or manifold.

In a ninth aspect of the invention, a thermal management system for a semiconductor device, comprises: (1) at least one micro cold plate, comprising: (a) at least one fluid inlet header or manifold; (b) at least one fluid outlet header or manifold; (c) a microjet and microchannel heat transfer array, comprising: (I) plurality of fins with each fin providing an embedded microjet for directing fluid from the at least one fluid inlet header or manifold onto at least one surface of a primary heat exchange region selected from the group consisting of: (A) a surface of a heat source or a plurality of separated surfaces of a heat source, (B) at least one surface in proximity to one or more heat source surfaces wherein a separation between the at least one surface onto which jetting occurs and a surface or a plurality of surfaces of a heat source is selected from the group consisting of (i)<=200 um, (ii)<=100 um, (iii)<=50 um, (iv)<=20 um, and (v)<=10 um; (C) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i),=200 um, (ii)<=100 um, (iii)<=50 um, (iv)<=20 um, and (v)<=10 um), and (D) at least one surface of a solid that is in intimate contact with a surface or a plurality of separate surfaces of a heat source; (II) a plurality of post jetting microchannel flow paths to direct the fluid from the primary heat exchange region to the at least one outlet header or manifold, wherein the plurality of fins provide a solid conductive heat flow path from the at least one surface onto which jetting occurs; (2) at least one flow path to move heated fluid, directly or indirectly, from the from the fluid outlet header or manifold of the at least one micro cold plate to a heat exchanger; (3) at least one flow path to move cooled fluid, directly or indirectly, from the heat exchanger back into the inlet header or manifold of the at least one micro cold plate; and (4) at least one pump functionally configured to direct the fluid through the at least one cold plate to the heat exchanger and back to the at least one cold plate.

Numerous variations of the ninth aspect of the invention exist. Some such variations are analogous to those noted for above for the third aspect of the invention, mutatis mutandis, for example where the variation would apply to a system as opposed to a heat transfer array. Other variations are similar to those noted for the seventh and eighth aspects of the invention so long as those variations do not contradict or otherwise nullify the features of the ninth aspect.

In a tenth aspect of the invention, a method for the batch formation of a plurality of heat transfer arrays, comprises: (a) forming plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein the each of the plurality of heat transfer arrays, comprise: (A) a plurality of microjet structures for directing fluid from at least one group inlet onto at least one surface of a primary heat exchange region, wherein the primary heat exchange region is selected from the group consisting of: (1) a surface of a heat source or a plurality of separated surfaces of a heat source; (2) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um, and (4) at least one surface of a solid that is in intimate contact with a surface or a plurality of separate surfaces of a heat source; and (B) a plurality of post jetting flow paths to direct the fluid from the primary heat exchange region to at least one group outlet, wherein the at least one surface of the primary heat exchange region onto which jetting occurs is closer, in the jetting direction, to the surface or the plurality of separate surfaces of the heat source than are the plurality of post jetting flow paths.

In an eleventh aspect of the invention, a method for the batch formation of a plurality of heat transfer arrays, comprises: (a) forming plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein the each of the plurality of heat transfer arrays, comprise: (A) a plurality of microjet structures for directing a heat transfer fluid from at least one group inlet onto at least one surface of a primary heat exchange region selected from the group consisting of: (1) a surface of a heat source or a plurality of separated surfaces of a heat source; (2) at least one surface in proximity to one or more heat source surfaces wherein a separation distance between the at least one surface onto which jetting occurs and a surface or a plurality of separate surfaces of a heat source is selected from the group consisting of (i)<=200 um, (ii)<=100 um, (iii)<=50 um, (iv)<=20 um, and (v)<=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i)<=200 um, (ii)<=100 um, (iii)<=50 um, (iv)<=20 um, and (v)<=10 um), and (4) at least one surface of a solid that is in intimate contact with a surface or a plurality of separate surfaces of a heat source; and (B) a plurality of post jetting microchannel flow paths to direct the heat transfer fluid from the primary heat exchange region to at least one group outlet, wherein the at least one surface of the primary heat exchange region onto which jetting occurs is closer, in the jetting direction, to the surface or the plurality of separate surfaces of the heat source than are the microchannel flow paths.

Numerous variations of the tenth and eleventh aspects of the invention exist. Some such variations are analogous to the variations of the first and second aspects as well as to variations of those variations, mutatis mutandis, for example where the variations would apply to a method for fabricating a heat transfer array as opposed to a heat transfer array itself.

In a twelfth aspect of the invention, a method for the batch formation of a plurality of heat transfer arrays, comprises: (a) forming plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein the each of the plurality of heat transfer arrays, comprise: (A) plurality of fins with each fin providing an embedded microjet for directing fluid from at least one group inlet onto at least one surface of a primary heat exchange region selected from the group consisting of: (1) a surface of a heat source or a plurality of separated surfaces of a heat source, (2) at least one surface in proximity to one or more heat source surfaces wherein a separation between the at least one surface onto which jetting occurs and a surface or a plurality of surfaces of a heat source is selected from the group consisting of (i)<=200 um, (ii)<=100 um, (iii)<=50 um, (iv)<=20 um, and (v)<=10 um; (3) at least one surface of a solid material separated from a surface or a plurality of separate surfaces of a heat source by a gap that is occupied by at least one highly conductive transfer material that may be a different solid, a semi-liquid, or a liquid wherein a thickness of the gap is selected from the group consisting of (i),=200 um, (ii)<=100 um, (iii)<=50 um, (iv)<=20 um, and (v)<=10 um), and (4) at least one surface of a solid that is in intimate contact with a surface or a plurality of separate surfaces of a heat source; and (B) a plurality of post jetting microchannel flow paths to direct the fluid from the primary heat exchange region to at least one group outlet, wherein the plurality of fins provide a solid conductive heat flow path from the at least one surface onto which jetting occurs.

Numerous variations of the twelfth aspect of the invention exist. Some such variations are analogous to those noted above for the third aspect of the invention, mutatis mutandis, for example where the variation would apply to a method of fabrication as opposed to a heat transfer array. Other variations are similar to those noted for the tenth and eleventh aspects of the invention so long as those variations do not contradict or otherwise nullify the features of the twelfth aspect. Still further variations include, for example: (1) the array being configured to use a heat transfer fluid that is a liquid; (2) where the liquid of the first further variation comprises water; or (3) wherein the liquid of the first or second further variation does not undergo a phase change during a process of cooling a semiconductor.

In a thirteenth aspect of the invention, a method for the batch formation of a plurality of heat transfer arrays, comprises: (a) forming plurality of successively formed layers wherein each successive layer comprises at least two materials and is formed on and adhered to a previously formed layer, one of the at least two materials is a structural material and the other of the at least two materials is a sacrificial material, and wherein the forming of each of the plurality of successive layers comprises: (i) depositing a first of the at least two materials; (ii) depositing a second of the at least two materials; (iii) planarizing the first and second materials to set a boundary level for the layer; and (b) after the forming of the plurality of successive layers, separating at least a portion of the sacrificial material from multiple layers of the structural material to reveal the plurality of heat transfer arrays, wherein the each of the plurality of heat transfer arrays, comprises features selected from the group consisting of: (1) a microjet array, (2) a plurality of microjet structures and microchannels that receive fluid after being jetted from jetting structures, and (3) a plurality of fins and microjet structures wherein the fins comprise at least a portion of the jetting structures including jetting channels and jetting orifices.

Numerous variations of the thirteenth aspect of the invention exist. Some such variations are analogous to those noted above for the first to ninth aspects of the invention, mutatis mutandis, for example where the variation would apply to a method of fabrication as opposed to a heat transfer array. Other variations are similar to those noted for the tenth to twelfth aspects of the invention so long as those variations do not contradict or otherwise nullify the features of the thirteenth aspect. Still further variations include, for example: (1) the method further comprising: (c) designing a 3D representation of the heat transfer array in 3D CAD, (d) dividing the representation into a plurality of stacked layer representations of representing successive cross-sections of the heat transfer array, and (e) providing further processing of the cross-sectional data to derive fabrication data for the heat transfer array, wherein the fabrication data is used in creating the successively formed layers; (2) wherein the array is configured to use a heat transfer fluid that is a liquid; (3) the liquid of the second further variation comprises water; (4) the array is configured such that the liquid of the second or third further variation does not undergo a phase change during a process of cooling a semiconductor; (5) the heat transfer array is formed primarily of one or more metals; (6) a metal of fifth further variation is deposited by electrodeposition.

In a fourteenth aspect of the invention, a method for the formation of a micro cold plate for semiconductor cooling, comprises: (a) forming a heat transfer array comprising: (1) forming a plurality of successively formed layers, wherein each successive layer comprises at least two materials and is formed on and adhered to a previously formed layer, one of the at least two materials is a structural material and the other of the at least two materials is a sacrificial material, and wherein each successive layer defines a successive cross-section of the three-dimensional structure, and wherein the forming of each of the plurality of successive layers comprises: (i) depositing a first of the at least two materials; (ii) depositing a second of the at least two materials; (iii) planarizing the first and second materials to set a boundary level for the layer; and (2) after the forming of the plurality of successive layers, separating at least a portion of the sacrificial material from multiple layers of the structural material to reveal the three-dimensional parts; (b) supplying a fluid inlet in the form of a header or manifold and a fluid outlet in the form of a header or manifold; and (c) attaching the microjet array to the fluid inlet and fluid outlet, wherein the each of the heat transfer array, comprises features selected from the group consisting of: (1) a microjet array, (2) a plurality of microjet structures and microchannels that receive fluid after being jetted from jetting structures, and (3) a plurality of fins and microjet structures wherein the fins comprise at least a portion of the jetting structures including jetting channels and jetting orifices.

Numerous variations of the fourteenth aspect of the invention exist. Some such variations are analogous to those noted above for the first to ninth aspects of the invention, mutatis mutandis, for example where the variation would apply to a method of fabrication as opposed to a heat transfer array. Other variations are similar to those noted for the tenth to thirteen aspects of the invention so long as those variations do not contradict or otherwise nullify the features of the fourteenth aspect.

In a fifteenth aspect of the invention, a method for forming a thermal management control system for semiconductor cooling, comprises: (a) forming at least one heat transfer array comprising: (1) forming a plurality of successively formed layers, wherein each successive layer comprises at least two materials and is formed on and adhered to a previously formed layer, one of the at least two materials is a structural material and the other of the at least two materials is a sacrificial material, and wherein each successive layer defines a successive cross-section of the three-dimensional structure, and wherein the forming of each of the plurality of successive layers comprises: (i) depositing a first of the at least two materials; (ii) depositing a second of the at least two materials; (iii) planarizing the first and second materials to set a boundary level for the layer; and (2) after the forming of the plurality of successive layers, separating at least a portion of the sacrificial material from multiple layers of the structural material to reveal the three-dimensional part; (b) supplying at least one fluid inlet in the form of a header or manifold and at least one fluid outlet in the form of a header or manifold; (c) providing at least one semiconductor device, at least one heat exchange, and at least one pump; (d) attaching the at least one microjet array to the at least one fluid inlet and at least one fluid outlet; (e) functionally coupling the semiconductor device and the microjet array; (f) providing and functionally connecting at least one flow path to move heated fluid, directly or indirectly, from the from the fluid outlet header or manifold to a heat exchanger; (g) providing and functionally connecting at least one flow path to move cooled fluid, directly or indirectly, from the heat exchanger back into the inlet header or manifold; and (h) providing and functionally connecting at least one pump to direct the fluid through the at least one cold plate to the heat exchanger and back to the at least one cold plate, wherein the each of the heat transfer array, comprises features selected from the group consisting of: (A) a microjet array, (B) a plurality of microjet structures and microchannels that receive fluid after being jetted from jetting structures, and (C) a plurality of fins and microjet structures wherein the fins comprise at least a portion of the jetting structures including jetting channels and jetting orifices.

Numerous variations of the fifteenth aspect of the invention exist. Some such variations are analogous to those noted above for the first to ninth aspects of the invention, mutatis mutandis, for example where the variation would apply to a method of fabrication as opposed to a heat transfer array.

Other variations are similar to those noted for the tenth to fourteenth aspects of the invention so long as those variations do not contradict or otherwise nullify the features of the fifteenth aspect.

In a sixteenth aspect of the invention, a method of cooling a semiconductor device, comprises: (a) providing at least one heat transfer array, comprising a plurality of stacked and adhered layers comprising at least one metal wherein the each of the at least one heat transfer array comprises features selected from the group consisting of: (1) a microjet array, (2) a plurality of microjet structures and microchannels that receive fluid after being jetted from jetting structures, and (3) a plurality of fins and microjet structures wherein the fins comprise at least a portion of the jetting structures including jetting channels and jetting orifices. (b) placing the heat transfer array in physical contact with or in proximity to the semiconductor device to be cooled to form a primary heat transfer region having at least one cooling fluid impingement surface; (c) pumping a cooling fluid into at least one inlet of the heat transfer array such that the cooling fluid is jetted onto the impingement surface to extract heat therefrom, then passing the heated cooling fluid to at least one outlet of the heat transfer array, while continuing to extract heat from the heat transfer array, and then on to a heat exchanger where heat is removed from the cooling fluid to produce cooled cooling fluid; (d) circulating the cooled cooling fluid from the heat exchanger back into the at least one inlet array of the heat transfer array to repeat a flow cycle to draw heat from the at least one semiconductor device.

Numerous variations of the sixteenth aspect of the invention exist. Some such variations provide added features similar to those found in the previous aspects of the invention or in their variations. In some such variations the array is configured to use a heat transfer fluid that is a liquid, in others the liquid may be water, and in still others the cooling process may be provided to remove heat from a semiconductor device.

In other aspects of the invention the heat transfer arrays may not be microscale or millimeter scale devices but instead macroscale devices that provide cooling of large scale structures and devices such as internal combustion engine blocks, jet engines, rocket engines, various high heat transfer components of engines, combustion chambers, power converters, electrical resistors, batteries, light sources, lasers, and the like. Such macroscale heat transfer arrays may be fabricated by various methods including traditional machining and assembly methods or additive fabrication methods such as stereolithography and casting, selective laser sintering, and other direct and indirect metal deposition methods. In some such embodiments, heat transfer array features, fluid channels, jet diameters, well sizes, fluid flow rates, and the like may be scaled with the device size or may retain micro-scale or millimeter scale dimensions as appropriate. In some such embodiments, the dimensions set forth herein for some devices' features may vary from those set forth while ratios of at least some dimensions may scale.

Additional aspects of the invention may utilize enhanced heat pipes or vapor chambers to spread heat using fluid vaporization at a hot spot to spread the heat and returning condensed liquid to the hot spot (e.g. via capillary action, gravity feed, or other external or active pumping) to ensure an adequate supply of vaporizable material to provide sufficient heat transfer.

In a seventeenth aspect of the invention, a heat spreader for an electronic heat generating component, includes: (a) an enclosed chamber comprising a floor, a lid, and side walls, wherein the floor of the chamber provides an external surface that may be placed in contact with or in proximity to a heat generating electronic component; (b) a heat transfer fluid located within the chamber; (c) a condensation region located within the chamber comprising an array of fins having a first spacing; (d) a vaporization region located with the chamber comprising a plurality of evaporation pores; (e) an intermediate region located within the chamber and between the condensation region and the evaporation region comprising at least one array of fins having a second spacing; (f) a wicking structure located on or in proximity to the floor and extending from the condensation region to the vaporization region, (g) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the second array of fins, or the wicking structure comprise a plurality of solid structures having an average size in the range of 20-60 micron that are spaced laterally from one another by gaps having average widths in the range of 5-50 microns and wherein the solid structures are joined vertically to one another in a laterally offset manner.

Numerous variation of the eighteenth aspect of the invention exist and include for example, (1) the wicking structure having thickness in the range of 30-150 microns and having an average pore size in the range of 10-50 microns; (2) the first fin spacing being smaller than the second fin spacing and wherein the first fins have an average height in the range of 200-600 microns with an average base dimension of 100-300 microns and with an average pore size in the range of 10-60 microns; (3) the first fins having a first average lateral dimension and the second fins have a second average lateral dimension which is larger than the first average lateral dimension; (4) the evaporation region including an array of third fins; (5) the third fins of the fourth variation having an average height which is less than the average height of the first or second fins; (6) the 20-60 micron structures being formed into clusters having average lateral dimensions in the range of 100-600 microns; (7) each clusters of the sixth variation forms an individual fin; (8) the fins of the seventh variation are condensation fins; (9) the fins of the seventh variation are intermediate region fins; (10) the individual clusters of the sixth variation are grouped into structured wick arrays having dimensions in the 1000-10,000 micron range, more preferably the within a range less than 6000 microns range, and even more preferably within a range less than 4000 microns; (11) a plurality of the individual structures forming the wicking structure; (12) at least a portion of the individual structures having micron and submicron surface texting with an average spacing of texturing features being selected from the group consisting of less than 4 microns, more preferably less than 2 microns, even more preferably less than 1 micron, and most preferably less than 0.5 microns and an average size of texturing features being selected from the group less than 4 microns, more preferably less than 2 microns, even more preferably less than 1 micron, and most preferably less than 0.5 microns.

In an eighteenth aspect of the invention, An electronic component with a heat spreader, comprising: (a) an electronic component; (b) an enclosed chamber comprising a floor, a lid, and side walls, wherein the floor of the chamber comprises a surface of the heat generating component; (c) a heat transfer fluid located within the chamber; (d) a condensation region located within the chamber comprising an array of fins having a first spacing; (e) a vaporization region located within the chamber comprising a plurality of evaporation pores; (f) an intermediate region located within the chamber and between the condensation region and the evaporation region comprising at least one array of fins having a second spacing; (g) a wicking structure located on or in proximity to the floor and extending from the condensation region to the vaporization region, (h) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the second array of fins, or the wicking structure comprise a plurality of solid structures having an average size in the range of 20-60 micron that are spaced laterally from one another by gaps having average widths in the range of 5-50 microns and wherein the solid structures are joined vertically to one another in a laterally offset manner.

Numerous variation of the eighteenth aspect of the invention exist and include for example, (1) each of the variations noted for the seventeenth aspect of the invention; (2) the wicking structure including texturing formed on the surface of the electronic component via an etching operation; (3) the wicking structure including material deposited on to the surface of the electronic component prior to attaching the walls on lid of the heat spreader to the electronic component; (4) the first and second fin areas being attached to the lid or walls of the heat spreader prior to attaching the lid and walls to the electronic device; and (5) a mesh located between the first and second fin arrays and the electronic component.

Other aspects of the invention will be understood by those of skill in the art upon review of the teachings herein. These other aspects of the invention may provide various combinations of the aspects presented above as well as provide other configurations, structures, functional relationships, and processes that have not been specifically set forth above. For example such aspects may provide vapor chambers or heat pipes in combination with single phase heat transfer arrays that work together in parallel or in series to provide a desired level of heat transfer (e.g. such aspects may involve systems having a combination of one or more enhanced vaporization regions of vapor chambers at thermal hot spots with one or more heat transfer arrays located at condensation regions of the vapor chambers).

BRIEF DESCRIPTION OF THE DRAWINGS

FIG. 38 provides 4 views with decreasing magnification to illustrate how fundamental micro-fabricated blocks with surface texture can be combined into groups as in the top middle illustration and built up further into structures of desired three-dimensional configuration (top right most illustration) and finally a plurality of different three-dimensional structures that provide a desired overall pattern that may be used for providing capillary flow, evaporation, condensation, or the like.

DETAILED DESCRIPTION OF PREFERRED EMBODIMENTS

Electrochemical Fabrication in General

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various other embodiments or various aspects of the invention to yield enhanced embodiments. Still other embodiments may be derived from mixing and matching elements and steps into new combinations based on the various embodiments explicitly set forth herein.

Figure 1A:
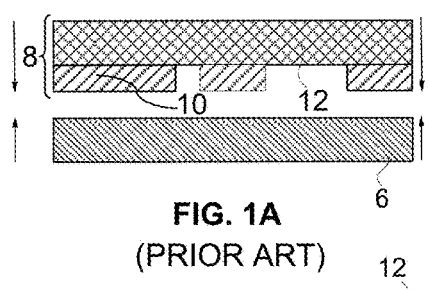
FIGS. 1A-1C schematically depict side views of various stages of a CC mask plating process, while FIGS. 1D-1G schematically depict side views of various stages of a CC mask plating process using a different type of CC mask.
Figure 1B:
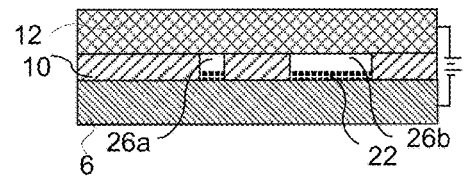
Figure 1C:
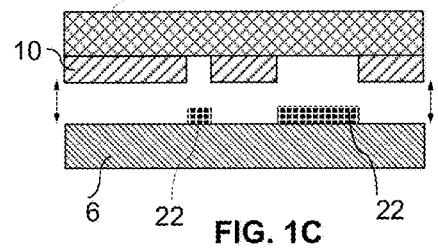
Figure 1D:
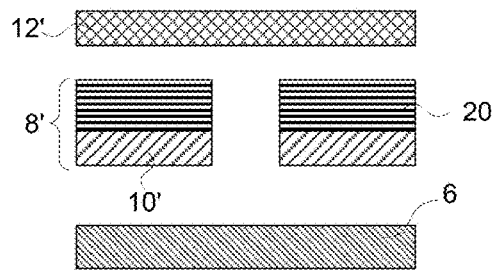
Figure 1E:
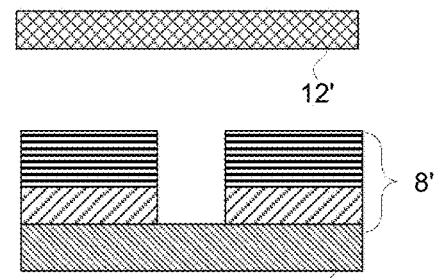
Figure 1F:
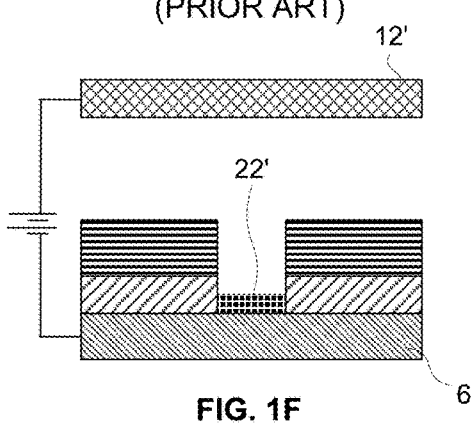
Figure 1G:
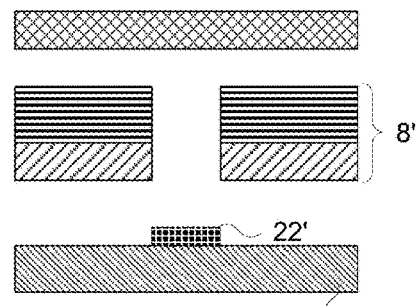
Figure 2A:
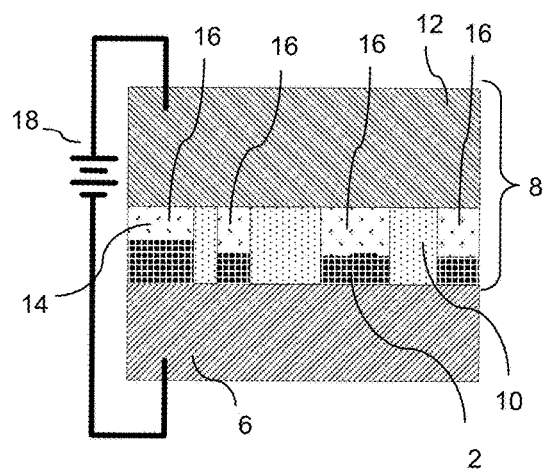
FIGS. 2A-2F schematically depict side views of various stages of an electrochemical fabrication process as applied to the formation of a particular structure where a sacrificial material is selectively deposited while a structural material is blanket deposited.
Figure 2B:
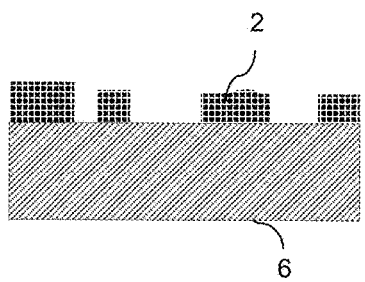
Figure 2C:
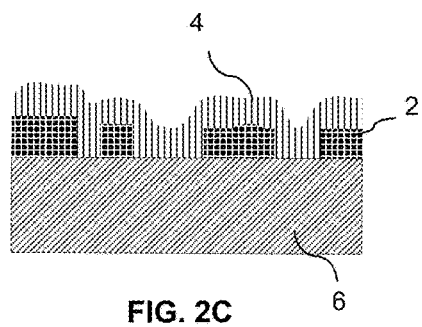
Figure 2D:
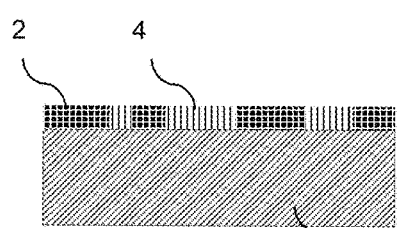
Figure 2E:
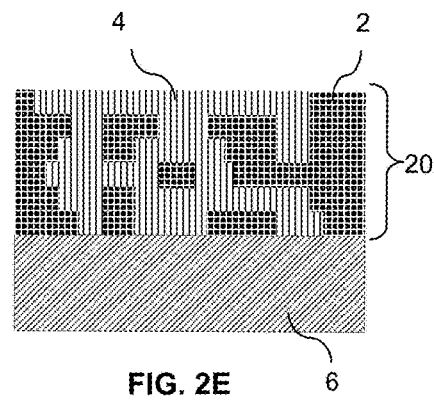
Figure 2F:
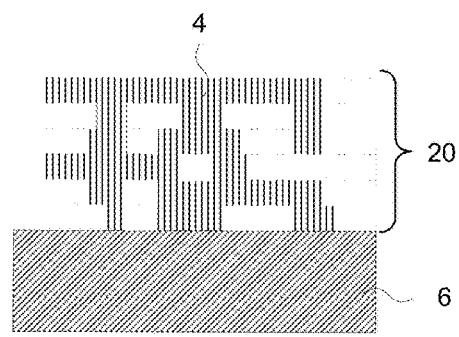
Figure 3A:
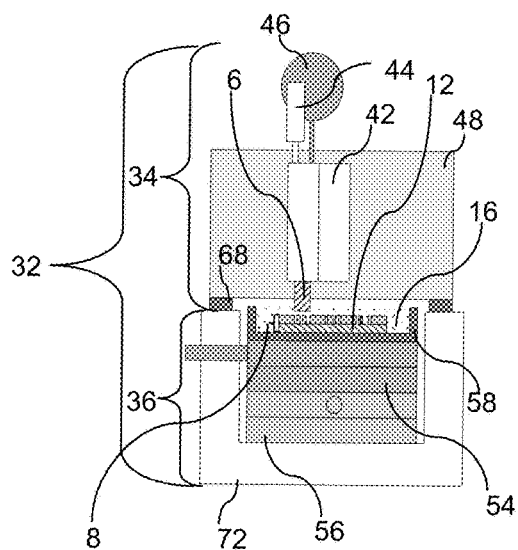
FIGS. 3A-3C schematically depict side views of various example subassemblies that may be used in manually implementing the electrochemical fabrication method depicted in FIGS. 2A-2F.
Figure 3B:
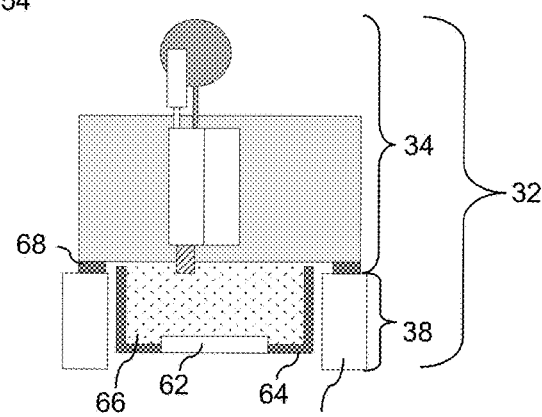
Figure 3C:
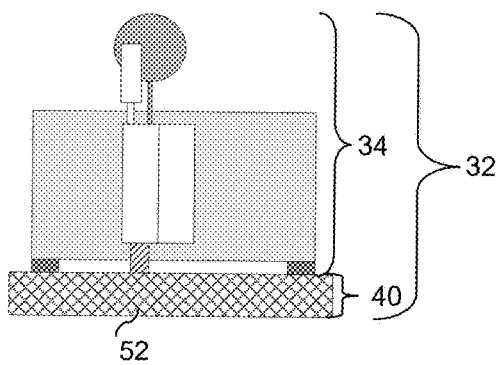
Figure 4A:
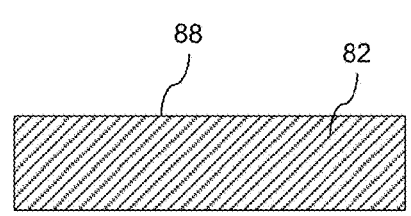
FIGS. 4A-4F schematically depict the formation of a first layer of a structure using adhered mask plating where the blanket deposition of a second material overlays both the openings between deposition locations of a first material and the first material itself.
Figure 4B:
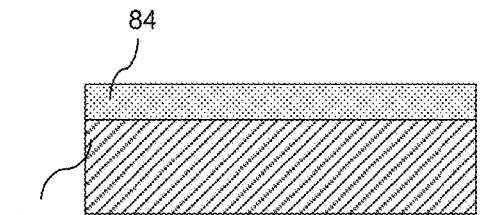
Figure 4C:
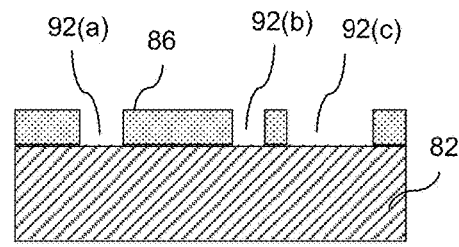
Figure 4D:
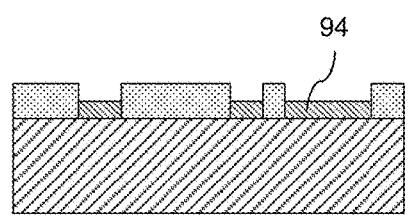
Figure 4E:
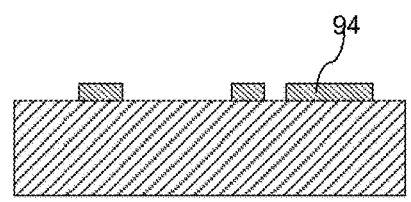
Figure 4F:
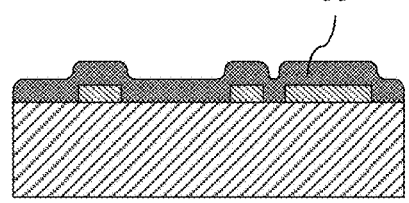
Figure 4G:
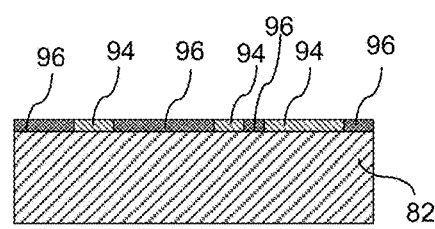
FIG. 4G depicts the completion of formation of the first layer resulting from planarizing the deposited materials to a desired level.
Figure 4H:
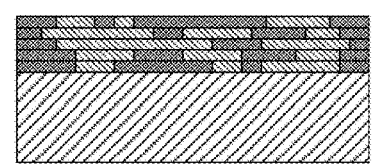
FIGS. 4H and 4I respectively depict the state of the process after formation of the multiple layers of the structure and after release of the structure from the sacrificial material.
Figure 4I:
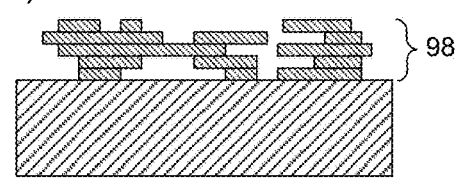

FIGS. 4A-4I illustrate side views of various states in an alternative multi-layer, multi-material electrochemical fabrication process. FIGS. 4A-4G illustrate various stages in the formation of a single layer of a multi-layer fabrication process where a second metal is deposited on a first metal as well as in openings in the first metal so that the first and second metal form part of the layer. In FIG. 4A a side view of a substrate 82 having a surface 88 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92($a$)-92($c$) extending from a surface 86 of the photoresist through the thickness of the photoresist to surface 88 of the substrate 82. In FIG. 4D a metal 94 (e.g. nickel) is shown as having been electroplated into the openings 92($a$)-92($c$). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure is shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some, or all, of which may be electrodeposited (as illustrated in FIGS. 1A-4I) or electrolessly deposited. Some of these structures may be formed from a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments structures having features positioned with micron level precision and minimum features size on the order of tens of microns are to be formed (i.e. microscale devices). In other embodiments structures with less precise feature placement and/or larger minimum features may be formed. In still other embodiments, higher precision and smaller minimum feature sizes may be desirable. In the present application mesoscale and millimeter-scale have the same meaning and refer to devices that may have one or more dimensions extending into the 0.5-30 millimeter range, or somewhat larger and with features positioned with precision in the 0.1-10 micron range and with minimum features sizes on the order of 1-100 microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed or damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids" which is hereby incorporated herein by reference as if set forth in full.

Temporary substrates on which structures may be formed may be of the sacrificial-type (i.e. destroyed or damaged during separation of deposited materials to the extent they cannot be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure (or part) or plurality of structures (or parts) from a plurality of applied or deposited materials which are stacked and adhered upon application or deposition or, as a noun, to the physical structure (or part) or structures (or parts) formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" or "lateral" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example they may be defined by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). As another example, they may be defined by levels at which process steps or operations are repeated. As still a further example, they may be defined, at least theoretically, as lateral extents of structural material can change to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer height or boundary level). For example, lapping removes material in a substantially non-selective manner though some amount of recession of one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization may be followed or preceded by thermally induced planarization (e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material. The structural material on a given layer may be a single primary structural material or may be multiple primary structural materials and may further include one or more secondary structural materials.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns. The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 $\mu m^2$) but thin (e.g. less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. During release or separation, sacrificial material is typically removed via a chemical etching operation but in some embodiments it may be removed via a melting operation, electrochemical etching operation, laser ablation, or the like. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal thought in some embodiments it may be a dielectric material and even a photoresist material. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material. The sacrificial material on a given layer may be a single primary sacrificial material or may be multiple primary sacrificial materials and may further include one or more secondary sacrificial materials.

"Secondary sacrificial material" as used herein is a sacrificial material that is located on a given build layer and is typically deposited or applied during the formation of the build layer but is not a primary sacrificial material as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary sacrificial materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns or less. The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event when such coatings are non-selectively applied, selected portions may be removed (1) prior to depositing either an additional sacrificial material or structural material as part of a current layer or (2) prior to beginning formation of the next layer or they may remain in place through the layer build up process and then be etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures wherein the structural material portions of at least two layers are not identical in configuration, not identical in lateral positioning, or not identical in orientation (i.e. the structural materials on the two layers do not completely overlap one another.

"Complex multilayer three-dimensional (or 3D or 3-D) structures" are multilayer three-dimensional structures formed from at least three layers where a line may be defined that hypothetically extends vertically through at least some portion of the build layers of the structure and that extends from structural material through sacrificial material and back through structural material or extends from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one of structural material or void (when the sacrificial material is removed) to the other of void or structural material and then back to structural material or void as the line is traversed along at least a portion of its length.

"Moderately complex multilayer three-dimensional (or 3D or 3-D) structures are complex multilayer 3D structures for which the alternating of void and structure or structure and void not only exists along one of a vertically or horizontally extending line but along lines extending both vertically and horizontally.

"Highly complex multilayer (or 3D or 3-D) structures are complex multilayer 3D structures for which the structure-to-void-to-structure or void-to-structure-to-void alternations occur not only once along the line but also occur a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g. due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e. lower yields) can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of gaps or voids (e.g. the MFS for sacrificial material regions when sacrificial material is deposited first). Conversely a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum feature size on a given layer may be roughly set to a value that approximates the layer thickness used to form the layer and it may be considered the same for both structural and sacrificial material widths. In some more rigorously implemented processes (e.g. with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) number of layers, (3) the criticality of the successful formation of each feature, (4) the number and severity of other factors affecting overall yield, and (5) the desired or required overall yield for the structures or devices themselves. In some circumstances, the minimum size may be determined by a yield requirement per feature which is as low as 70%, 60%, or even 50%. While in other circumstances the yield requirement per feature may be as high as 90%, 95%, 99%, or even higher. In some circumstances (e.g. in producing a filter element) the failure to produce a certain number of desired features (e.g. 20-40% failure may be acceptable while in an electrostatic actuator the failure to produce a single small space between two moveable electrodes may result in failure of the entire device. The MFS, for example, may be defined as the minimum width of a narrow processing element (e.g. photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

Thermal Control and Heat Transfer Arrays, Cold Plates, Systems, and Methods

In various embodiments of the invention, heat transfer arrays may be formed using the multi-layer, multi-material electrochemical methods, and other methods, set forth herein with any desired orientation relative to a stacking axis of the layers that form the device. However, in some embodiments it is preferred that the formation orientation be such that the bottom part or bottom surface of the heat transfer array (i.e. the part in contact with or in closest proximity to the semiconductor device or devices to be cooled) be formed parallel to the plane of the layers that are being stacked. In some embodiment, it is preferred that the primary jetting direction of fluid from the jetting structures be substantially perpendicular to the planes of the layers (i.e. substantially parallel to the stacking axis, i.e. preferable within 20 degrees of the stacking axis, more preferably within 10 degrees of the stacking axis, and even more preferable within 5 degrees of the stacking axis). In some embodiments, the jets may have jetting directions that are intentionally not parallel to the stacking access. In some embodiments, the heat transfer arrays may not have bottoms or at least may not have contiguous bottoms but instead the base of the array may be a semiconductor device (e.g. the back side of the wafer on which the active components are formed or a protective layer formed on the wafer material) or other heat source. In some embodiments, the heat transfer array may have a rectangular configuration while in other embodiments it may have a different configuration, e.g. a configuration that matches a shape and a size of a semiconductor chip or hot spot on the chip that is to undergo thermal management. In some embodiments, an individual heat transfer array may be formed as a single monolithic device while in other embodiments, heat transfer arrays may be formed as multiple elements that are bonded or otherwise joined one to another after formation. In some embodiment, multiple heat transfer arrays may be held apart from one another and even used in conjunction with multiple semiconductor devices. In some embodiments heat transfer arrays may be formed with etching holes that allow removal of a sacrificial material after all layers have been formed or after formation of only a portion of the layers. Such etching holes may be filled in or sealed after the layer formation process or after etching but during the layer formation process. In other embodiments, a top or lid and/or base or bottom may be formed separately to allow efficient removal of sacrificial material. Other embodiments may not require special openings to remove sacrificial material. Various methods exist to handle sacrificial material removal and/or multi-component device assembly as are set forth in some of the patents and patent applications incorporated herein by reference.

Figure 5:
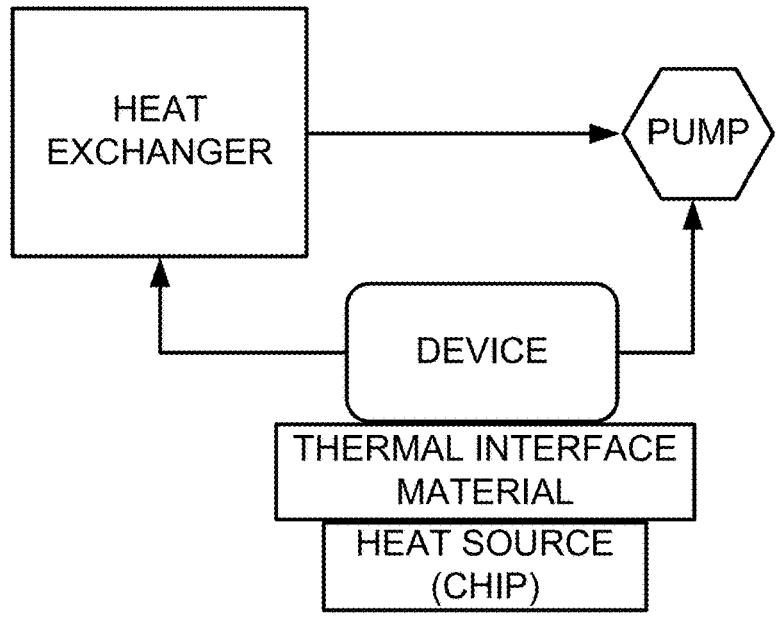
FIG. 5 provides a schematic view of a thermal management system (e.g. a cooling system) that includes a thermal management device in the form of a cold plate that includes at least one thermal transfer array and inlet and outlet headers or manifolds.

FIG. 5 provides a schematic view of a thermal management system (e.g. a cooling system) that includes a thermal management device in the form of a cold plate that includes at least one thermal transfer array and inlet and outlet headers or manifolds. The system further includes a heat exchanger, a pump and a thermal interface material for effectively coupling the thermal management device to a heat source (e.g. a semiconductor chip or group of chips). In this example system, thermal interface materials include thermal grease, solder, a thermal pad, or no material at all. The fluid pump may take a variety of forms including, for example, a centrifugal pump, a membrane pump, a piston pump, or a rotary pump. In this example, the heat exchanger may take any conventional form such as a finned array with a fan, a radiator, a thermal electric device, a liquid to liquid heat exchanger, a liquid-to-air heat exchanger, an evaporative cooler, and the like. The heat transfer array may take a number of different forms including a microjet array, a microchannel array, a hybrid microjet microchannel array, an integrated fin microjet array, a microchannel and integrated fin and microjet array. As used herein, an integrated fin and microjet array refers to the jetting paths and orifices extending through the fins and the fins providing opening near their distal ends to allow jetting to occur while still having intimate contact between the fins and the heat transfer surface or surfaces. Fluid pipe of flow paths between components may take any of a variety of forms including for example copper pipes, flexible plastic pipes, relatively large channels in solid blocks of material, and the like.

Figure 6:
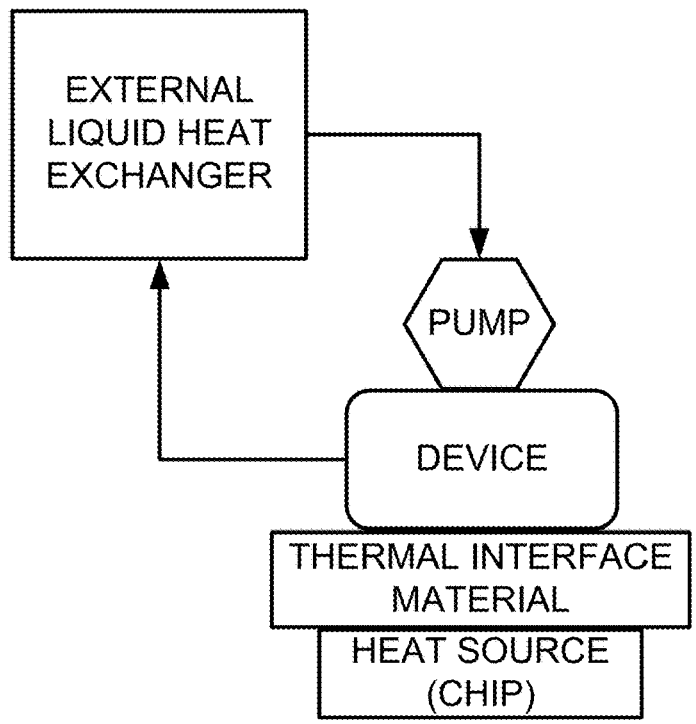
FIG. 6 provides a schematic view of an alternative thermal management system (e.g. a cooling system) that includes a thermal management device (e.g. a cold plate that includes a heat transfer array in combination with separately formed inlet and outlet headers or manifolds).

FIG. 6 provides a schematic view of an alternative thermal management system (e.g. a cooling system) that includes a thermal management device (e.g. a cold plate that includes a heat transfer array in combination with separately formed inlet and outlet headers or manifolds). As with the embodiment of FIG. 5, the system includes a heat exchanger. But in this embodiment, the system includes a pump that is joined to or is part of the thermal management device (e.g. a pump directly on top of the device with an impeller that drives liquid into and/or pulls liquid out of the heat transfer array). In this embodiment, as well as in that of FIG. 5, the thermal management device is effectively coupled to a heat source via a thermal interface material. In some variations, inclusion of a separate thermal interface material may not be necessary (for example, when a surface of the heat source acts a jetting impingement surface).

Figure 7:
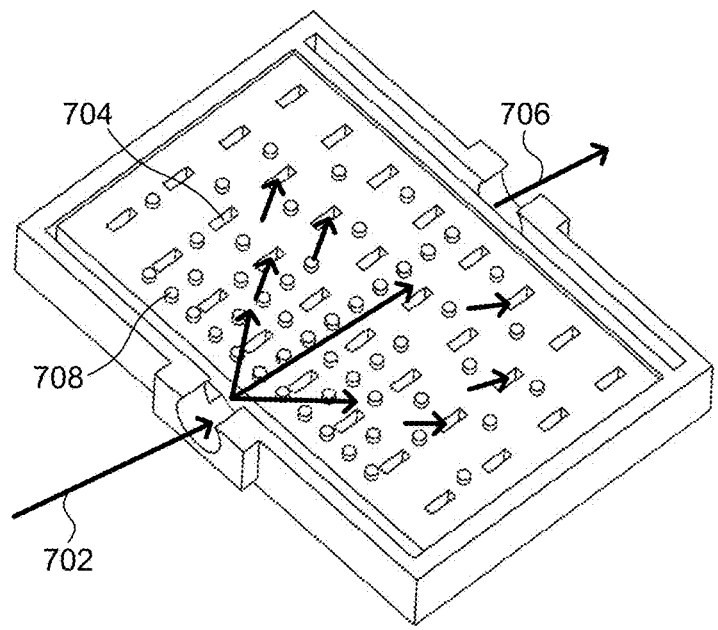
FIG. 7 provides a perspective view of an example cold plate with its cover removed that includes an integrated microchannel and microjet array (heat transfer array) wherein the heat source (not shown) is to be positioned below the array and wherein cooling fluid (e.g. water) flows in from the left side of the device over the baffle plate and then into the slot jets to extract heat from the source and then finally flows out through the outlet on the right side of the device.

FIG. 7 provides a perspective view of an example cold plate with its cover removed that includes an integrated microchannel and microjet array (heat transfer array) wherein the heat source (not shown) is to be positioned below the array and wherein cooling fluid (e.g. water) flows into an inlet 702 from the left side of the device over the baffle plate and then into the slot jets 704 to extract heat from the source and then finally flows out through the outlet 706 on the right side of the device. In this embodiment the baffle plate includes a plurality of cylindrical flow redirection elements (fin array) 708 that provide an enhanced fluid flow pattern before the fluid enter the jetting structures.

Figure 8:
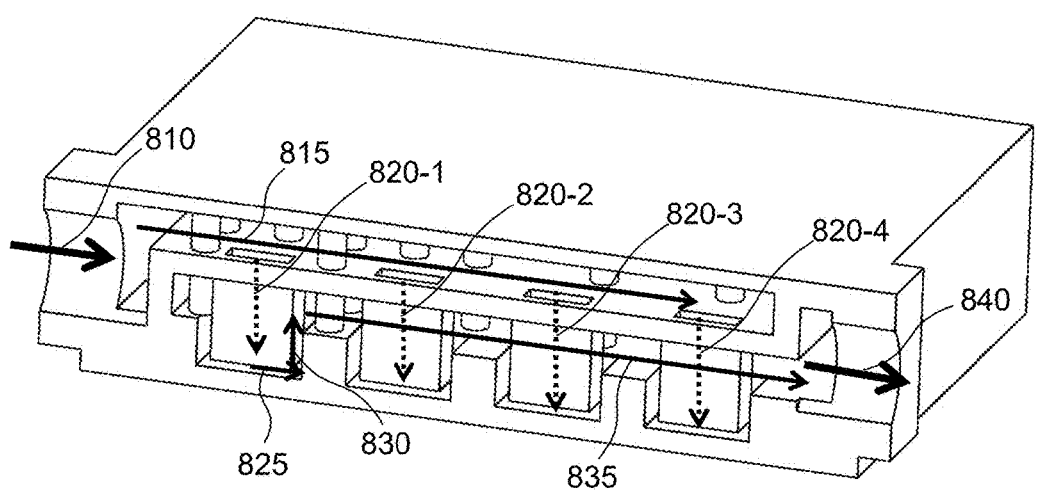
FIG. 8 provides a cut perspective view of the cold plate with an integrated heat transfer array and inlet/outlet system such that the inlet, the baffle plate, baffle elements, jets, and post jetting flow channels and outlet can be seen.

FIG. 8 provides a cut perspective view of the cold plate with an integrated heat transfer array and inlet/outlet system such that the inlet, the baffle plate, baffle elements, jets, and post jetting flow channels and outlet can be seen. In this example, the inlet includes inlet orifice, a relative large spreading region adjacent thereto and the baffle plate flow region, while the outlet includes the outlet orifice and the relatively large collecting region adjacent there to, while the heat transfer array portion of the device includes the jets, the jetting wells, and the after jetting flow paths (and associated structures) that travel around the sides of the jets as fluid move toward the outlet. In some variations of this embodiment, the heat transfer array portion of the cold plate may be fabricated using a multi-layer multi-material electrodeposition method while the other parts of the cold plate may be fabricated via other methods (e.g. machining via water, laser, physical cutting tools, abrasive cutting tools, etching, or the like) and thereafter mating via bonding or clamping made to occur in combination with appropriate sealants. In other variations the whole device may be made monolithically via multi-layer multi-material electrodeposition method using a single metal or plurality of different metals and possibly other materials.

Arrows in FIG. 8 show fluid flow 810 through the inlet, flow 815 past the structures on the baffle plate, flow 820-1 to 820-4 through the jets, flow 825 along the base of the array (in the jetting wells) at the point of closest contact with the heat source, flow 830 from the jetting well out of the local jetting channels, flow 835 through the post jetting channel, and flow 840 out of the outlet. In some alternative embodiments, the transfer array may not have a solid bottom, or base, but instead fluid may be directed directly onto the upper surface of the heat source (e.g. silicon or other semiconductor surface), in still other embodiments, the base may take the form of a series of separate impact plates that are located above the heat source surface in the region where direct perpendicular impact will occur but are nonexistent where largely horizontal or tangential fluid flow over the heat source would occur.

In some embodiments, the array of FIG. 8 may be formed from a plurality of layers built up using a multi-layer, multi-material electrochemical fabrication process as described above wherein a direction of layer stacking may be parallel to a direction of jetting. In other embodiments, layer stacking directions may be different.

In some preferred embodiments, though not necessarily all embodiments, the jetting structures also act as fins, or worded another way, some of the fin structures have embedded jets. In the depicted embodiments, the jetting impact surfaces are closer to a heat source surface (e.g. a semiconductor surface) than is the primary exit path, channel, or level. These jetting surfaces may be considered to be located that the bottom of jetting wells with each jet having its own well and with the fluid exit path being above the floor of the jetting wells. In some embodiments, it is possible to have multiple jets (e.g. 2, 3 or 4 jets) share a jetting well while still having the primary fluid exit path being above the floor of the jetting wells. In some embodiments, the lower surface of the jet side walls (excluding bridging material that provides fin functionality) is located below (i.e. closer to the floor of the jetting wells than is the primary fluid exit channel) while in other embodiments, the lower extent of the jet side walls may be located above a primary fluid exit channel.

In some embodiments jetting may occur directly on a heat source surface (e.g. a silicon or other surface of the semiconductor that is being cooled) while other embodiments may jet onto a floor of the transfer array which has been bonded to the semiconductor surface or to an independent jetting surface that has been transferred to the semiconductor surface or deposited directly thereon. Such an independent jetting surface may be located only in jetting well regions, in portions of jetting wells where substantially perpendicular impact of jetted fluid is to occur (e.g. within 15 degrees of perpendicular, within 10 degrees, within 5 degrees, or even within 1 or 2 degrees) or may be located as a complete coating applied to the semiconductor surface. In some embodiments the semiconductor surface may be the back side of a semiconductor (i.e. the side opposite to where semiconductor device formation occurs). In some embodiments, the semiconductor surface may undergo etching or planarization to reduce its thickness prior to locating, applying or forming the transfer array (i.e. the microchannel, microjet array) thereon. In some embodiments the reduction in thickness may be uniform while in other embodiments the reduction in thickness may be non-uniform and may actually be used to form flow channels or jetting wells that may be used by the transfer array. In some embodiments, thinning may be followed by deposition of one or more materials to provide enhanced surface properties. In some embodiments, for example semiconductor thickness may start in the range of 500-700 microns (ums) and be thinned to 400 microns, 300 microns or even less. In some embodiments, mounting the transfer array onto the semiconductor may occur by direct bonding, clamping the devices together with an intermediate thermal transfer material (e.g. solid or flowable) that may provide some thermal expansion stress relief. In still other embodiments, bonding or attachment to a semiconductor may not occur but instead the cooling device may be bonded or attached to another part of a semiconductor package such as a PCB, a PWB, or an integrated heat spreader (IHS) to which the semiconductor device is attached. Some embodiments that make use of an intermediate thermal grease may target a thickness of between 25-50 microns while bonding that occurs via solder may target solder thicknesses in the range of 25-75 microns. Some embodiments may use o-ring seals, solder, or other sealants when bringing separately formed elements into hermetic configuration. Some embodiments may make use of ultrasonic or diffusion bonding to ensure proper sealing.

Figure 9:
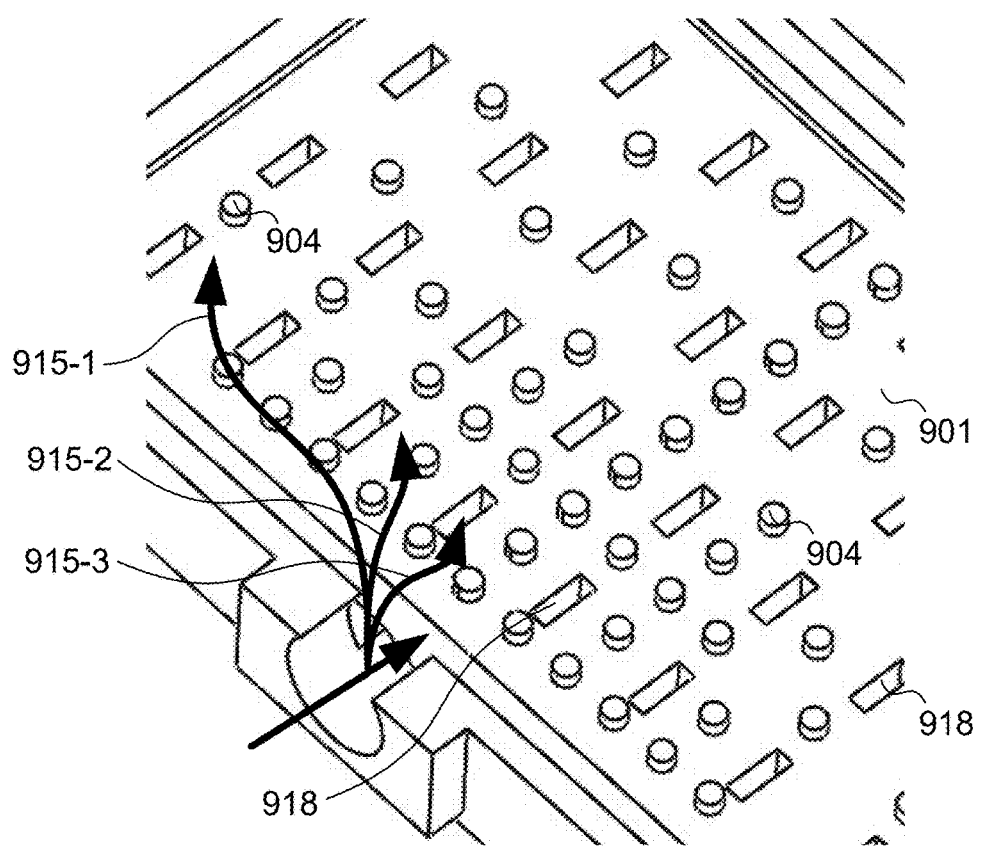
FIG. 9 provides a perspective view of an example cold plate similar to that of FIGS. 7-8 where a portion of the baffle plate and fluid flow lines showing some possible fluid flow paths through an inlet layer or region around the baffle elements can be seen.

FIG. 9 provides a perspective view of a device similar to that of FIGS. 7-8 where a portion of the baffle plate 901 is shown along with fluid flow lines 915-1 to 915-3 showing some possible fluid flow paths through an inlet layer or region around the baffle elements 904 as the fluid progresses toward individual jet orifices 918. The baffle elements may take on a variety of different forms to aid in efficiently channeling the fluid flow.

Figure 10:
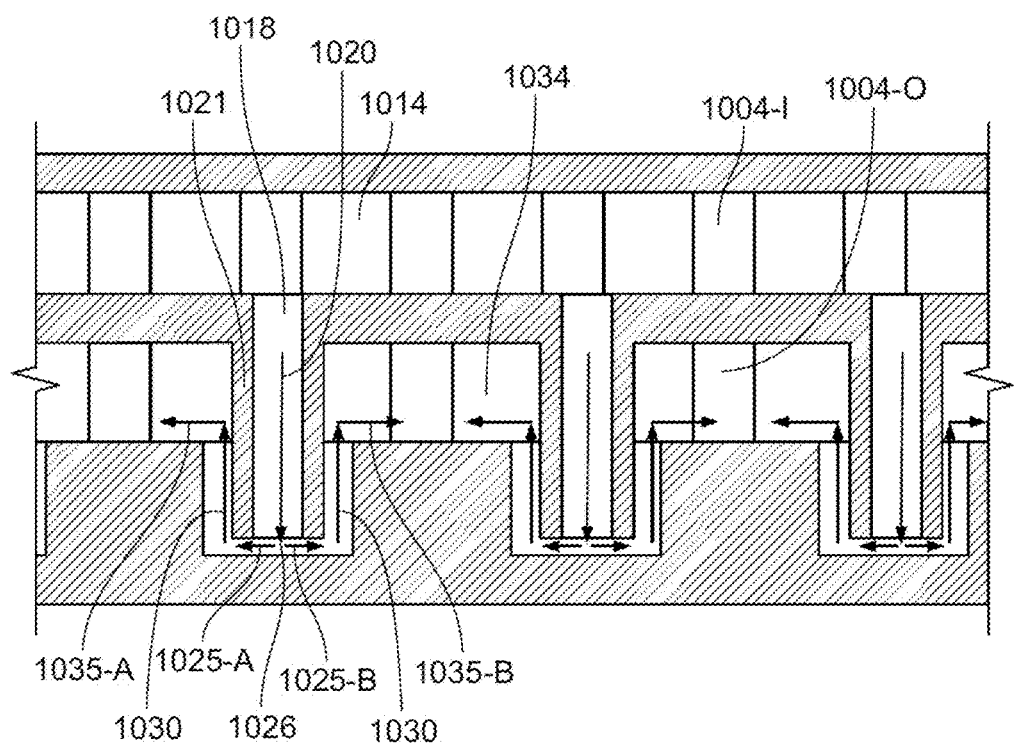
FIG. 10 provides a cut side view of several jet elements having walls and orifices of a device similar to the devices of FIGS. 7-9 such that inside channels of the jets, flow paths through the jets, and fluid impact regions below the jets can be seen, wherein a heat source, to be cooled, would be located below the heat transfer region at the bottom of the figure.
Figure 21:
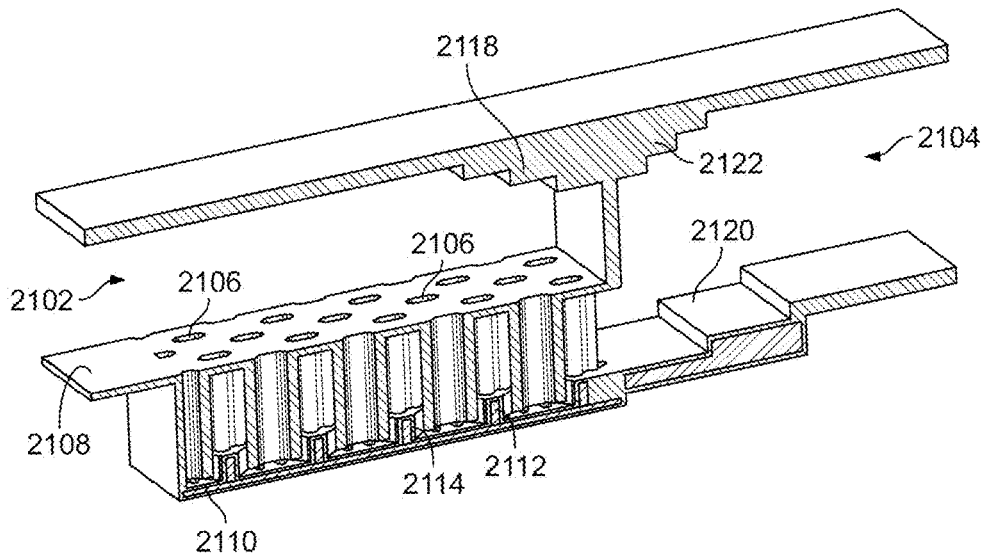
FIG. 21 provides a cut view (sliced in a plane containing the stacking axis of layers and an axis connecting a side inlet and a side outlet) of a cold plate according to another embodiment of the invention wherein a heat source to be cooled would be located below the cold plate and wherein the cold plate does not include any baffle elements in the inlet region.

FIG. 10 provides a cut side view of several of the jet elements having walls 1021 and orifices 1018 similar to the devices of FIGS. 7-9 such that the inside channel (i.e. orifice or nozzle) 1018 of the jet, the flow path through jetting channel 1020 and the fluid impact region 1026 below the jets are visible with the post jetting fluid initially following flow paths 1025-A and 1025-B. The fluid inlet channel 1014 can be seen above the jet orifice entry level where the fluid flow 815 of FIG. 8 would exist as the fluid flow past baffle elements 1004-I, the fluid exit channel 1034 can also be seen with arrows 1035A and 1035B showing examples of where the fluid flow 835 of FIG. 8 would exist as it flow past baffles or solid fins 1004-O. Fluid flows of the jetting channel 1020 and of microchannel 1030 are anti-parallel and substantially perpendicular to a plane of the surface on to which jetting occurs though some relatively small component of flow may be parallel to the surface that receives jetted material. Conversely fluid flows 1025-A and 1025-B and 1035-A and 1035-B are substantially parallel to the surface on to which jetting occurs though some relative small component of flow may be perpendicular to the surface that receives jetted material. FIG. 10 also shows that the fluid flow 1035-A through the exit layer, or region, is spaced between the inlet layer, or region, and the top of fluid wells into which jetting occurs. The bottom of the jet walls are spaced vertically between the surface onto which jetting occurs and a level of the top of the wells (which forms the lower boundary of the exit layer) such that jetted material after impingement must flow horizontally or laterally 1025 a small distance prior to changing to a vertical flow direction of microchannel 1030 between the jet walls and the well walls before again turning back to a horizontal, or lateral, flow direction 1035 in the exit layer. The primary heat transfer region is considered to be the region at the bottom of the jetting wells though heat is extracted by the flowing liquid as it moves past the well walls, over the tops of the wells and around the baffles or fins in region 1034. In some embodiments as can be seen in FIG. 21 a portion, or portions of the jet side walls may extend down and contact, bond to, or be formed integral with the surface of jetting fluid impingement thus making jetting structures in such embodiments also function as heat flow fins from which pre-jetted liquid and post jetted liquid can absorb heat to further enhance heat transfer.

Figure 11:
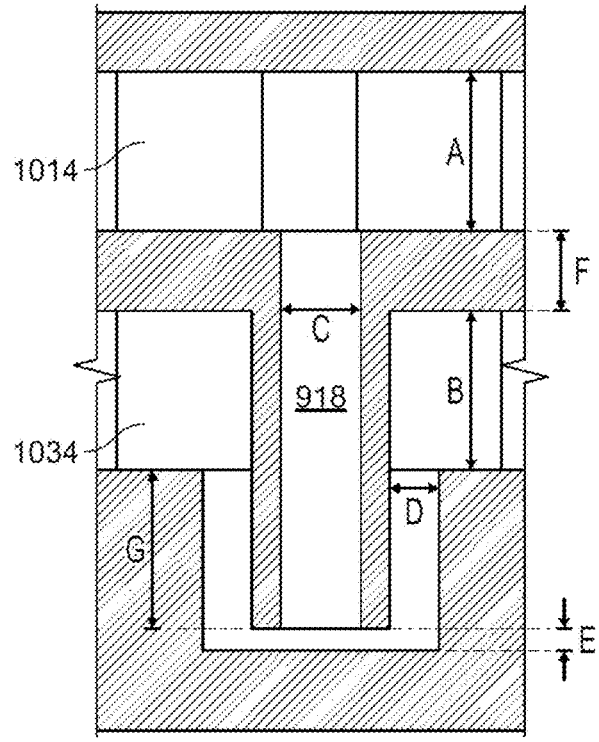
FIG. 11 provides a cut view of a single microjet region of a device along with some sample dimensional ranges that might be used in some embodiments.

FIG. 11 provides a cut view of a single microjet region of a device along with some sample dimensional ranges that might be used in some embodiments. Of course in other embodiments, the dimensions may vary away from the ranges indicated herein.

Figure 12:
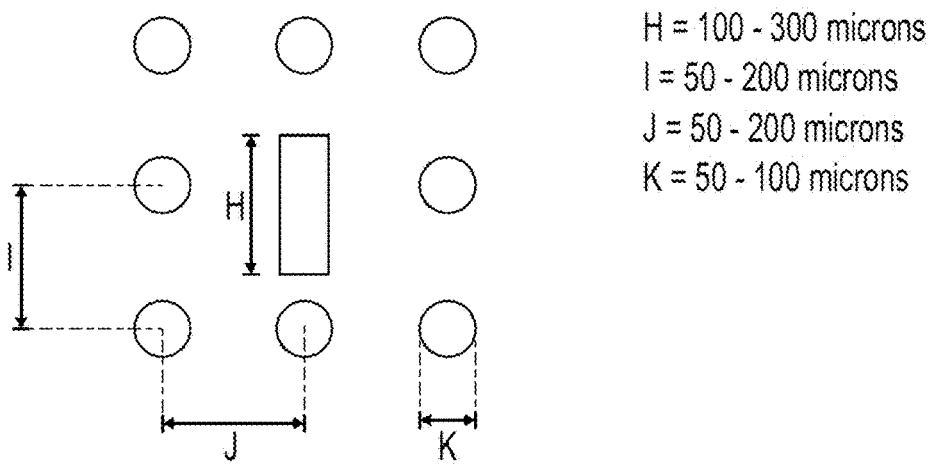
FIG. 12 provides a cut top view of the baffle plate along with some sample dimensions for the jet, baffles, and spacing between baffle elements.

FIG. 12 provides a cut top view of the baffle plate along with some sample dimensions for the jet, baffles, and spacing between baffle elements. In some embodiments jet dimensions, baffle size and configuration, and baffle spacing as well as spacing between jets may vary depending on where these structures are located relative to the inlet, sidewalls, back wall, or the like.

Figure 13:
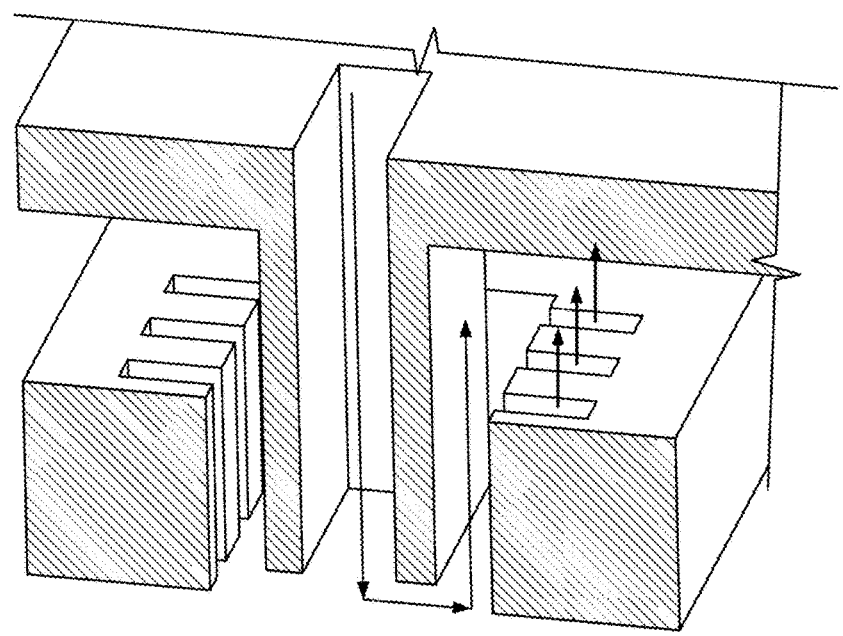
FIG. 13 provides another perspective cut view of a single jet region where the post jetting flow regions along the well walls include solid fin elements and channels to provide additional surface area for optimizing heat transfer.

In some embodiments jets may change dimensions vertically along the flow path (e.g. by widening or narrowing at desired locations). In some embodiments small corner regions may be filled in to minimize locations where fluid stagnation or low flow may exist so as to further enhance heat transfer. Such regions may exist in the inlet layer, the exit layer, or even the regions where well floors and well walls meet. In other embodiments, surface texturing may be added to key heat transfer regions to further enhance surface area contact and thus heat transfer FIG. 13 provides another perspective cut view of a single jet region where the post jetting flow regions along the well walls include solid fin elements and channels to provide additional surface area for optimizing heat transfer.

Figure 14:
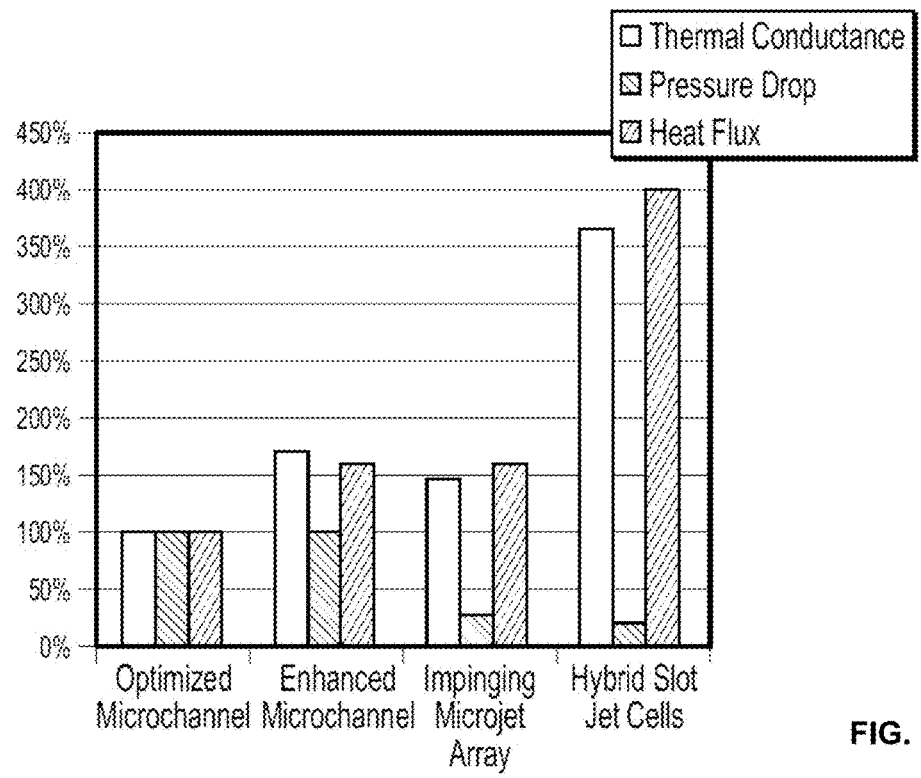
FIG. 14 provides a chart illustrating the anticipated performance enhancement that may be achievable by some embodiments of the present invention where microchannels or optimized microchannels and microjet arrays are combined for improved thermal conductance, decreased pressure drop across the heat transfer array, and improved heat flux through the heat transfer array.

FIG. 14 provides a chart illustrating the anticipated performance enhancement that may be achievable by some embodiments of the present invention where microchannels or optimized microchannels and microjet arrays are combined for improved thermal conductance, decreased pressure drop across the heat transfer array, and improved heat flux through the heat transfer array.

Figure 15:
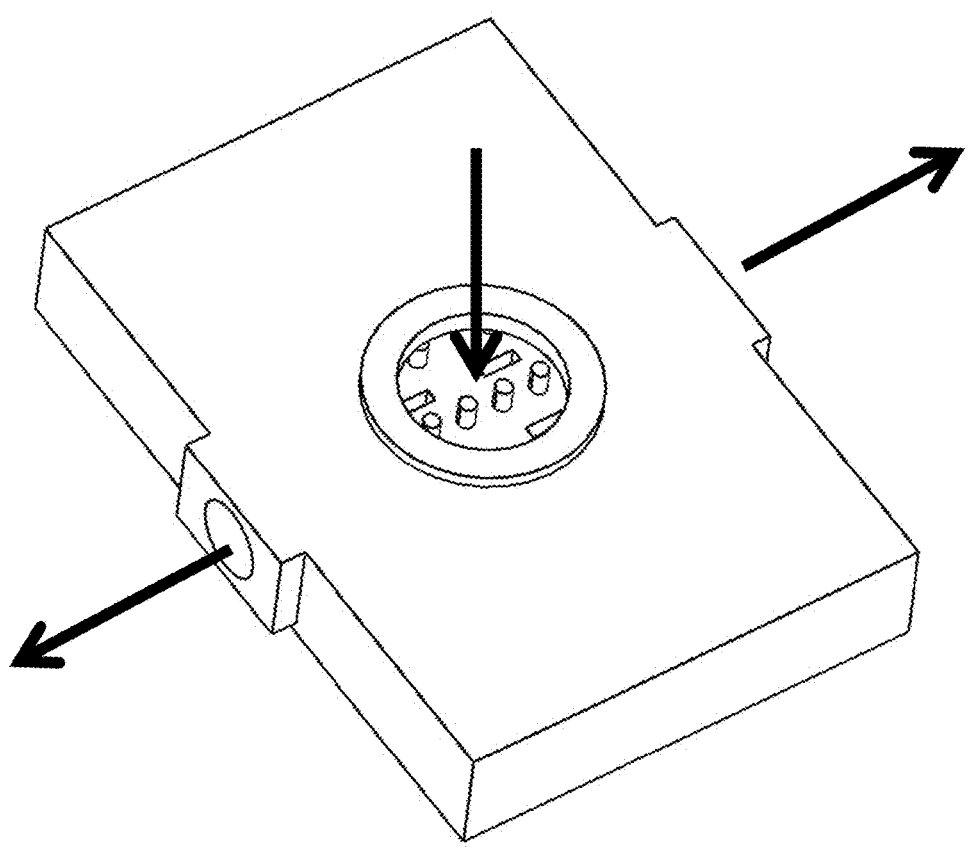
FIG. 15 provides a perspective view of the top of an alternative cold plate (i.e. heat transfer array and inlet/outlet combination) with the cover in place and with the inlet moved from the left side to the top and with the single outlet of FIG. 7 modified into two outlets with one on the left and one on the right.

FIG. 15 provides a perspective view of the top of an alternative cold plate (i.e. heat transfer array and inlet/outlet combination) with the cover in place and with the inlet moved from the left side to the top and with the single outlet of FIG. 7 modified into two outlets with one on the left and one on the right. In other alternatives, the positions of the outlet(s) and inlet(s) may be reversed or the numbers of them changed.

Figure 16:
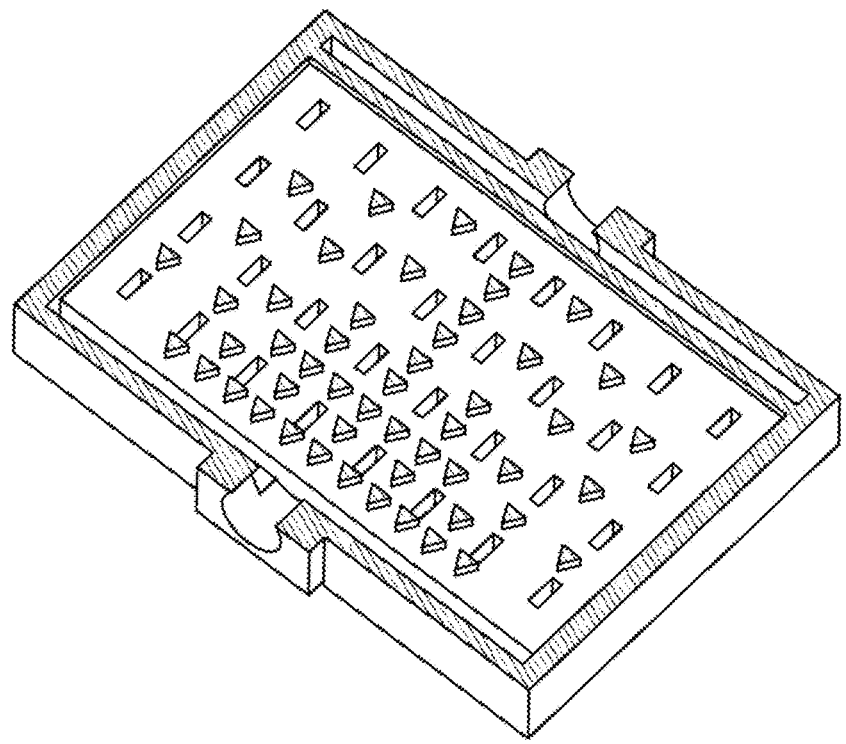
FIG. 16 provides a perspective view of the top of another alternative cold plate, with the cover removed, and with the cylindrical baffle elements replaced by triangular elements with an apex, i.e. vertex, of the triangles splitting the incoming fluid flow into desired flow paths.

FIG. 16 provides a perspective view of the top of another alternative cold plate, with the cover removed, and with the cylindrical baffle elements replaced by triangular elements with an apex, i.e. vertex, of the triangles splitting the incoming fluid flow into desired flow paths. In other embodiments, other baffle configurations are possible and may include wing shaped elements, diamonds, rectangles, ovals, or the like. In still other embodiments, the baffle elements may be located behind jet openings as opposed to in front of them. In still other embodiments, more than one type of baffle element may be employed wherein the type used may be dependent on the location of the baffle relative to the jetting orifices. In some alternative embodiments, baffle elements may not only include varying configurations in the plane of layer formation but also in the stacking direction of layer formation (e.g. a baffle behind a jet orifice may include a vertically curved or stair stepped structure that helps redirect horizontal fluid flow into vertical fluid flow over a jetting orifice. In some alternative embodiments, a back plate may have a curved shape that redirects fluid flow smoothly back to a front side of the cold plate so that it may make another flow pass past the orifices as opposed to forming pockets of low flow or stagnated fluid. In still other embodiments, the inlet layer may have a reduced baffle/fin count or even be baffle/fin free so as to provide the overall cold plate with a reduced pressure drop.

Figure 17:
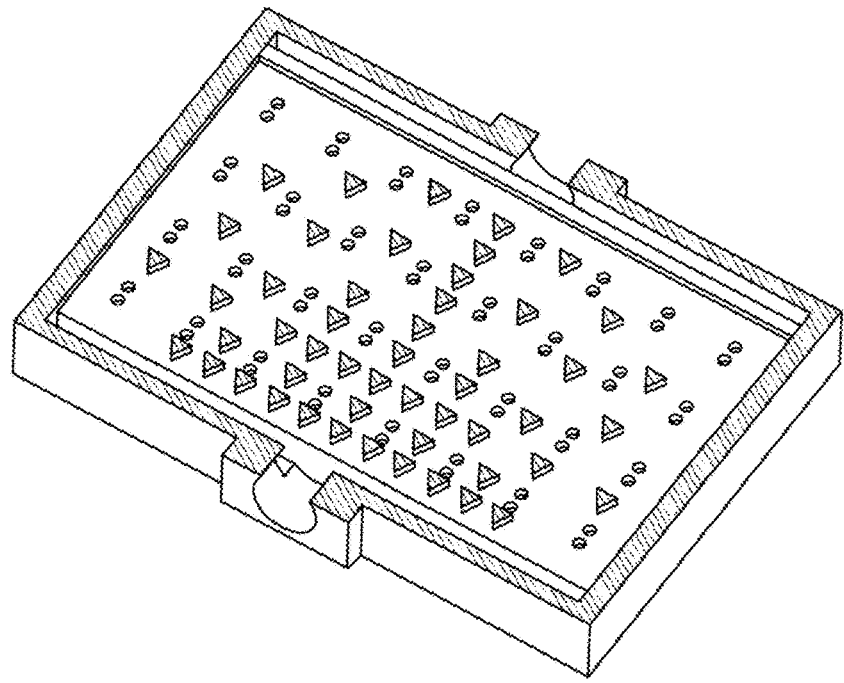
FIG. 17 provides a perspective view of the top of another alternative cold plate, with the cover removed, and with the rectangular jets replaced by pairs of cylindrical jetting orifices.

FIG. 17 provides a perspective view of the top of another alternative cold plate, with the cover removed, and with the rectangular jets replaced by pairs of cylindrical jetting orifices. In other embodiments, other orifice configurations are possible as well as opening configurations that allow flow of fluid from the jetting cavity or well back to the exit channel (to be discussed hereinafter).

Figure 18:
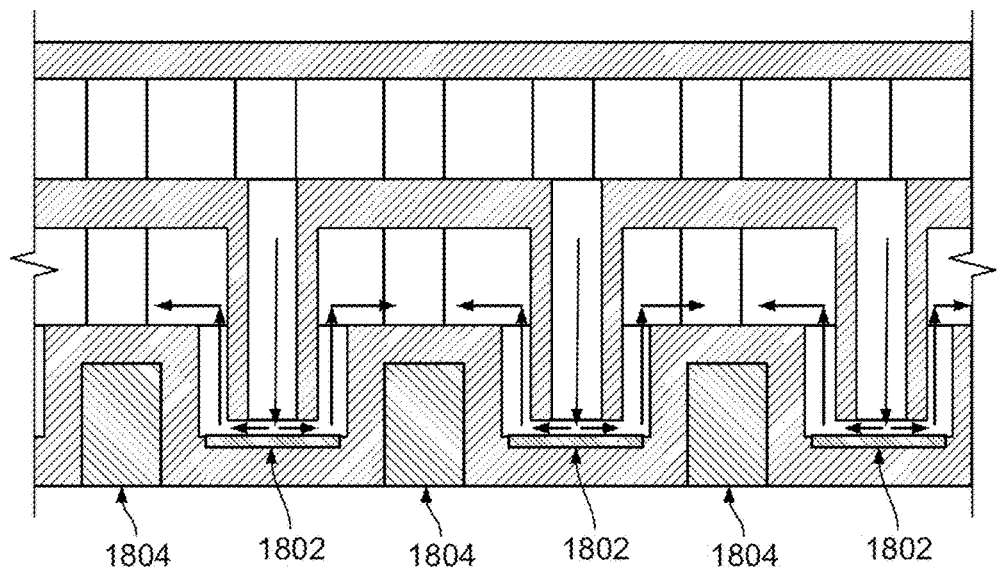
FIG. 18 provides a cut view of the jetting channels for three jets showing fluid flow paths similar to those shown in FIG. 10 but with a different, or secondary structural, material covering the jetting impact regions and a tertiary structural material replacing selected portions of the basic structural material.

FIG. 18 provides a cut view of the jetting channels for three jets showing fluid flow paths similar to those shown in FIG. 10, however in the embodiment of FIG. 18 two changes have been made, (1) the material covering the jetting impact regions has been changed from a first, or basic, structural material (e.g. nickel, a nickel alloy, palladium, or the like) to different, or secondary structural, material 1802 and (2) selected portions of the basic structural material have been replaced with a tertiary structural material 1804. The secondary structural material may be a harder material such as, for example, rhodium as set forth in the figure, so as to limit any wear or erosion that might otherwise result from the concentrated fluid impingement. The tertiary material may be a material of higher conductivity (e.g. copper, silver, or gold) than the basic structural material (e.g. nickel, a nickel alloy, palladium, or the like) but may be lacking in some other important property (e.g. hardness, durability, strength, incompatibility with an etchant that may be used to remove a sacrificial material, or the like). In some embodiments, the tertiary material and the sacrificial material may be the same material and thus the tertiary material may require protection by a shell of the basic structural material to keep it from being removed during sacrificial material etching. In some embodiments the secondary material and/or tertiary material may be added to the primary build material in any manner desired (e.g. performed plugs that are inserted into position as layer are formed or after layer formation if access is available, deposits that are made after layer formation is completed, deposits made during an interpretation to the layer formation process, or deposits made as part of a multi-layer, multi-material formation process). In some embodiments, the roles of the secondary and tertiary material may be filled by the same material. In some embodiments, only a basic structural material and a secondary material may be used (i.e. no tertiary material) while in other embodiments the basic material may be used with just the tertiary material (i.e. no secondary material), while in still other embodiments one or more additional specialized materials may be added for various purposes either alone or in combination with other materials.

Figure 19:
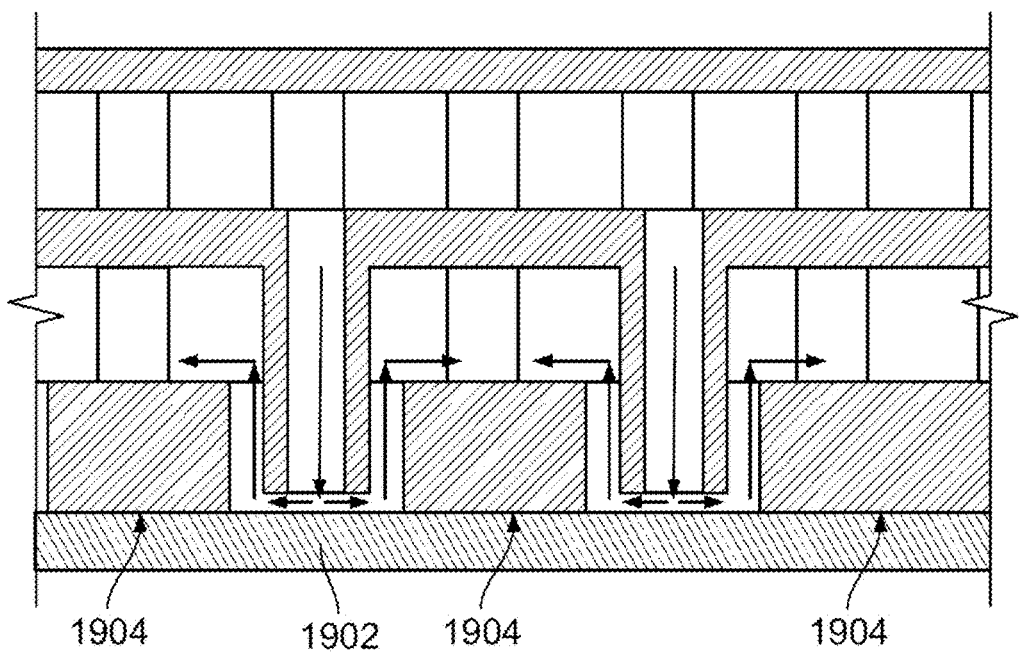
FIG. 19 provides a cut view of the jetting walls, jetting channels, and jetting wells for three jets showing fluid flow paths similar to those shown in FIG. 10 but with no heat transfer array structural material in the jet impact region.

FIG. 19 provides a cut view of the jetting walls, jetting channels, and jetting wells for three jets showing fluid flow paths similar to those shown in FIG. 10, however the embodiment of FIG. 19 indicates that there is no heat transfer array structural material in the jet impact region thus allowing the jetted fluid to impact directly on to the material of the heat source. In such situations, as well as in embodiments where a heat transfer array base exists, the heat transfer array and the heat source 1902 may be bonded or sealed 1904 to one another in any appropriate manner (e.g. soldering, conductive epoxy, pressure fitting with a softer highly conductive metal, clamping with o-ring seals, ultrasonic bonding, diffusion bonding, brazing, or the like). In other embodiments, the heat transfer array may carry with it an impact surface of a desired size, shape and material that can be bonded or seated against the heat source while still providing at least a portion of the surrounding area as a direct fluid impact zone. In other embodiments, an impact pad of a desired material may be formed on or attached to the heat source prior to mounting the heat transfer array.

Figure 20:
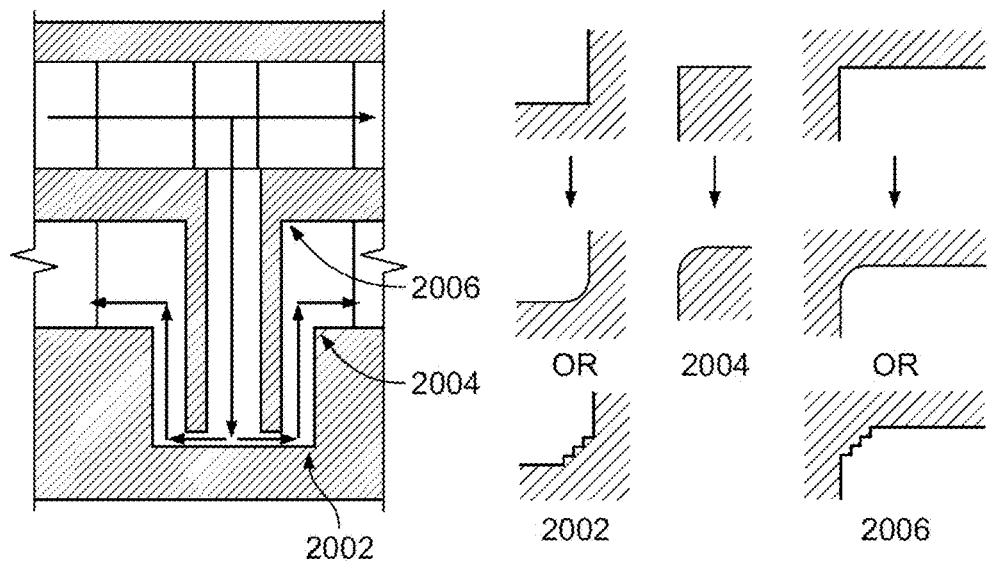
FIG. 20 provides a cut view of a jetting location and illustrates how corners may be rounded, filleted, reconfigured to have smaller stair-stepped features so as to minimize pockets or regions of reduced fluid flow which may enhance heat transfer.

FIG. 20 provides a cut view of a jetting location and illustrates how corners 2002, 2004, and 2006 may be rounded, filleted, reconfigured to have smaller stair-stepped features, which may be provided by techniques set forth in U.S. Pat. No. 7,198,704, so as to minimize pockets or regions of reduced fluid flow which may enhance heat transfer.

FIG. 21 provides a cut view (sliced in a vertical plane defined by the stacking axis of the layers of the device and an axis connecting a side inlet and a side outlet) of a cold plate according to another embodiment of the invention showing (1) an inlet region 2102 which may be considered part of a header or manifold, (2) an outlet region 2104 which may, at least in part be considered part of a header or manifold, (3) a cap above the inlet and the outlet regions defining a top of a header or manifold, (4) a lateral dividing wall between the inlet and outlet regions, (5) a horizontal jet inlet surface 2108 defining a bottom of a header or manifold on the inlet side and including a plurality of jet channel entrance ports 2106, (6) a heat exchange base 2110 having a core material 2112 encased in a shell material 2114 and providing a plurality of individual jetting surfaces and primary heat transfer regions within jetting wells, (7) a plurality of microjets extending from the jet inlet surface to a position spaced from floors of the jetting wells and including spaced apart extensions or bridging element that contact the impingement surface (or merging with it) of the heat exchange base within each jetting well to provide heat conduction fin functionality, (8) post-jetting fluid channels located between the side walls of the jets and the well walls and an exit region above the jetting wells where exiting fluid can move laterally flow between the inlet region and the upper surfaces of the wells past jet sidewalls and any additional solid fins or baffles. In many respects the device is similar to those of the prior figures but some differences exist. The device of this embodiment does not include any baffle elements in the inlet region, it includes oblong smooth surfaced jets having elongated cross-sectional dimensions parallel to the axis extending from the inlet to the outlet, a stair stepped structure 2118 connecting the cap and a right most inlet chamber wall (i.e. a sloping down structure on the back wall of the inlet chamber), a stair stepped lower surface 2120 and stair stepped upper surface 2122 of an outlet (i.e. a sloping surface that may help direct fluid out of the heat transfer array while reducing stagnate or slow flowing fluid traps.

Figure 22A:
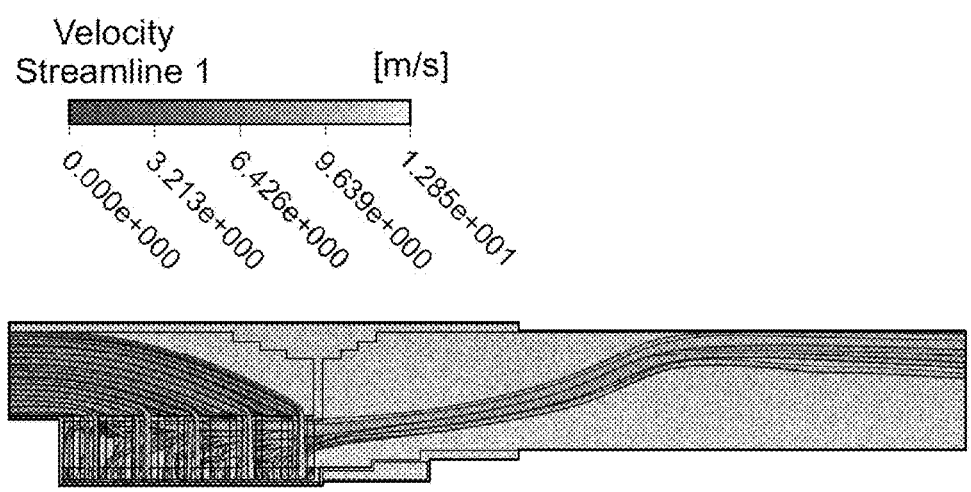
FIGS. 22A-22B provide fluid flow illustrations as derived from an ANSYS Fluent simulation.
Figure 22B:
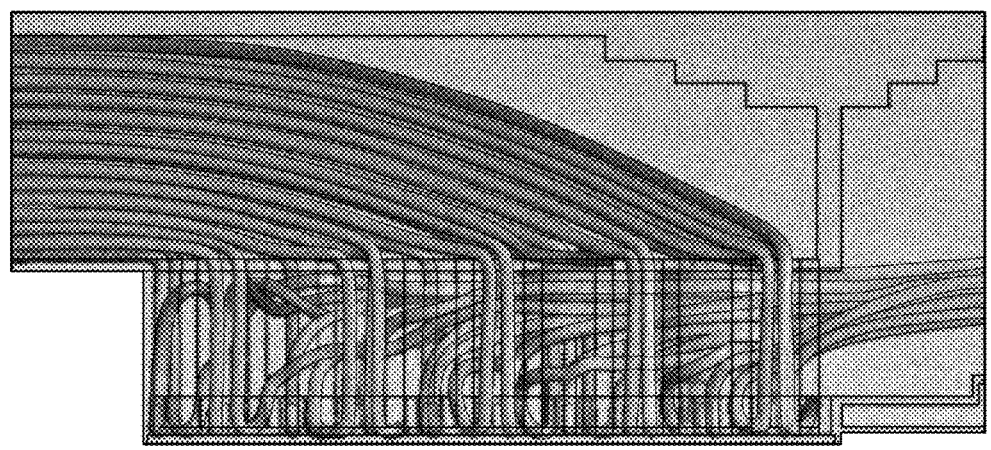

FIGS. 22A and 22B provide fluid flow illustrations as derived from an ANSYS Fluent simulation. FIG. 22B provides a close up of the fluid flow movements in the region of the microjets while FIG. 22A provides a view of the entire flow from inlet to outlet. The colors in these images relate to the flow speed of the heat transfer fluid with blue representing the lowest flow rate and yellow and red the highest flow rate.

Figure 23:
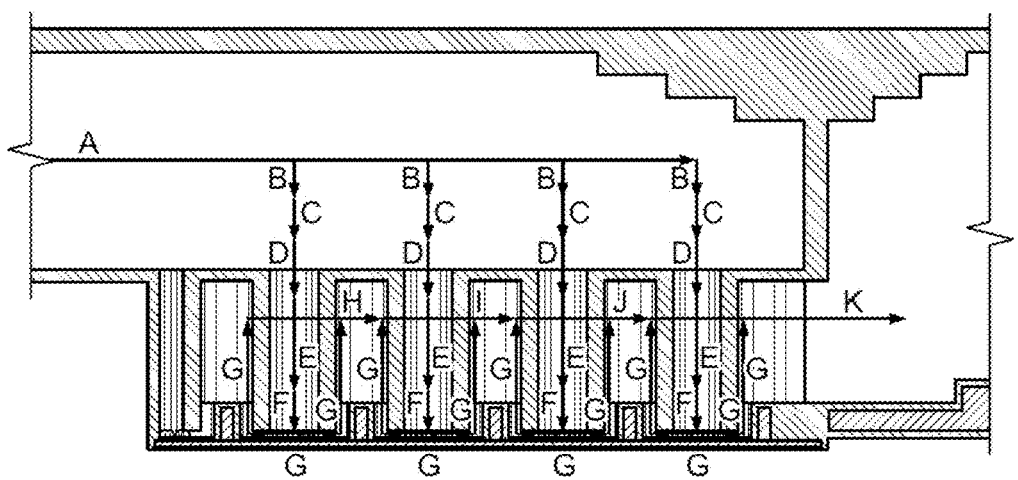
FIG. 23 provides a cut view of the device of FIGS. 21 to 22B showing a schematic illustration of fluid flow from the inlet through the jets, to the impact region, through the post jetting channels, to the exit channel and then to the outlet.

FIG. 23 provides a cut view of the device of FIGS. 21 to 22B showing a schematic illustration of fluid flow from the inlet through the jets, to the impact region, through the post jetting channels, to the exit channel and then to the outlet. The coloring of the fluid flow line indicates how the liquid (e.g. water) is heating up as it flows from left to right where blue represents cool liquid and yellow, orange, and brown represents warmer liquid.

Figure 24A:
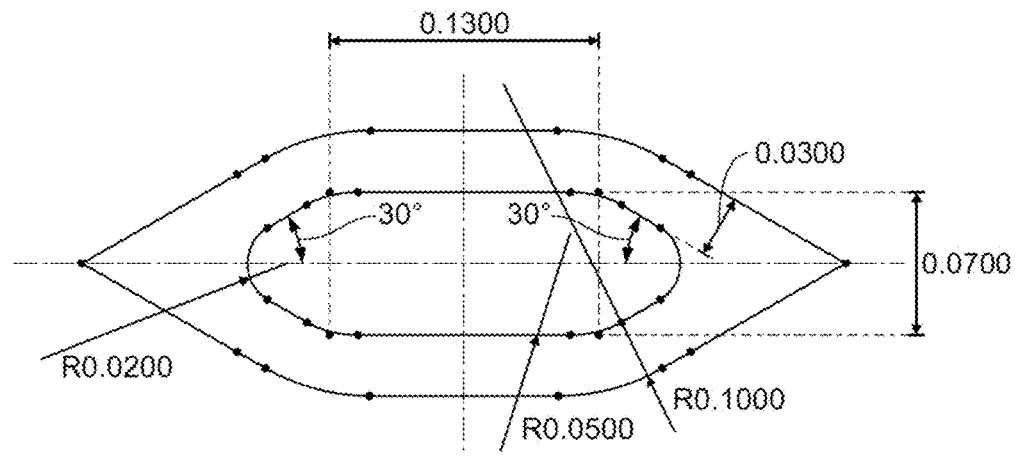
FIG. 24A provides sample dimensions of a jetting orifice in millimeters while FIG. 24B provides sample dimensions for features surrounding the jetting orifice which is surrounded by a wall of structural material of the jet having leading and trailing surfaces with sharp blade-like configurations.
Figure 24B:
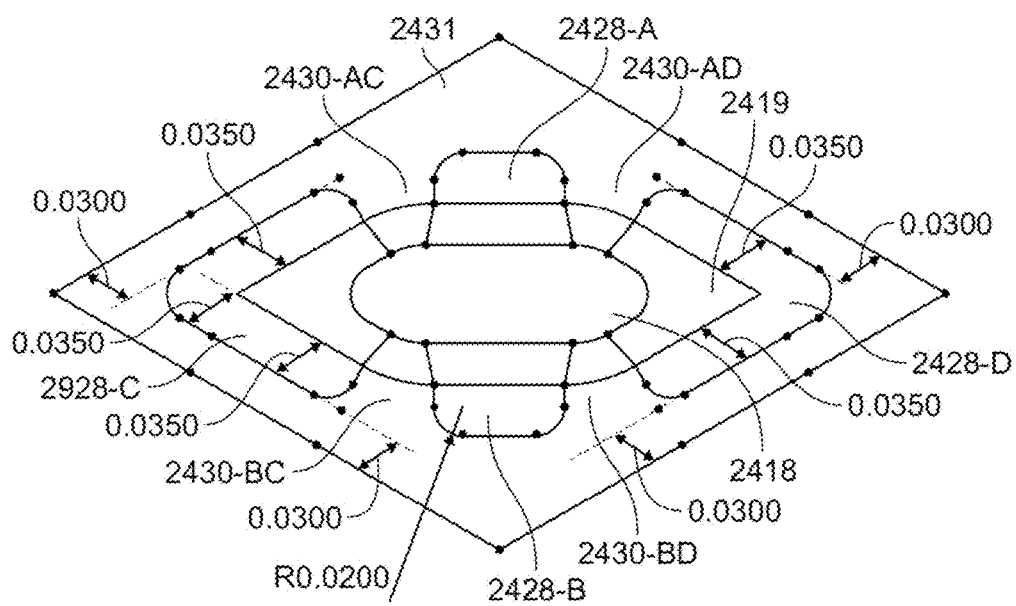
FIGS. 24C-24D provide perspective sectioned views of a single example jet and part of a surrounding well wall at two different cut heights so as to further illustrate, the relationship between fin/jet side walls, fin bridging elements, and well side walls.
FIGS. 24E-24F provide a top view and a perspective view, respectively, of a single well region which is cut vertically below the level of the jet side walls so that the entire jetting surface region, bridging elements, and well walls can be seen.
FIGS. 24G-24H, respectively, provide a perspective view of a single integrated jet/fin element (similar to those of FIGS. 24A-24F) from a heat transfer region, that contacts or is in proximity to a heat source, to an inlet portion of the jet as well as a vertically extending cut view through such an integrated jet/fin structure so that at least a portion of the bridge elements can be seen.
FIGS. 24I and 24J provide perspective views of two adjacent integrated jet/fins and wells to illustrate how in at least one embodiment such elements may be positioned relative to each other.

FIG. 24A provides sample dimensions of a jetting orifice in millimeters while FIG. 24B provides sample dimensions for features surrounding the jetting orifice 2418 (e.g. jet side walls, bridging elements that connect the lower portion of the jet to well side walls, channels for moving fluid from the jetting region along the jet side walls and well side walls to a primary exit channel located above the jetting well). The jet orifice is surrounded by a wall of structural material 2419 forming the jet side walls wherein the jet side walls, in this example, provide leading and trailing surfaces with sharp blade-like configurations. As the jet side walls enter a jetting well, the jet side walls, in this example, are spaced from well side walls by four gaps or channels 2428-A to 2428-D that define vertically extending post-jetting channels that feed the heat transfer fluid (e.g. water) from the impact area or floor of the jetting well to a primary exit channel. The four post-jetting channels are in turn spaced from one another by four regions of structural material or solid conductive material bridges that connect the jet side wall material 2419 to well side wall material 2431. These bridges provide a direct metal conductive path between the heat source and the jet side walls thus providing the jetting structures with direct heat conductive fin functionality. In such embodiments, the bridges may extend a portion of the jet side walls completely to the jet impact floor while in other embodiments, the bridges may make a solid conductive connection between the jet sidewalls and the floor via the well side walls or via a somewhat laterally offset path (i.e. a path between a theoretical vertical jet side wall that extended completely to the floor and a theoretical vertical well wall that extended to the floor in absence of the bridge material). In such embodiments, the jetting structure may be said to have fin functionality or alternatively, these fin structures may be said to have embedded jets or jet functionality. Such systems may be thought of as having a higher level of integration than those systems that have jets that do not provide fin functionality or those systems that have fins but without jetting functionality.

Figure 24C:
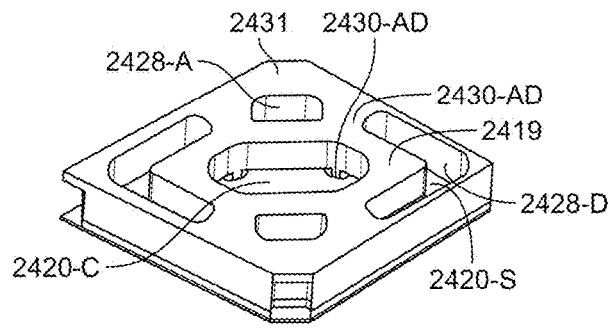
Figure 24D:
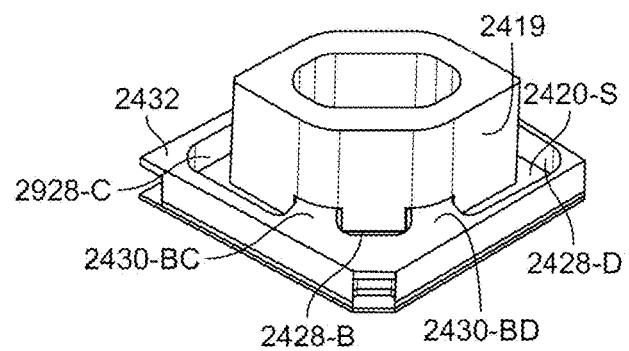

FIGS. 24C and 24D provide perspective sectioned views of a single example jet and part of a surrounding well wall at two different cut heights so as to further illustrate, the relationship between fin/jet side walls, fin bridging elements, and well side walls. As shown in FIG. 24C bridging elements 2430-AD and 2430-AC can be seen (only 2430-AD is labeled) at the lower end of the jet wall material 2419 and between the jet wall material 2419 and the well sidewall material 2431. In practice, these three differently labeled elements may range from physically distinct materials or they may all be made from a single common material. This bridging material provides a solid conductive direct bridge from the jet wall to the jetting floor near the central region of the jetting floor 2420-C or the side region of the jetting floor 2420-S and semi-directly from the jet wall to the jetting floor near side region 2420-S via the well side walls. FIG. 24D provides a perspective sectioned view with an extended portion of the jet side wall material 2419 shown extending above an upper surface 2432 of the well side wall material into a primary exit channel region. FIG. 24D also labels additional bridging elements and post jetting channels with labels similar to those used in FIG. 24B.

Figure 24E:
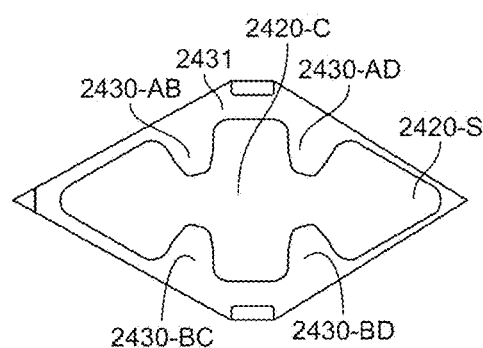
Figure 24F:
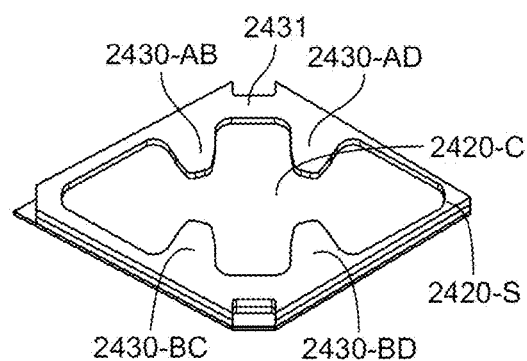

FIGS. 24E and 24F provide a top view and a perspective view, respectively, of a single well region which is cut vertically below the level of the jet side walls so that the entire jetting surface region; bridging elements 2430-AD, 2430-AB, 2430-BC, and 2430-BD; and well walls can be seen.

FIGS. 24G and 24H, respectively, provide a perspective view of a single integrated jet/fin element (similar to those of FIGS. 24A-24F) from a heat transfer region, that contacts or is in proximity to a heat source, to an inlet portion of the jet as well as a vertically extending cut view through such an integrated jet/fin structure so that at least a portion of the bridge elements can be seen. FIG. 24H also shows regions 2440 which represent volumes of solid conductive material that may be formed of a different material than that which forms the surface of the floor 2420. In embodiments where different materials may be used, floor material may be selected based on a desire to optimize durability of the floor material and thermal conductivity (e.g. Ni—Co, Pd, or Rh) or while filler material 2440 may be selected with a larger emphasis on thermal conductivity (e.g. Cu) to improve overall heat transfer.

Figure 24I:
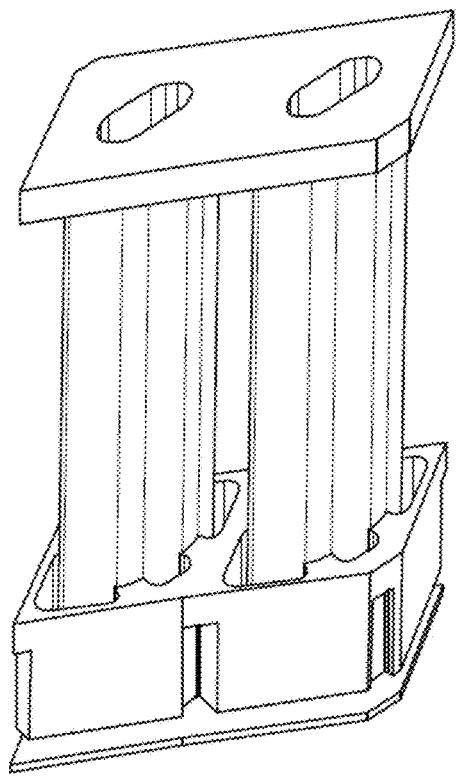
Figure 24J:
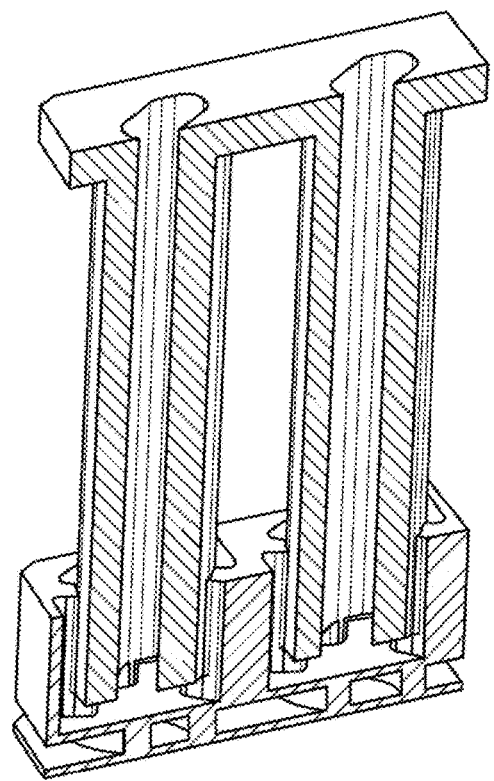

FIGS. 24I and 24J are similar to FIGS. 24G and 24H with the exception that instead of showing views of a single integrated jet/fin and well, they show two adjacent integrated jet/fins and wells to illustrate how in at least one embodiment such elements may be positioned relative to each other.

In other embodiments, variations of the configurations shown in FIG. 24A-24J may exist. Such variations may include different dimensional configurations, different configurations of bridging elements, bridging element patterning not extending the entire length of the outer surfaces of a jet element, different numbers of bridging elements and post jet channels existing per jet, different orientations of elements, different spacing or positions for adjacent jets, different patterns for incorporating different materials, and the like.

Figure 25:
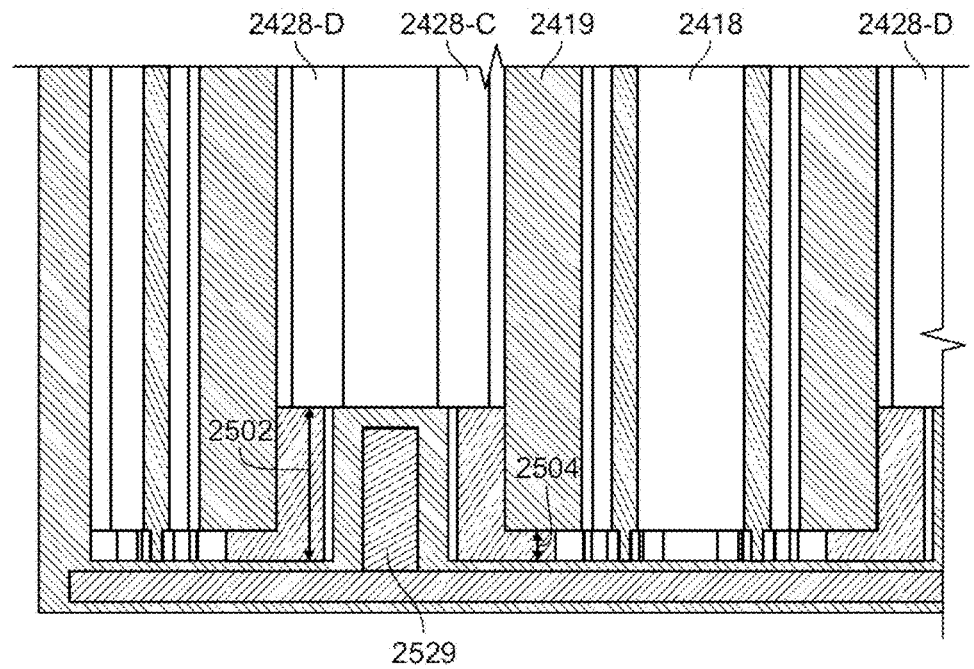
FIG. 25 provides a cut view of a jetting channel surrounded by a jet wall and fluid return channels along with a height of a solid fin, or well wall, whose upper surface forms the bottom of the exit channel.

FIG. 25 provides a cut view of a jetting channel 2418 surrounded by the jet wall 2419 and fluid return channels 2428-C and 2428-D along with a height 2502, 0.080 mm to 0.300 mm, of a solid fin 2529, or well wall, whose upper surface forms the bottom of the exit channel. An example dimensional range for height 2502 is also given. A height 2504, 0.030 mm to 0.100 mm, of the impact region or jetting floor is also shown with an example range of dimensions. In other embodiments other dimensional ranges may be possible.

Figure 26:
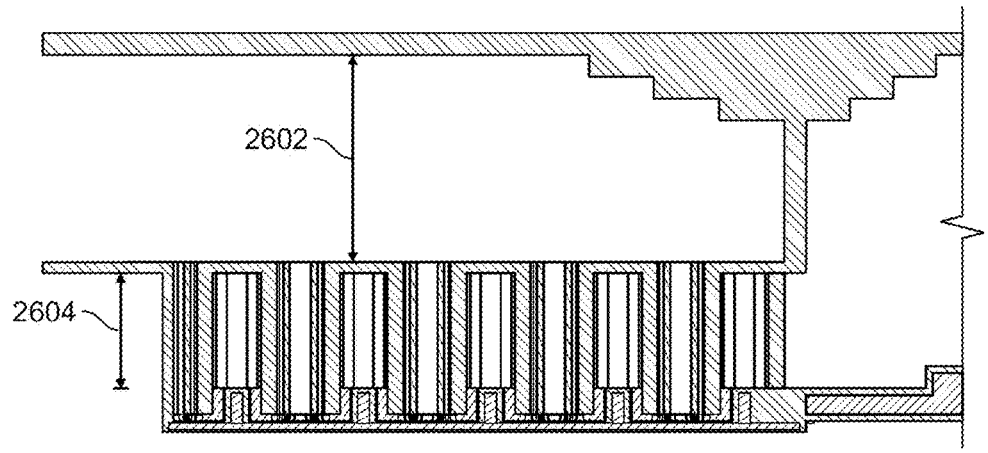
FIG. 26 provides a cut view of the cold plate of FIGS. 21-25 (with inlet and outlet headers and the heat transfer array) with sample dimensions for the inlet passage (or header) and the exist passage (or header) heights.

FIG. 26 provides a cut view of the cold plate of FIGS. 21-25 (with inlet and outlet headers and the heat transfer array) with sample dimensions for the inlet passage (or header) and the exist passage (or header) heights. In some embodiments the dimensions of inlet header height 2602, 0.3 mm or more, and exit manifold height 2604, 0.3 mm or more, are set to be at least 3× the hydraulic diameter of the jet as defined by the inner contour of the jet of FIG. 24A. Hydraulic diameter is defined by the definition $Dh=4*A/P$, where A=cross section area of flow channel, P=perimeter length of flow channel. In embodiments where the header or manifold has a large enough flow path, a reduced need for differential tailoring of jet dimensions and jet spacing may exist to get uniform heat removal. Such differential treatment may still be required based on semiconductor hot spot location or level of hot spot heat generation. In some embodiments outlet location may be varied from the right side configuration depicted in the present embodiment based on the particular heat removal requirements of particular application. For example, the outlet may surround the inlet, multiple smaller outlets may be used in combination with a single inlet, or a single outlet may be used in combination with multiple inlets.

Figure 27:
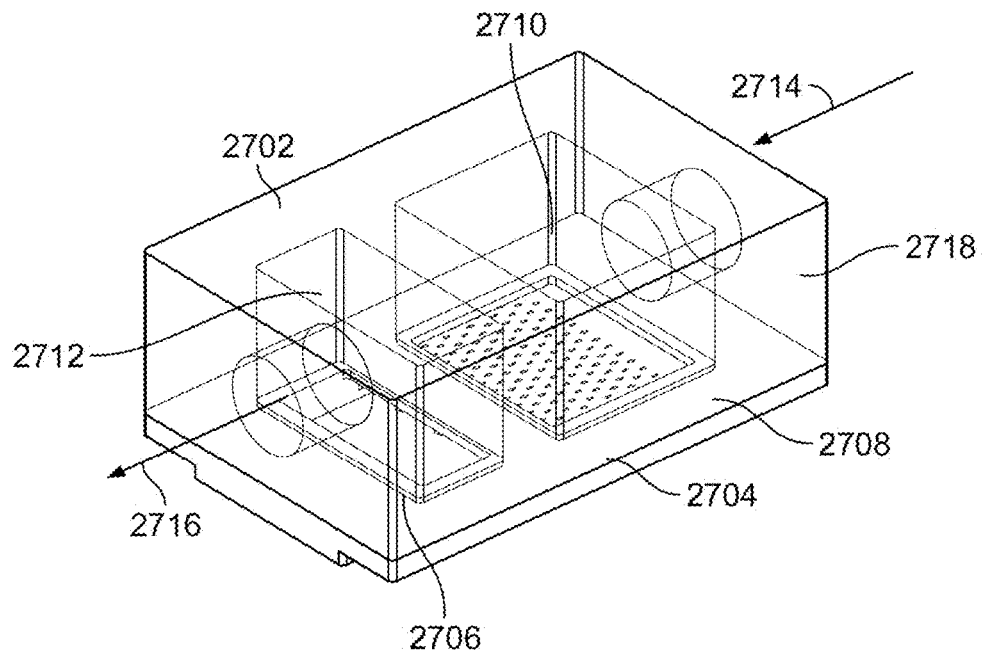
FIG. 27 provides a perspective view of another cold plate embodiment having an inlet and outlet header structure and a heat transfer array where the two can be independently formed and joined, bonded or otherwise mated at an array bonding surface.

FIG. 27 provides a perspective view of another cold plate embodiment having an inlet and outlet header structure 2702 with walls 2718, a fluid inlet 2714, and a fluid outlet 2716 and a heat transfer array 2704 where the two can be independently formed and joined, bonded or otherwise mated at an array bonding surface 2708. The inlet chamber 2710 and outlet chamber 2712 of the header and/or the array may include a lip 2706 near a bonding material location such that the lip can help ensure that any bonding material (e.g. solder) does not enter the chambers. In some embodiments one or both bonding surfaces of the array and header may be coated with a bonding material (e.g. solder, such as AuSn eutectic or SnAg eutectic, high temperature epoxy, or the like) prior to being brought into contact. Upon contact or upon other activation (e.g. heating, ultrasonic vibration, pressure, light exposure (e.g. if the header is transparent or the like)) bonding may be made to occur. In other embodiments, bonding may occur without use of an intermediate bonding agent such as by laser welding, ultrasonic bonding, diffusion bonding, o-ring sealing with clamping, or like). In some embodiments selected portions of surfaces of one or both the header and the array may be treated (e.g. roughened, smoothed, chemically activated, applied with surface coatings, or the like) to enhance bonding or wetting of the surface or surfaces in certain locations. In other embodiments such treatments may be used to discourage bonding or flow of a bonding material. For example the lip area may be configured, conditioned, coated, or otherwise treated to reduce flow of bonding material so as to keep bonding material from entering the channels. As another example, selected portions of a surface of a heat transfer array that is formed from a material that is not particularly friendly to solder wetting (e.g. NiCo, TiW) may receive a coating of a more wettable material (e.g. Pd) onto which solder may be placed and bonding may occur while other portions of the micro-array (e.g. the lip or area around the lip may forego such coating).

In some embodiments, not shown, instead of a single elevated lip around the channel openings of the micro array, multiple concentric lips, or lips of other configurations may be may formed on the micro-array surface and possibly one or more corresponding notches formed in the bonding surface of the header or manifold such that upon mounting and flowing of a bonding agent some overlap or interlacing of surface features occurs. In some embodiments the micro-array may be made to have recesses while the header may be made to have or more protrusions. In some embodiments, the regions between all successive lips may be filled with bonding or sealing material, while in other embodiments only regions between a portion of the lips may receive bonding or sealing material. In some embodiments the header may be formed in any of a variety of ways (e.g. by molding or by CNC machining) from aluminum, copper or any other suitable material. The heat transfer array or portions of the array may also be formed in a number of different manners such as by electrochemical multi-material, multi-layer methods as set forth herein. The array may be formed from a plurality of multi-material layers (including one or more structural materials on each layer and one or more sacrificial materials on each layer where the structural or sacrificial materials may be different on different layers. Structural materials may include, for example, nickel cobalt for strength, rhodium for wear resistance, copper for enhanced heat flow, palladium for strength or enhanced wettability, TiW or epoxy or other material for use as a solder mask, a solder flux, or other bonding material or bonding promoter deposited as part of the layer formation process. Seed layers and dielectric materials (e.g. plastics or ceramics) may also be incorporated into the formation process as desired.

Figure 28:
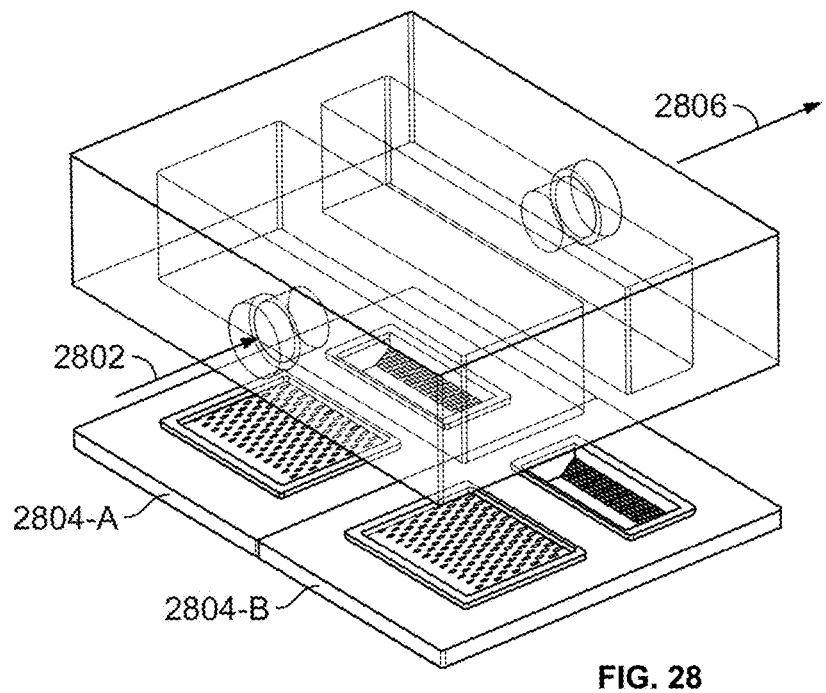
FIG. 28 provides an image of a structure including a single inlet providing manifold distribution of cooling fluid to two heat transfer arrays and outlets of the two heat transfer arrays being merged via a manifold into a single outlet.

FIG. 28 provides an image of a structure including a single inlet 2802 providing manifold distribution of cooling fluid to two heat transfer arrays 2804-A and 2804-B and outlets of the two heat transfer arrays being merged via a manifold into a single outlet 2806.

Figure 29:
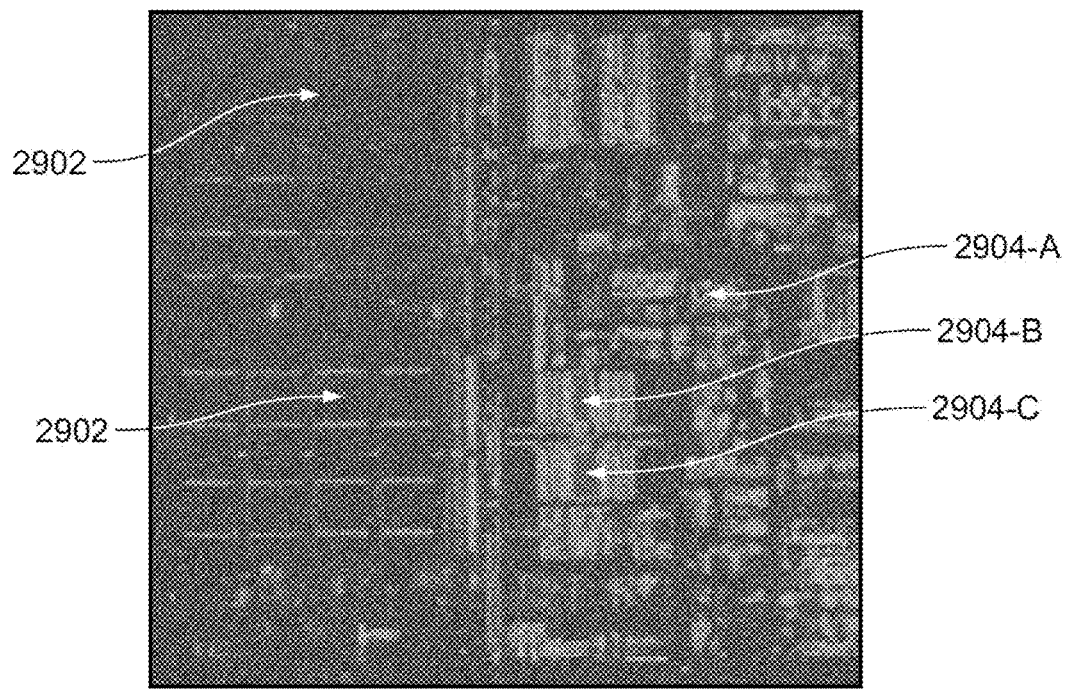
FIG. 29 provides an image of the temperature/heat profile across the X&Y dimensions of an example semiconductor device while in use.

FIG. 29 provides an image of the temperature/heat profile across the X&Y dimensions of an example semiconductor device while in use, showing relatively cool areas 2902 and hot spots 2904-A, 2904-B, and 2904-C where heat transfer arrays might be most useful. As shown, the device is not uniformly heated but has a heterogeneous temperature profile. Heat distribution across the device may be improved by use of a conductive heat spreader but heat removal from certain areas of the device may be better handled by use of one or more heat transfer arrays of as set forth herein. Of course if the heat transfer array is the same size as the semiconductor chip or larger it may simply cover the whole chip; however, if a single microjet array is smaller than the chip then selective location of the heat transfer array or use of multiple arrays may be most beneficial.

Figure 30A:
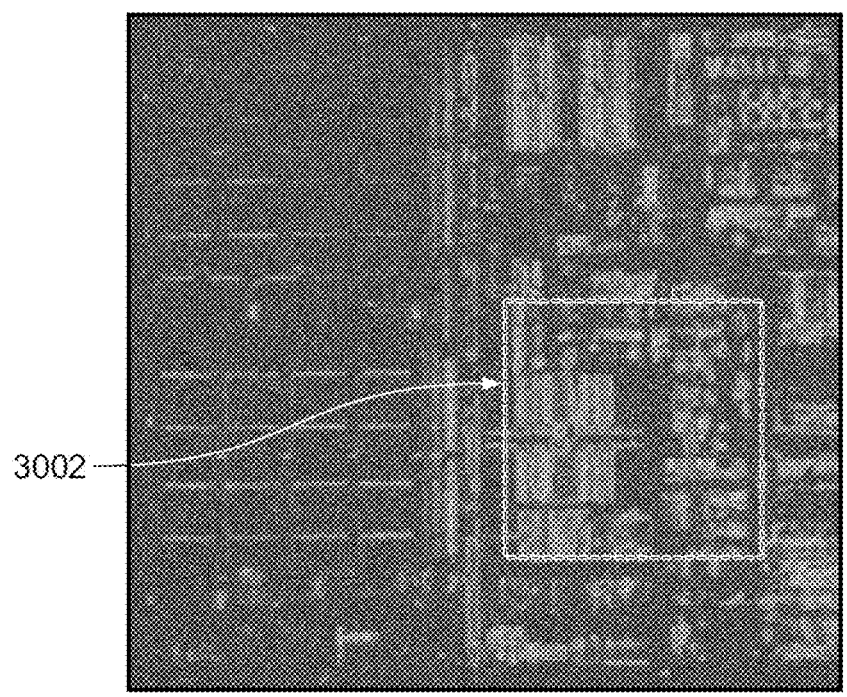
FIG. 30A provides an outline of an example heat transfer array position for cooling a chip of the type having a heat profile as shown in FIG. 29.
Figure 30B:
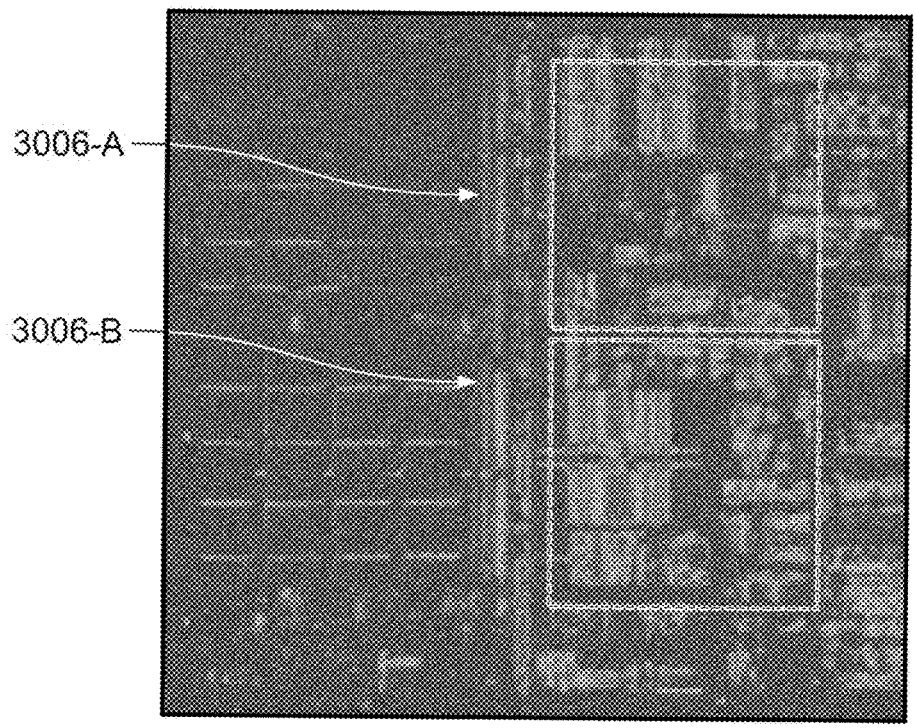
FIGS. 30B-30C illustrate possible joined (FIG. 30B) and separated (FIG. 30C) locations if two heat transfer arrays will be used either with separate headers or with a single generic or custom manifold.
Figure 30C:
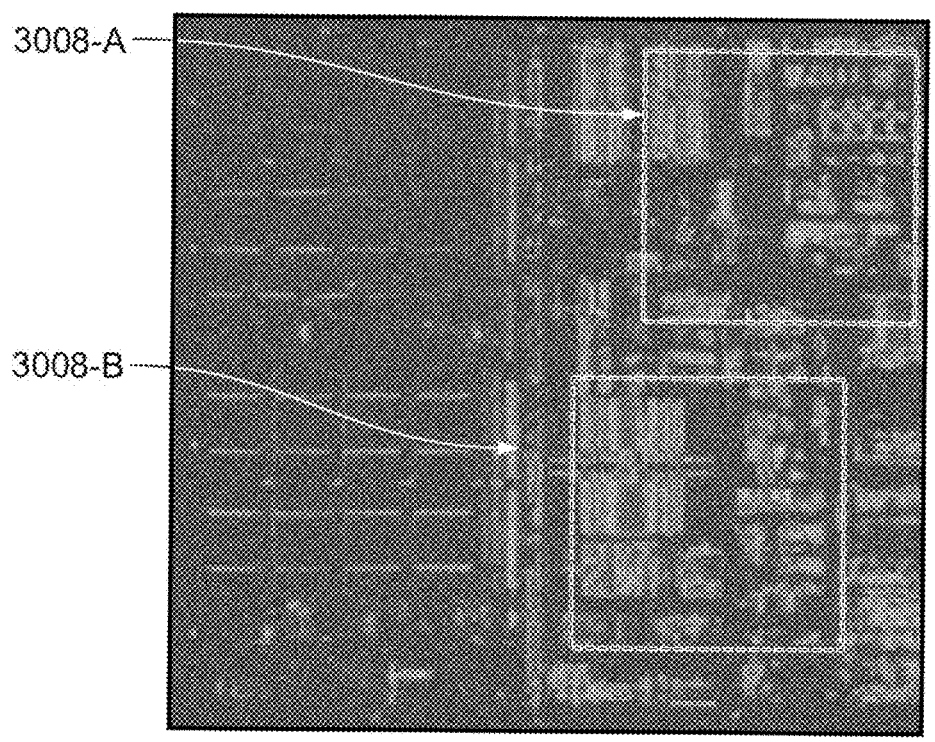

FIG. 30A provides an outline of an example heat transfer array position 3002 for cooling a chip of the type having a heat profile as shown in FIG. 29. FIGS. 30B and 30C illustrate possible joined heat transfer arrays at locations 3006-A and 3006-B (FIG. 30B) and separated heat transfer arrays at locations 3008-A and 3008-B (FIG. 30C). The two heat transfer arrays may be used either with separate headers or with a single generic or custom manifold. In other embodiments, different numbers of heat transfer arrays, heat transfer array configurations, header numbers and configurations, and manifold numbers and configurations can be used as appropriate to get the temperature profile of device to be held in an acceptable temperature range.

Figure 31A:
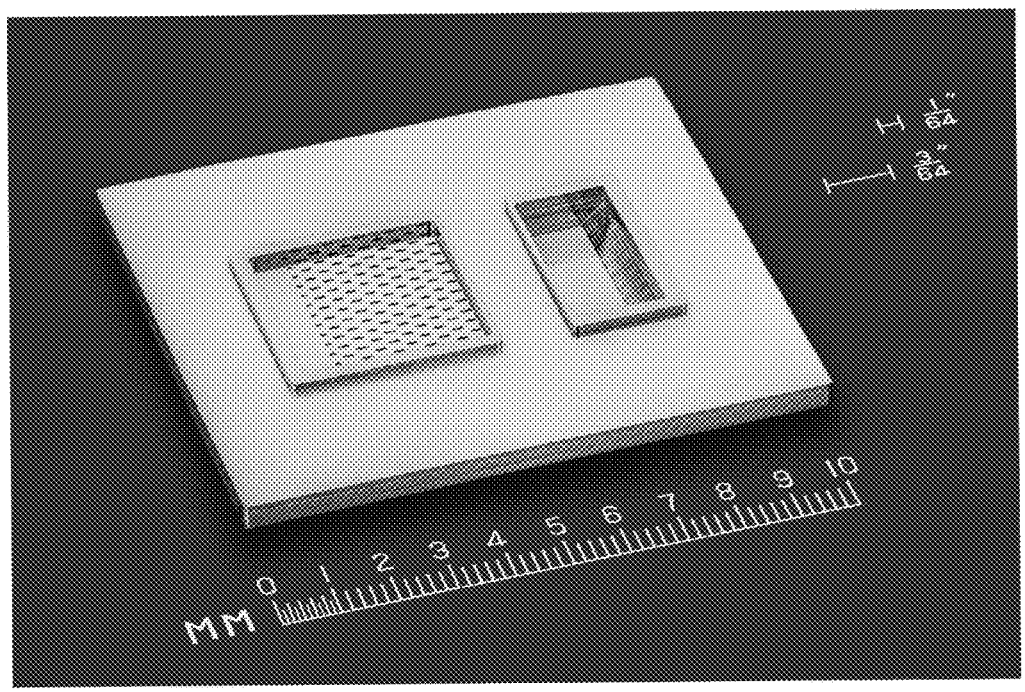
FIG. 31A provides an image of actual heat transfer array of the type set forth in FIGS. 21-27 as fabricated using Microfabrica's Mica Freeform fabrication process while FIG. 31B provides a close up view of the jet entry ports as seen from the array inlet.
Figure 31B:
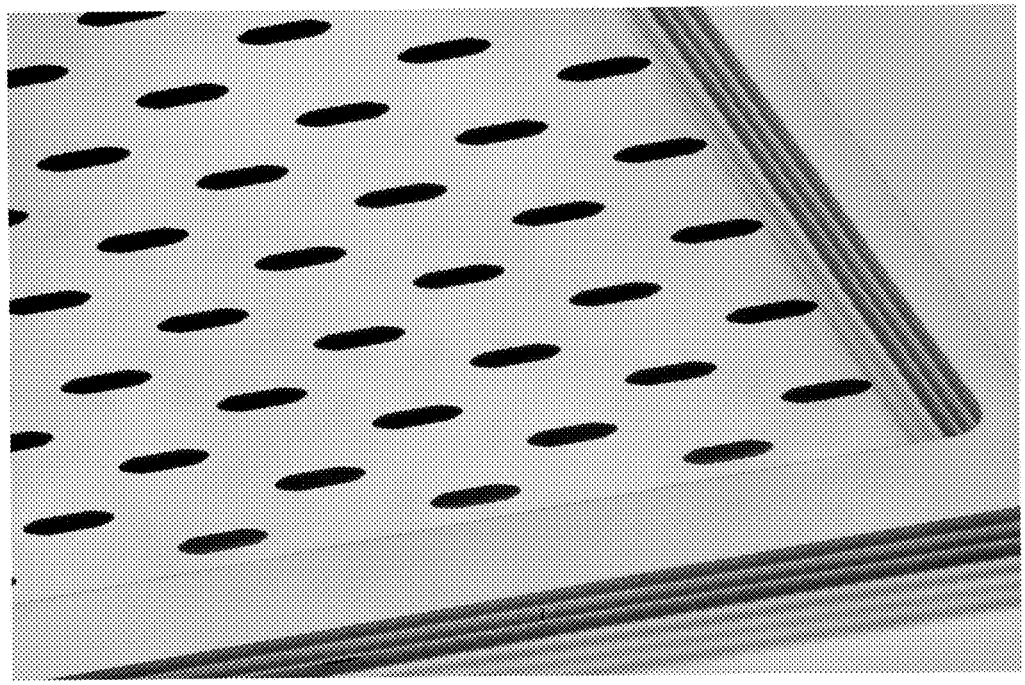

FIG. 31A provides an image of actual heat transfer array of the type set forth in FIGS. 21-27 as fabricated using Microfabrica's Mica Freeform fabrication process while FIG. 31B depicts a close up view of the jet entry ports as seen from the array inlet.

Figure 32A:
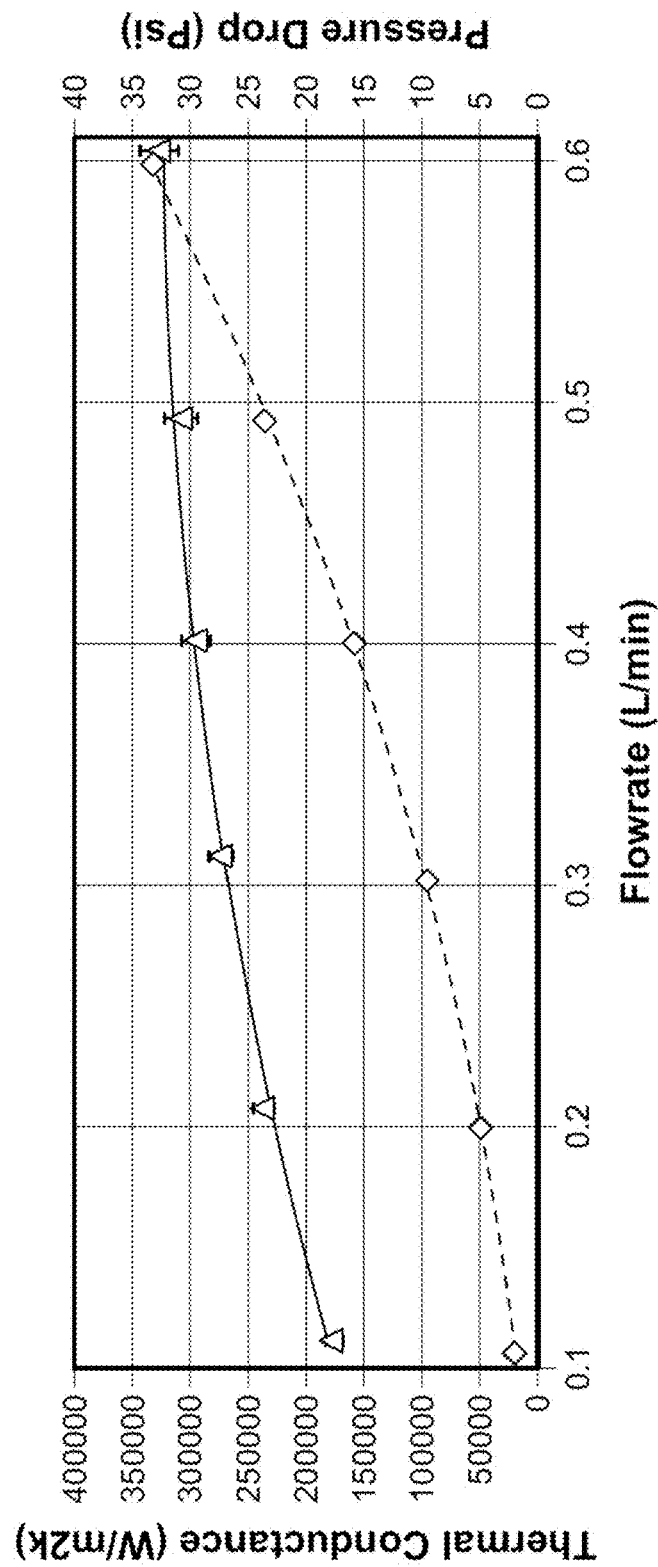
FIG. 32A provides a plot of experimental data obtained from testing a device like that of FIGS. 31A and 31B.
Figure 32B:
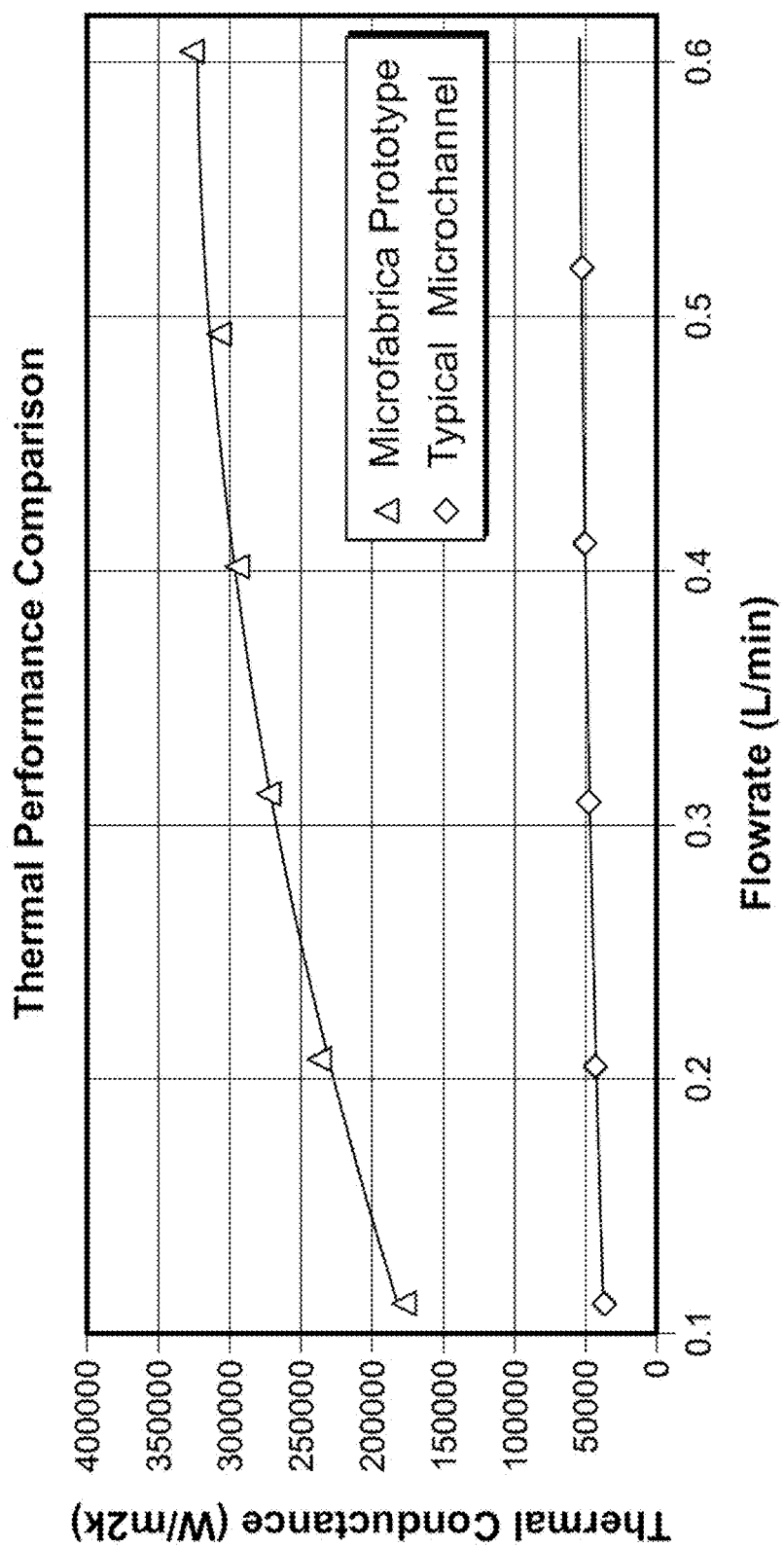
FIG. 32B provides a plot comparing thermal performance of the device of FIGS. 31A and 31B against a typical microchannel device wherein the Y-axis provides the thermal conductance in $W/M^2K$ while the X-axis set forth the flowrate in L/min.

FIG. 32A depicts a plot of experimental data obtained from testing a device like that of FIGS. 31A and 31B. This plot depicts (1) the thermal conductance of the heat transfer array in W/M²K versus water flow rate (L/min) via the top line (with triangles) and pressure drop (PSI) versus flowrate (L/min) via the lower line (with diamonds). In these experiments the surface temperature of the semiconductor device was held at 65° C. with a water inlet temperature of 20° C. FIG. 32B provides a plot comparing thermal performance of the device of FIGS. 31A and 31B against a typical microchannel device wherein the Y-axis provides the thermal conductance in W/M²K while the X-axis set forth the flowrate in L/min. The plot indicates that the testing of a device shown in FIGS. 31A and 31B yielded a 6× improvement (line with triangles) in thermal conductance compared to a typical microchannel device at 0.5 liters per minute (LPM) with less than a 50% increase in pumping power compared to a typical microchannel device (line with diamonds).

In some embodiments, devices (e.g. microjet and microchannel portions of the cold plate, i.e. the heat transfer array portion) may be fabricated by an additive layer process such as a multi-layer, multi-material process as set forth herein. Such devices may undergo post processing treatment or undergo one or more breaks in the middle of layer processing to modify the structural or surface configuration of the structures being formed or to apply additional processing steps that might not be effectively implementable after layer formation is complete (e.g. use of a high pressure abrasive particle flow to smooth sharp corners in fluid channels, application of coatings or surface treatments while access to such surfaces is not blocked by material forming subsequent layers).

Some alternative embodiments may be created by selecting features associated with one or more other embodiments or aspects and combining them with one or more features from one or more other embodiments or aspects.

Features of some embodiments include: (1) heat transfer arrays with multilevel microchannels that are integrated with microjet arrays where the two elements are connected via two levels to maximize heat transfer capability and efficiency; (2) corrosion and erosion may be minimized by using high strength electrodepositable materials (e.g. NiCo, palladium, rhodium, or the like in selected areas); (3) corrosion and erosion may be minimized or at least effectively managed by local thickening at impingement areas; (4) dimensions of features in a heat transfer array may be uniquely optimized for fluid flow, for example, slot jet dimensions and fin dimensions may vary from jet to jet and from inlet to outlet to optimize or at least bring heat transfer to a desired level of efficiency or effectiveness; (5) heat transfer arrays and cold plates may be optimized to the unique requirements of specific heat sources by changing dimensions and direction of fluid flow, locations of inlets and outlets, and the like.

As noted previously, in some embodiments the bottom of each jet at one or more locations, e.g. four locations, connect structurally to the surface on to which jetting occurs. This means that not only do the jets remove heat from the floor onto which jetting occurs via a flow of jetted fluid but also via heat conduction upward from the floor through the metal of the jet. This means that the jet in addition to functioning as a jet also functions as a fin. Said another way, in these embodiments, these fin structures are hollow and in addition to providing fin functionality they also form jetting structures so as to provided overall improved heat removal and more effective use of volumetric space. These jets/fins also provide further heat removal via conducted heat by the lower portions of the jets/fins (the portions below the top of the walls of the jetting wells) releasing conducted heat to the incoming jet stream via the interior surface of the jet structure and to the exiting jet stream via the external surface of the jetting/fin structure. The upper surfaces of the jet releases further conducted heat via the flow of exhausted jetted fluid via the fluid flowing through the fluid exit path, channel, level or layer. Similarly the fins located between the jets that define the jetting wells also conduct heat away from the heat source via contact with exiting jetted fluid along their side walls and along their upper surfaces as well as along any supporting columns or jet side walls that extend upward therefrom. In some embodiments, like those shown, the fins (that also function as jets) are elongated to help with fluid flow by reducing flow resistance while at the same time providing more surface area for transferring heat from the sidewalls to the incoming and exiting fluid.

In some alternative embodiments more than one inlet may be used, more than one outlet may be used, more than a single inlet level (e.g. in the Z-direction, i.e. direction parallel to an axis of layer stacking) and outlet level may be used.

In some embodiments the trapped fluid flow through a whole thermal management system may involve fluid transport from a primary heat pick up location, i.e. jetting impingement surface and primary heat transfer region, to an exit channel of a header or manifold, to a conventional heat exchanger (e.g. that removes heat by transferring to another fluid such as air or to a larger sink), to an optional filter (e.g. with a pore size of 1 Os of microns, to micron level. or finer), to a pump, to an optional filter (e.g. micron level filter or finer), to an inlet of a header or manifold and back to the primary heat transfer location.

In some embodiments, a hybrid microjet and microchannel heat transfer array is provided to take advantage of the high convection performance of the microjet and the high surface area of a microchannel. In some embodiments, the microjet may include fin functionality. In some embodiments cold plates are miniaturized by using a micro additive manufacturing process (such as those described herein) alone or in combination with traditional manufacturing to produce micro heat transfer arrays in high volume. In some embodiments a multilayer microchannel with microjets connecting the two layers creates 3-D flow behavior that generates high convection coefficients and heat transfer at all surfaces. In some embodiments, high strength materials like NiCo may be used to minimize corrosion and the generation of particles that can jam the fluid system and cause failure of pumps or jets. In some embodiments, volumes with high fluid velocities or turbulent flow may be reinforced (with hard materials such as Rh) to minimize erosion of the surface over time. In some embodiments, composite material construction may be used to allow for optimizing strength, conductivity, and surface properties as needed.

Two Phase Heat Spreaders

Figure 33:
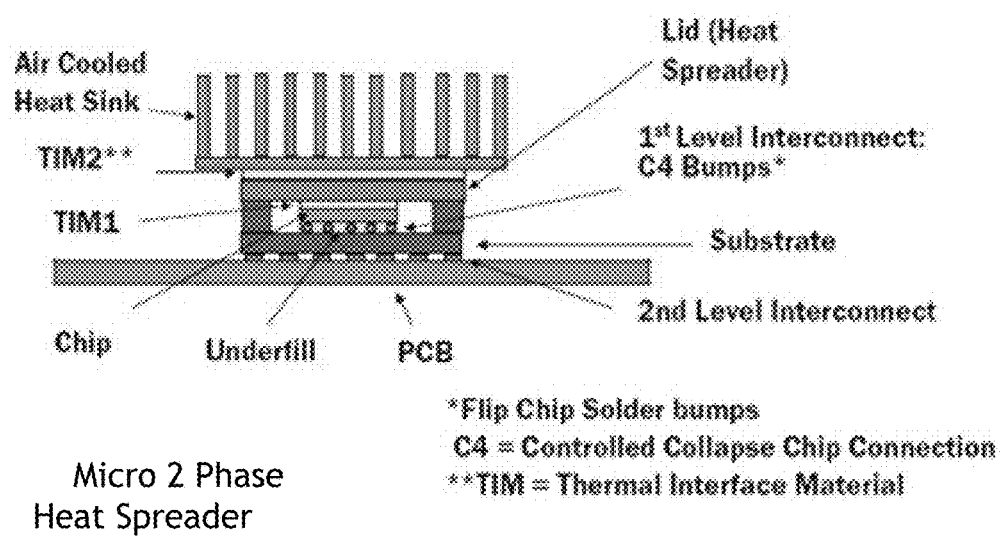
FIG. 33 provides a schematic illustration of a cooling system, according to an embodiment of the invention, that includes an air cooled heat sink functionally connected to a two-phase micro-heat spreader (e.g. a heat pipe or vapor chamber) that acts as a lid or cap above a chip to be cooled.

FIG. 33 provides a schematic illustration of a cooling system, according to an embodiment of the invention, that includes an air cooled heat sink functionally connected to a two-phase micro-heat spreader (e.g. a heat pipe or vapor chamber) that acts as a lid or cap above a chip to be cooled. In this method the two phase system may be directly integrated with the chip and use etching, deposition, or other texturing methods to create an optimized surface on the silicon for nucleation boiling and liquid return via capillary action. The method may incorporate strain relief to minimize thermal stress due to CTE mismatches. An etching process may be used to create a uniform textured surface on the silicon with features sizes of 30 microns or less. In this method, inverted wick structures, with wicking/fin elements, may be pressed against the die surface or possibly bonded to the die surface and texturing or porosity may be made part of the dies or it may be provided in the form of a third element that is located between the die and the wicking structure.

Figure 34:
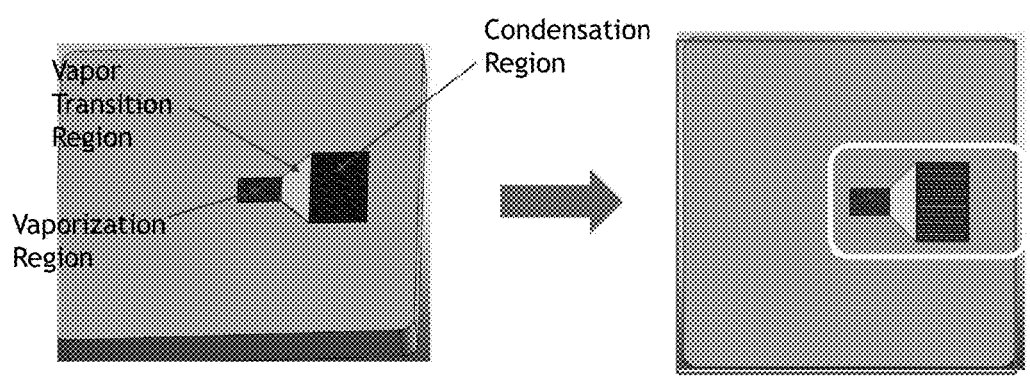
FIG. 34 depicts two views of an alternative heat spreader according to the embodiment of FIG. 33 where the heat spreader overlays a substrate containing a device to be cooled, where the left image depicts the heat spreader as having a vaporization region over the region to be cooled, which joins a condensation region via a vapor transition region where the vapor condensation region is located over a region that doesn't produce as much heat and where the right most image depicts a temperature map of the substrate relative to the elements of the heat spreader with hottest regions being shown being located below the vaporization region of the heat spreader and with progressively cooler regions ranging from being shown in progressively darkening colors.

FIG. 34 depicts two more views of an alternative heat spreader according to the first integration method where the heat spreader overlays a substrate containing a device to be cooled where the left image depicts the heat spreader as having a vaporization region over the region to be cooled, which joins a condensation region via a vapor transition region where the vapor condensation region is located over a region that doesn't produce as much heat and where the right most image depicts a temperature map of the substrate relative to the elements of the heat spreader with hottest regions being shown being located below the vaporization region of the heat spreader and with progressively cooler regions ranging from being shown in progressively darkening colors. In this example a micro heat pipe system/vapor chamber (device) is integrated into a traditional machined copper heat spreader to address a hot spot. In variations multiple micro heat pipe systems or vapor chambers may be used if necessary to address multiple hot spots. Thermal interface material may be used when attached to a chip. Single device size may be, for example, in the 4-7 mm length and width range but of course may be smaller or larger in other embodiments. This method may allow for conventional chip packaging processes so chip designers are not required to implement new processes.

Figure 35:
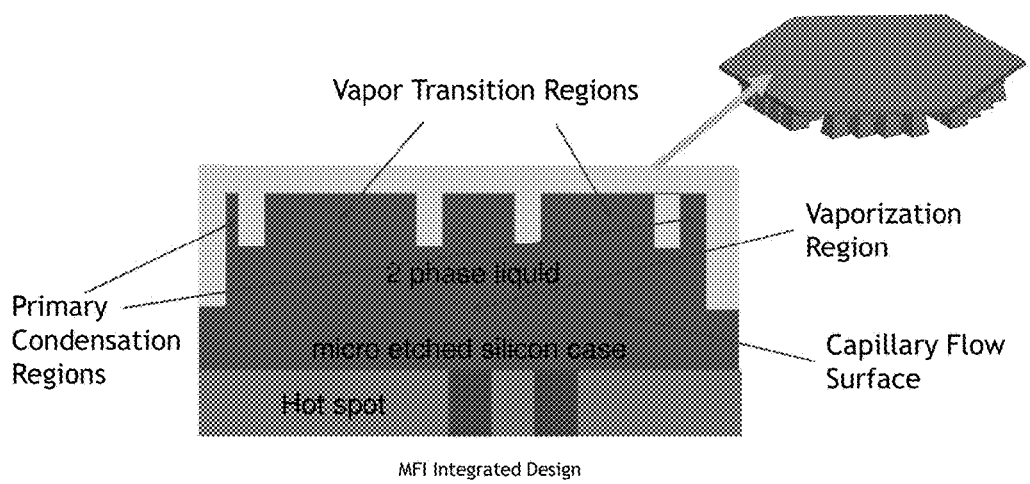
FIG. 35 depicts a schematic illustration of the a heat spreader, according to another embodiment, over a centrally located hot spot that is to be cooled where the heat spreader includes a base region having a surface of micro-etched silicon (which is part of the device to be cooled), side walls where condensation occurs, a central region where vaporization occurs and intermediate regions that move evaporated fluid to the sidewall regions for condensation and capillary flow back to the central evaporation region via the microetched surface acting as a capillary flow path.

FIG. 35 depicts a schematic illustration of the a heat spreader, according to another embodiment, over a centrally located hot spot to be cooled where the heat spreader includes a base region having a surface of micro-etched silicon (which is part of the device to be cooled), side walls where condensation occurs, a central region where vaporization occurs and intermediate regions that move evaporated fluid to the sidewall regions for condensation and capillary flow back to the central evaporation region via the microetched surface acting as a capillary flow path. In this second integration method the two-phase system connects directly to the chip such that the chip forms at least part of the floor of the heat spreader. The method uses etching, deposition, or other texturing methods to create an optimized surface on the silicon for nucleation boiling and liquid return via capillary action. The method may incorporate strain relief to minimize thermal stress due to CTE mismatches. Etching processes may be used to create a uniform texture surface on the silicon with features sizes of 30 microns or less. An inverted wick structure may be used with wicking/fin elements being pressed against the die surface or possibly bonded to the die surface. In some implementations, texturing or porosity is made part of the dies while in others, texturing or porosity may be supplied in the form of a third element that is located between the die and the wicking structure.

Figure 36:
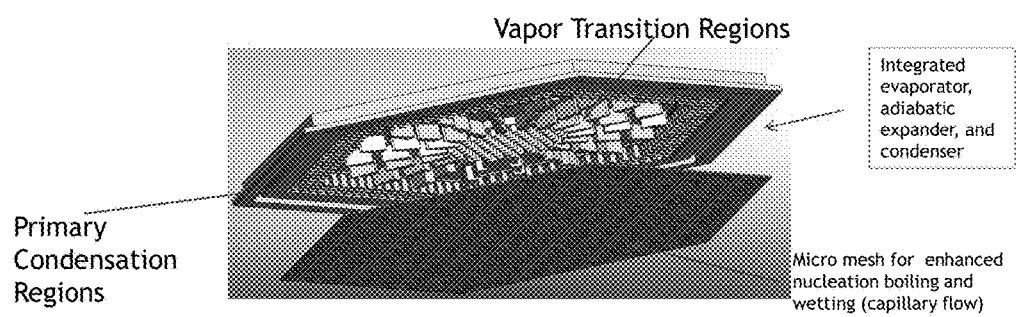
FIG. 36 provides a perspective view of the lid portion of a heat spreader of the embodiment of FIG. 35 including central evaporation features, transition features, condensation features, and a mesh which would be located on, or slightly above, a surface to be cooled to aid in capillary flow from the condensation region back to the evaporation region.

FIG. 36 provides a perspective view of the lid portion of a heat spreader of the embodiment of FIG. 35 (which is also applicable to the embodiment of FIG. 34 when formed with an appropriate geometry) including features in the central region for maintaining the heat transfer fluid in an evaporated state, transition features in the region between the edges and the central region for allowing relative free flow of vapor from the evaporation region to the condensation region, condensation features on the outer periphery of the device, and a mesh which may be located on, or slightly above, a surface to be cooled to aid in capillary flow from the condensation region back to the evaporation region and possibly to aid in providing boiling nucleation in desired regions while still allowing wicking of condensed heat transfer fluid back to the evaporation region.

In this example, full 3D optimization and feature tailoring may be used to create an integrated multiphase system with such optimization being implemented via multi-layer, multi-material electrochemical fabrication methods. The method may use micro mesh directly above micro etched silicon surface (backside of IC) to create biporous structures with 5-50 micron pore size (e.g. ~30 micron pore size) for wetting and capillary pumping and 40-80 micron (~60 micron pore size) for aid in boiling and vapor escape. To provide capillary flow paths the smaller pores must be laterally and vertically joined while the larger pores may or may not be laterally joined. In some variations, the biporous structure may include small pore sizes located through the thickness and lateral dimensions of the mesh with periodic larger pore interruptions at least in the central region as evaporation sites. In other variations the small porosity may be located on the lower part of the mesh while larger pores, potentially in combination with smaller pores, may be limited to the top portion of the mesh. In still other variations the smaller pores may be provided by roughening or etching into upper surface of the silicon substrate and the larger pores, possibly in combination with smaller pores may be formed as part of the mesh. In some variations different pore sizes may be used within different fin dimensions so that spacing between fins provide vapor flow paths while interior portions of fins provide liquid wicking paths. In some variations, below the mesh or other capillary flow enhancing features or texturing, a thin floor of metal or other conductive material may be formed as part of the device (e.g. when a surface of silicon wafer does not provide a surface of the heat spreader) while in other embodiments, as discussed above, the silicon wafer of the IC may provide the such a base. In some variations, barrier or adhesion materials may be formed on the IC before mounting, or on the surfaces of the vapor chamber itself, to protect the IC from adverse interactions with sacrificial or structural materials used in forming the vapor chamber.

In some embodiments, the vapor chamber may be formed directly on the IC while in other embodiments it may be formed separately and then bonded or otherwise mated (e.g. via an o-ring and clamping) with the IC either before or after release of sacrificial material.

Figure 37:
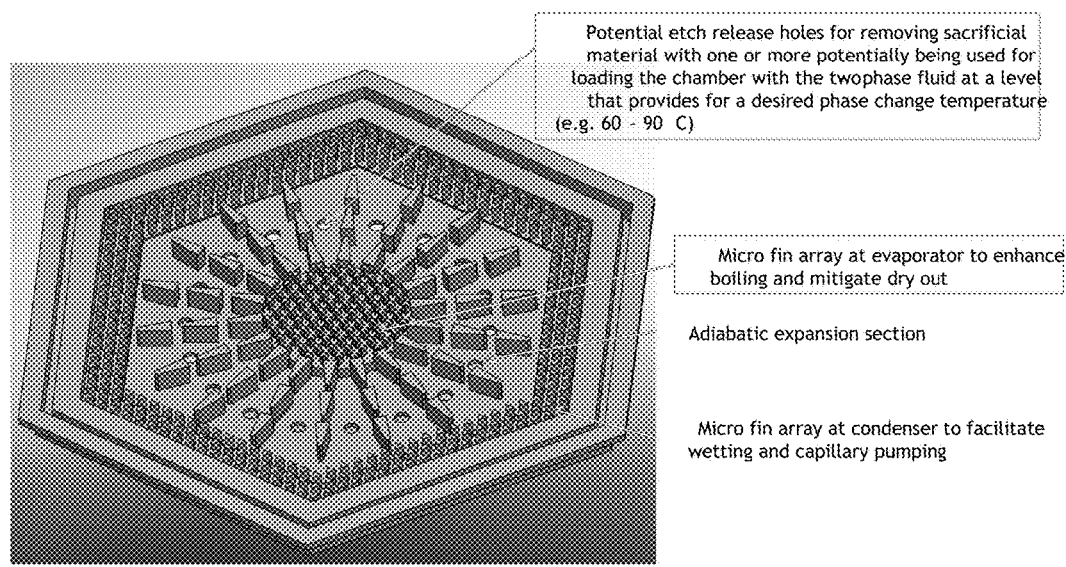
FIG. 37 provides a perspective view of the lid of FIG. 36 turned over to more clearly set forth the design features of this example.

FIG. 37 provides a perspective view of the lid of FIG. 36 turned over to more clearly set forth the design features of this example. In this illustration the micro-mesh at the base is not shown. In this example, the central region fins do not extend vertically to the IC or intermediate mesh. The large fins in the intermediate regions contact and/or bond to the mesh or IC. The outer most fins also contact or bond to the mesh or IC. The outermost flat regions and separating ring, respectively, from interior to exterior, provide a recessed location for the mesh, stress relieve expansion regions, and an IC mounting region.

In some alternative embodiments, the closely spaced, smaller size, central fins (relative to the more widely spaced larger intermediate region fins) may make direct contact to the silicon, mesh, or other lower surface of the heat spreader. In still other embodiments, the central regions fins may contact fins formed in the central region of the mesh. In some embodiments, the spacing of neighboring central fins may provide adequate porosity for capillary flow or alternatively for evaporation and flow of vapor particularly when the fins themselves include internal porosity that promotes capillary flow. In some embodiments, the central fins in combination with inter-fin porosity and intra-fin porosity and one or more capillary flow paths (e.g. continuous capillary paths through pores or channels in metal) from bottom to top of the heat spreader may provide for an enhanced vaporization region. In such variations vaporization and associated removal of heat may occur not only from the bottom of the heat spreader but also from the top of the heat spreader as well as from any vertically intermediate regions. In still other embodiments, return capillary flow paths (from the laterally perimeter region to the central region) may not only be provided along the bottom surface of the heat spreader but also along the top surface by providing analogous structures and porosities on top and bottom.

Figure 38:
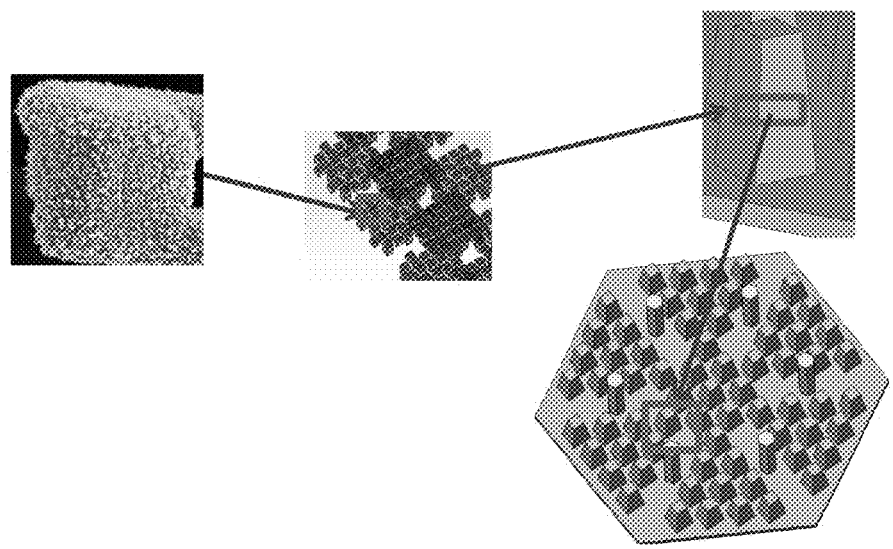

FIG. 38 provides four views with decreasing magnification to illustrate how fundamental micro-fabricated blocks with surface texture can be combined into groups as in the top middle illustration and built up further into structures of desired three-dimensional configuration (top right most illustration) and finally into a plurality of different three-dimensional structures that provide a desired overall pattern for providing capillary flow, evaporation, condensation, and the like.

The structures illustrated in the top left illustration of FIG. 38 may be formed by multi-layer, multi-material electrochemical fabrication methods as described herein and may be for example formed out of palladium as a structural material with copper used as a sacrificial material. They may be take the form of building block features having X, Y and Z dimensions in the range of 20-60 microns with designed gaps between adjacently formed or placed structures providing a desired porosity in building block clusters (e.g. for capillary flow or vapor flow). Such structures may be provided with micron and submicron surface texturing to provide enhanced surface area and associated improvements in capillary action. Such texturing may also be used to improve hydrophilicity and thus may be more useful in evaporation regions than in condensation regions. Different methods may be used to provide desired texturing such etching or via heat treatment such as by heat treating the blocks of palladium or clusters of building blocks in presence of copper, e.g. at 400-500° C. for 4-20 hours (e.g. 450° C. for 8 hours).

The middle illustration of FIG. 38 may be formed from organized clusters of the 20-60 micron building blocks as discussed above. Such clusters may be, e.g., in the 100-600 micron size scale range (e.g. 1-15 blocks on an edge with different spacings, orientations, or positions between neighboring blocks to established desired fixed or varying porosity). If specifically configured, a cluster may, e.g., form an individual wicking fin or other element with fixed or varying internal porosity and with some or all external and internal surfaces textured (e.g. in 100-600 micron scale range).

As shown in the bottom right illustration of FIG. 38, a structured array (e.g. a wicking array) can be formed from a plurality of organized wick "fins" with fins having similar or different configurations and with fins having a uniform spacing or existing in groups with a different spacing between groups and fin members of an individual group.

Such arrays may, for example, be in the 1000-5000 micron scale range. As with individual elements, such arrays may be formed as a complete unit from a multi-layer, multi-material electrochemical fabrication process or may be assembled from a plurality individual fins or fin groups.

In other variations the sizes of the individual structures, individual clusters (e.g. forming individual fins or other desired structural features), or arrays may be formed smaller or larger than the ranges sizes noted above. Porosities may range from less than 5 microns to any desired size, porosities may vary in size or configuration in any of X, Y, or Z dimensions (where X and Y represent lateral dimensions and Z represents a layer stacking direction.

Figure 39:
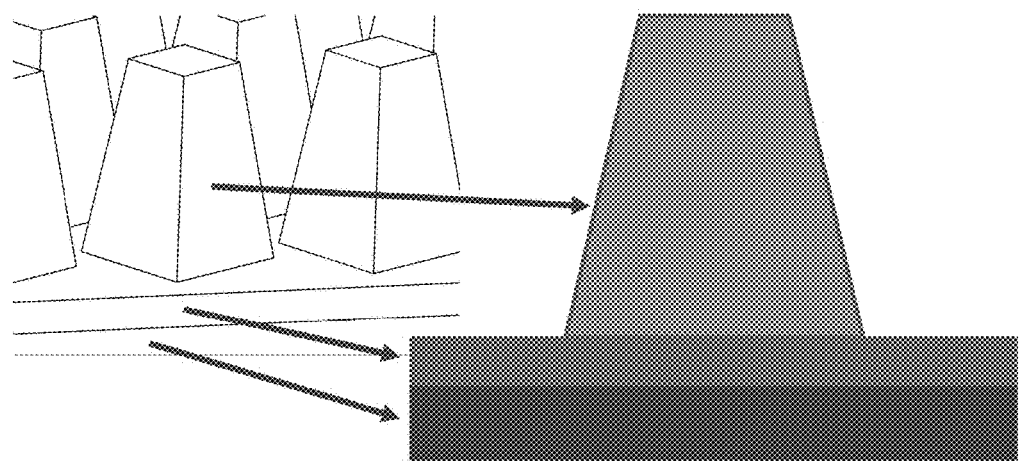
FIG. 39 provides another view of a unit fin wicking cell where the fin in this example is shown to have three distinct regions: (1) an upper most structured fin portion, (2) a middle high porosity wetting surface, and (3) a lower strength casing.

FIG. 39 provides another view of a unit fin wicking cell composed of a plurality of individual structures and possibly a plurality of individual clusters where the fin in this example is shown to have three distinct regions: (1) an upper most structured fin portion that may be formed from a plurality of individual structures and possibly a plurality of individual clusters, (2) a middle high porosity wetting structure that extends below, and joins, a plurality of unit fins, and (3) a lower high strength casing which may be porous or solid (e.g. if it is to form an external boundary region for the heat spreader). For example the upper most structured porous fin portion may have the following characteristics: (1) be 200-600 microns tall, (2) be 100-300 microns wide at the base, (3) have a pore size of 20-60 microns, and (4) have a 5-30 degree draft, and (5) have texturing. The high porosity wetting features may have the following characteristics: (1) they may be 30-150 micron thick; (2) they may be formed in a manner similar to clusters; (3) they may have texturing or may have texturing in some regions or may have varying porosity to tailor capillary action or other boiling or flow characteristics, (4) the characteristics may change laterally (within the planes of the layers) or vertically (perpendicular to the plane of the layers), and/or (5) they may have a pore size in the 10-50 micron range. Of course, in other embodiments, dimensions and draft angles may extend outside these ranges.

Figure 40:
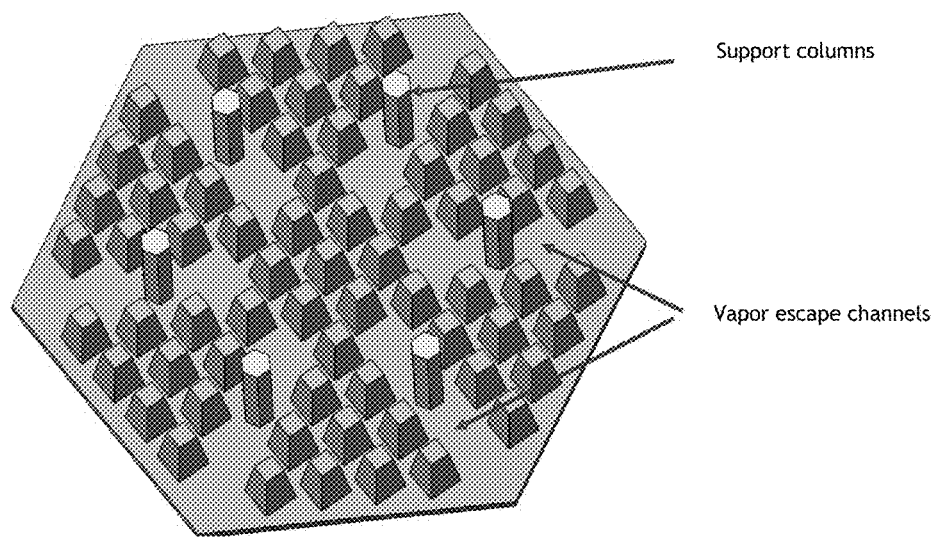
FIG. 40 illustrates the evaporator portion of the lid.

FIG. 40 illustrates the central evaporator portion of the lid. The support columns may provide a liquid return path to the bottom of the heat spreader and they may be solid or they may be hollow or porous. They may be formed using a similar process discussed for the fins. They may have the same or different porosity than fins. They may be used to support a ceiling of the heat spreader (i.e. vapor chamber). As noted previously, the fins of the evaporator portion may or may not contact the floor of the heat spreader, they may provide for wicking and enhanced evaporation and even provide flow paths for evaporated heat transfer fluid to readily move to the periphery of the heat spreader.

Figure 41:
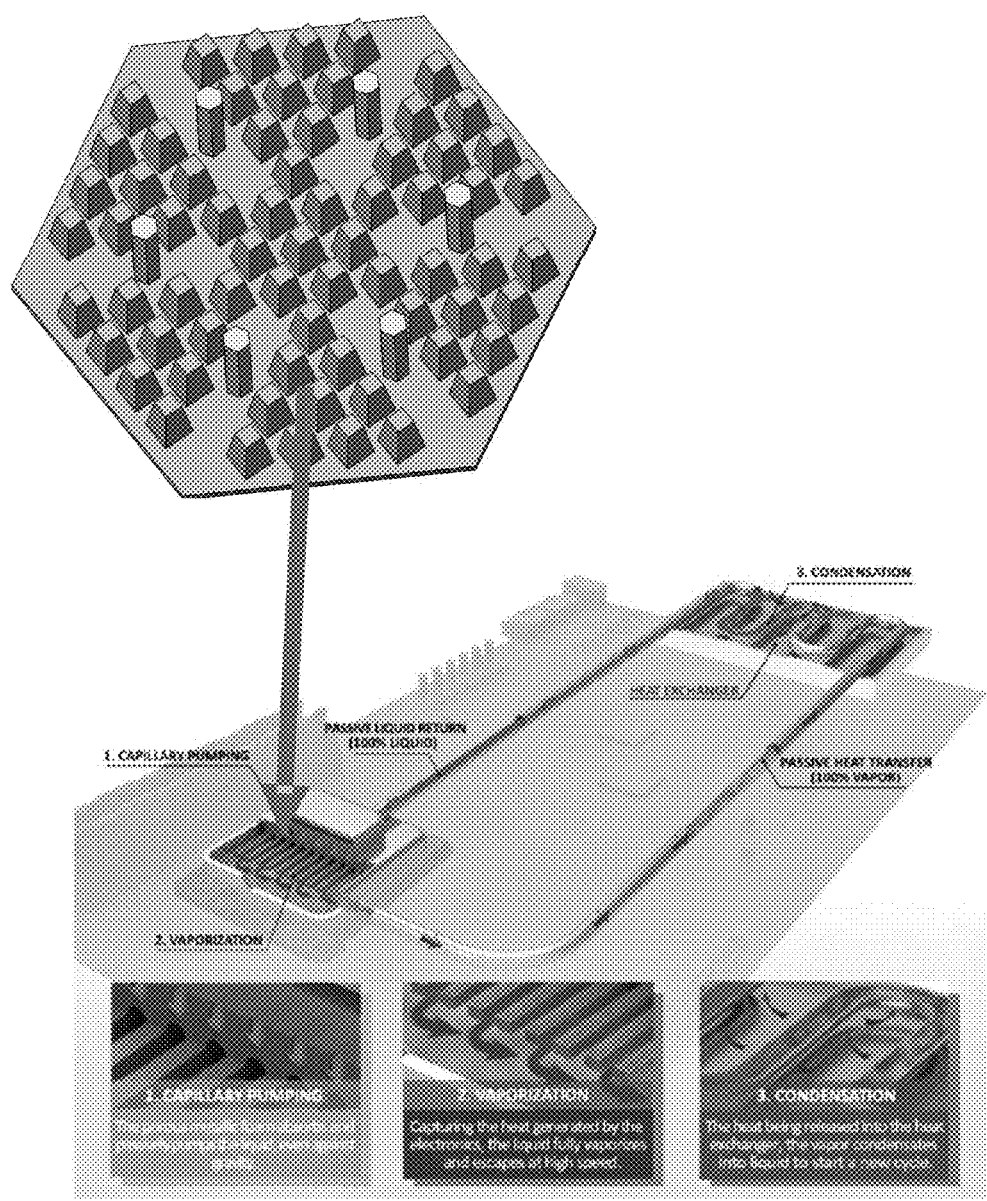
FIG. 41 illustrates where the evaporator of the type of FIG. 40 may be incorporated into a distributed heat spreader where the evaporator may be formed with the advantages of a multi-material, multi-layer electrochemical fabrication process without necessarily forming other elements via the same method.

FIG. 41 illustrates where the evaporator of the type of FIG. 40 may be incorporated into a distributed heat spreader where the evaporator may be formed with the advantages of a multi-material, multi-layer electrochemical fabrication process without necessarily forming other elements via the same method.

Figure 42:
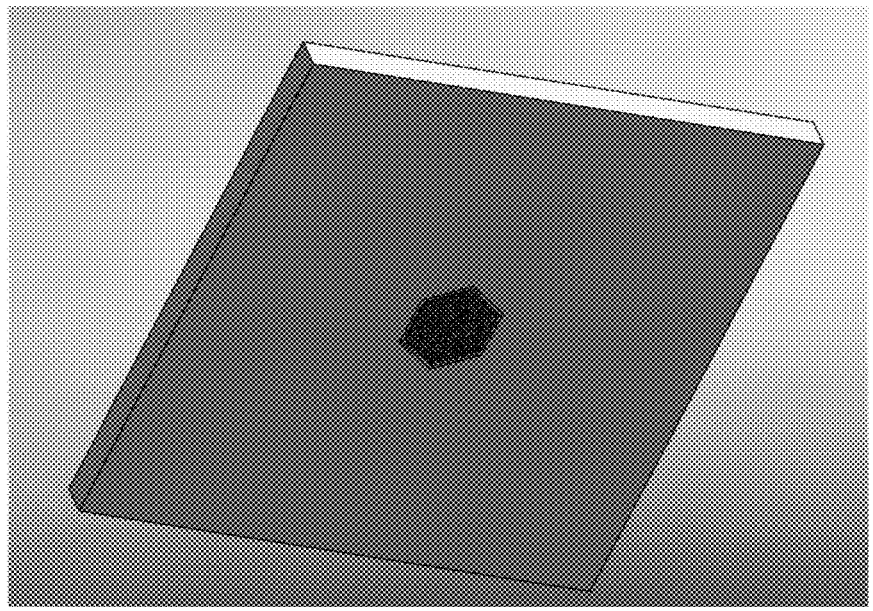
FIG. 42 illustrates a micro-vapor chamber for use in conjunction with a copper carrier.

FIG. 42 illustrates a micro-vapor chamber joined with a copper carrier. In this example a single hot spot vapor chamber design may be mounted (e.g. via solder) to a hot spot region of the back side of an integrated circuit or other structure to be cooled. The vapor chamber is encased in a copper carrier. The copper carrier could be replaced with a carrier of a different material in some variations. In some embodiments the carrier may be bonded to the IC while in other embodiments the carrier may be connected to the IC via a thermal grease or other heat conductive material without bonding to allow differential thermal expansion. In hybrid embodiments, the carrier may be bonded at selected locations via one or more spring-like or other stress relieving mechanical elements. Clamping may be used to hold the vapor chamber and IC and possibly the copper carrier in desired relative positions. In some embodiments, the copper carrier may not exist above the vapor chamber to allow the lid of the vapor chamber to expand to provide thermal stress relief. In other embodiments, overlying copper may exist to aid in heat conduction but be thin enough to allow some stress relief, while in still other embodiments, the lid of the vapor chamber may be separated from overlying copper by compliant elements alone or in combination with a thermal grease or the like to allow optimal thermal coupling along with stress reduction.

Figure 43:
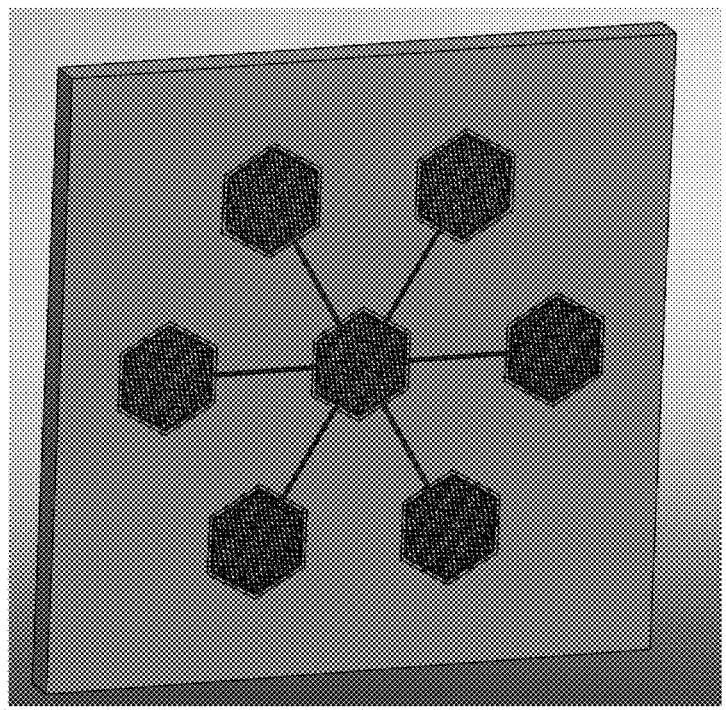
FIG. 43 illustrates a networked micro two-phase vapor chamber system within a copper carrier where individual vapor chambers are connected via micro heat pipes.

FIG. 43 illustrates a networked micro two-phase vapor chamber system within a copper carrier where individual vapor chambers are connected via micro heat pipes In variations, heat pipes may connect other hot spot vapor chambers directly, numbers of heat pipes or sizes of heat pipes may vary between different vapor chambers, numbers of, sizes of, and locations of vapor chambers may vary. In some implementations CTE variation stress relief structural configurations may be added to the carrier or the heat pipes extending between vapor chambers. In other variations, instead of connecting individual vapor chambers with heat pipes, individual vapor chambers may be coupled directly to other vapor chambers or to single-phase heat transfer arrays that connected to appropriate pumps, heat exchangers or the like.

Figure 44:
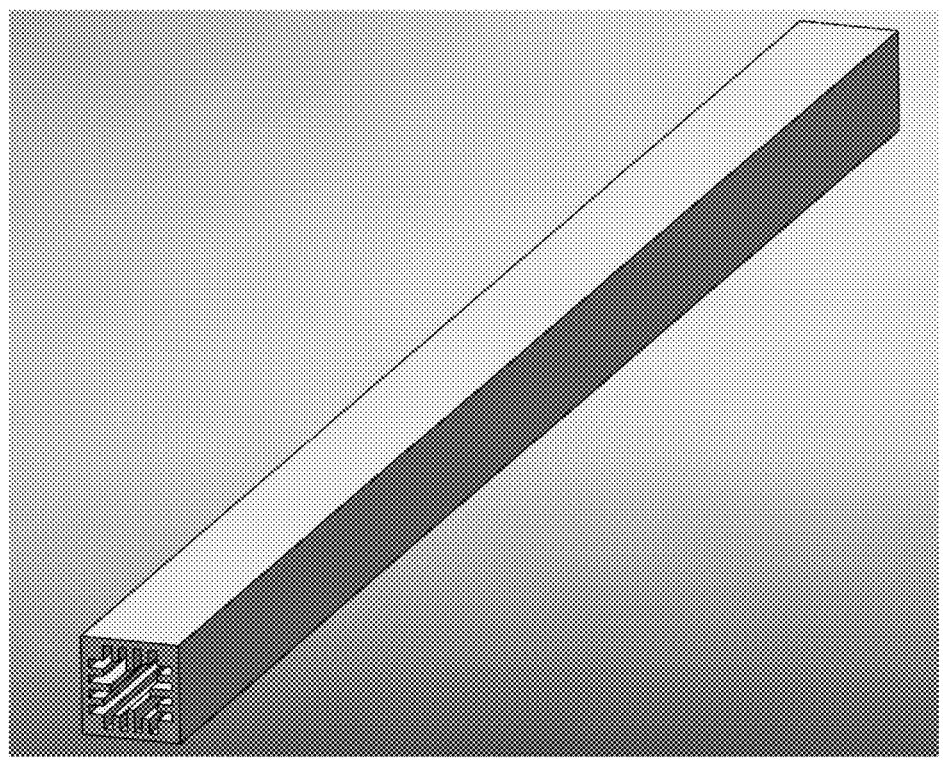
FIG. 44 illustrates a discrete heat pipe with ends open to allow view of internal capillary configuration along with open vapor path as it may be formed using a multi-layer, multi-material electrochemical fabrication process.

FIG. 44 illustrates a discrete heat pipe with ends open to allow view of internal capillary configuration along with open vapor path as it may be formed using a multi-layer, multi-material electrochemical fabrication process.

In other variations, the heat spreaders discussed herein above may take on different configurations depending on the locations of heat sources and locations of heat sinks or other heat dissipation locations or systems. In some embodiments, the vaporization regions need not be located in lateral center of the device. The vaporization locations may be located at an edge of the device, intermediate to the center or edge of the device, or in some cases a single device may include multiple vaporization locations which are separated by condensation regions or by transition regions or expander regions.

Various embodiments of the invention may provide thermal management for various devices and the heat transfer arrays or two-phase heat spreaders may be used to move heat generated by a variety of devices including for example: (1) an IC; (2) a microprocessor; (3) an SOC; (4) an RFIC, e.g. an RF transmitter or RF receiver; (5) an optical transmitter or receiver; (6) a power amplifier; (7) a GPU; (8) a CPU; (9) a DSP; (10) an ASIC; (11) an APU; (12) an LED; (13) a laser diode; (14) a power electronic device, e.g. a power inverter or a power converter; (15) a photonic devices, (16) a propulsion system; (17) a solar array, e.g. for a micro satellite; (18) a radiator, e.g. for a micro satellite; (19) an engine of a micro drone; (20) a spacecraft component such as an SSPA; (21) a traveling wave tube amplifier; (22) a package that holds one or more of the devices of (1)-(21), and (23) a stack or plurality of stacks of devices sandwiched between separated arrays or interleaved with multiple arrays.

In other embodiments, combinations of heat transfer arrays and vapor chambers or heat pipes may be used in removing heat from heat sources. In some embodiments pumps may be used in combination with two phase system to aid in the moving condensed heat transfer fluid back to the evaporation area. In still other embodiments, dimensional sizes of devices may extend below lower limits of the ranges given while in others they may be extended above upper range limits. In some embodiments structures may be formed from different materials or combinations of material than those indicated explicitly herein.

In some embodiments, self-contained vapor chambers may be provided, in some embodiments vapor chambers may incorporate part of a semiconductor die or other heat source as part of its wall, ceiling, or floor structure. In some embodiments an evaporator, a capillary flow enhancer, or other element or group of elements may be used individually or in combination with elements made by other methods. In some embodiments, micron scale additive processes may be used (with characteristic feature sizes, other than texturing, in the 1-30 micron range) to create structured wick elements and arrays with 3D optimization. In some embodiments, multi-layer, multi-material electrochemical fabrication methods may form entire vapor chambers, form vapor chambers directly on ICs, form vapor chamber separately and then bond or otherwise couple them to ICs. In some embodiments, texturing (micron to submicron or smaller feature size) may be used and may be formed from intermetallics of copper and palladium (annealing of palladium in presence of copper), from nickel cobalt, or form other materials. In some embodiments, 3D optimization may include, one or more of: (1) structures with vapor escape channels or other features formed from building blocks, clusters, arrays, and the like; (2) multi-scale pore size structures to allow for a wide operating range (lateral and/or vertical variations and/or structure function variations; and (3) independent optimization of wick for liquid permeability, vapor permeability, and conductivity. Some embodiments may use a palladium annealing process to create submicron level surface texturing. Some embodiments may use multiple metals to optimize performance where needed (i.e. copper for conduction, palladium for surface texturing, and nickel, nickel cobalt, or other nickel alloys for mechanical strength. In some embodiments integrated stain relief or CTE matching may be used such as via: (1) incorporation of mechanical elements or configurations that provide for reduced stress due to CTE mismatches between IC substrate material and vapor chamber material, (2) incorporation of materials that allow for non-stress expansion (e.g. thermal greases), or (3) incorporation of materials with better CTE matching. In some embodiments, enhanced charging and hermetic sealing approaches may be used such as via (1) wetting fences to inhibit solder from inadvertently flowing into the vapor chamber, (2) surface tension beading of solder vs working fluid, (3) plugging etch release holes via hermetic sealing methods taught in U.S. patent application Ser. No. 10/434,103 which is incorporated herein by reference.

FURTHER COMMENTS AND CONCLUSIONS

Structural or sacrificial dielectric materials may be incorporated into various embodiments of the present invention in a variety of different ways. Such materials may form a third or higher material on selected layers or may form one of the first two materials deposited on some layers. Additional teachings concerning the formation of structures on dielectric substrates and/or the formation of structures that incorporate dielectric materials into the formation process and possibility into the final structures are set forth in a number of patent applications filed Dec. 31, 2003. The first of these filings is U.S. Patent Application No. 60/534,184 which is entitled "Electrochemical Fabrication Methods Incorporating Dielectric Materials and/or Using Dielectric Substrates". The second of these filings is U.S. Patent Application No. 60/533,932, which is entitled "Electrochemical Fabrication Methods Using Dielectric Substrates". The third of these filings is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth such filing is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

Though the embodiments explicitly set forth herein have considered multi-material layers to be formed one after another. In some embodiments, it is possible to form structures on a layer-by-layer basis but to deviate from a strict planar layer on planar layer build up process in favor of a process that interlaces material between the layers. Such alternative build processes are disclosed in U.S. application Ser. No. 10/434,519, filed on May 7, 2003, now U.S. Pat. No. 7,252,861, entitled Methods of and Apparatus for Electrochemically Fabricating Structures Via Interlaced Layers or Via Selective Etching and Filling of Voids. The techniques disclosed in this referenced application may be combined with the techniques and alternatives set forth explicitly herein to derive additional alternative embodiments. In particular, the structural features are still defined on a planar-layer-by-planar-layer basis but one or more materials associated with some layers are formed along with material for other layers such that interlacing of deposited material occurs. Such interlacing may lead to reduced structural distortion during formation or improved interlayer adhesion. This patent application is herein incorporated by reference as if set forth in full.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| US Pat App No., Filing Date US App Pub No., Pub Date US Pat. No., Pub Date | Inventor, Title |
|---|---|
| 10/830,262 - Apr. 21, 2004 2004-0251142A - Dec. 16, 2004 Pat. 7,198,704 - Apr. 3, 2007 | Cohen, "Methods of Reducing Interlayer Discontinuities in Electrochemically Fabricated Three-Dimensional Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/607,931 - Jun. 27, 2003 2004-0140862 - Jul. 22, 2004 Pat. 7,239,219 - Jul. 3, 2007 | Brown, "Miniature RF and Microwave Components and Methods for Fabricating Such Components" |
| 10/841,100 - May 7, 2004 2005-0032362 - Feb. 10, 2005 Pat. 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/434,294 - May 7, 2003 2004-0065550A - Apr. 8, 2004 | Zhang, "Electrochemical Fabrication Methods With Enhanced Post Deposition Processing" |
| 10/434,103 - May 7, 2004 2004-0020782A - Feb. 5, 2004 Pat. 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/841,347 - May 7, 2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |
| 11/733,195 - Apr. 9, 2007 2008-0050524 - Feb. 28, 2008 | Kumar, "Methods of Forming Three-Dimensional Structures Having Reduced Stress and/or Curvature" |
| 11/506,586 - Aug. 8, 2006 2007-0039828 - Feb. 22, 2007 Pat. 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 Pat. 7,498,714 - Mar. 3, 2009 | Lockard, "Three-Dimensional Structures Having Feature Sizes Smaller Than a Minimum Feature Size and Methods for Fabricating" |
| 13/273,873 - Oct. 14, 2011 2012-0064227 - Mar. 15, 2012 — | Chen, "Cantilever Microprobes For Contacting Electronic Components and Methods for Making Such Probes" |
| 12/631,632 - Dec. 4, 2009 2010-0155253 - Jun. 24, 2010 | Kim, "Microprobe Tips and Methods for Making" |
| 12/345,624 - Dec. 29, 2008 — 8,070,931 - Dec. 6, 2011 | Cohen, "Electrochemical Fabrication Method Including Elastic Joining of Structures" |
| 10/995,609 - Nov. 22, 2004 2005-0202660 - Sep. 15, 2005 — | Cohen, "Electrochemical Fabrication Process Including Process Monitoring, Making Corrective Action Decisions, and Taking Appropriate Actions" |
| 11/028,957 - Jan. 3, 2005 2005-0202667 - Sep. 15, 2005 — | Cohen, "Electrochemical Fabrication Methods Incorporating Dielectric Materials and/or Using Dielectric Substrates" |
| 11/029,218 - Jan. 3, 2005 2005-0199583 - Sep. 15, 2005 7,524,427 - Apr. 28, 2009 | Cohen, "Electrochemical Fabrication Methods Incorporating Dielectric Materials and/or Using Dielectric Substrates" |
| 12/906.970 - Oct. 18, 2010 2011-0132767 - Jun. 11, 2009 — | Wu, "Multi-Layer, Multi-Material Fabrication Methods for Producing Micro-Scale and Millimeter-Scale Devices with Enhanced Electrical or Mechanical Properties" |
| 11/029,218 - Jan. 3, 2005 2005-0199583 - Sep. 15, 2005 7,524,427 - Apr. 28, 2009 | Cohen, "Electrochemical Fabrication Methods Incorporating Dielectric Materials and/or Using Dielectric Substrates" |
| 12/345,624 - Dec. 29, 2008 — 8,070,931 - Dec. 6, 2011 | Cohen, "Electrochemical Fabrication Method Including Elastic Joining of Structures" |
| 11/029,221 - Jan. 3, 2005 2005-0215023 - Sep. 29, 2005 7,531,077 - Jan. 03, 2005 | Cohen, "Electrochemical Fabrication Process for Forming Multilayer Multimaterial Microprobe Structures" |
| 12/828,274 - Jun. 30, 2010 — 8,262,916 - Sep. 11, 2012 | Smalley, "Enhanced Methods for at least Partial In Situ Release of Sacrificial Material From Cavities or Channels and/or Sealing of Etching Holes During Fabrication of Multi-Layer Microscale or Millimeter-scale Complex Three-Dimensional Structures" |
| 14/280,517 - May 16, 2014 — — | Cohen, "Stacking and Bonding Methods for Forming Multi-Layer, Three-Dimensional, Millimeter Scale and Microscale Structures" |
| 14/333,476 - Jul. 14, 2014 2015-0021299 - Jan. 22, 2015 — | Jensen, "Batch Methods of Forming Microscale or Millimeter Scale Structures Using Electro Discharge Machining Alone or In Combination with Other Fabrication Methods" |

| US Pat App No., Filing Date US App Pub No., Pub Date US Pat. No., Pub Date | Inventor, Title |
|---|---|
| 14/660,903 - Mar. 17, 2015 — — | Chen, "Methods of Forming Parts from One or More Layers of Deposited Material(s)" |
| 14/720,719 - May 22, 2015 — — | Veeramani, "Methods of Forming Parts Using Laser Machining" |

Though various portions of this specification have been provided with headers, it is not intended that the headers be used to limit the application of teachings found in one portion of the specification from applying to other portions of the specification. For example, it should be understood that alternatives acknowledged in association with one embodiment or aspect, are intended to apply to all embodiments or aspects to the extent that the features of the different embodiments or aspects make such application functional and do not otherwise contradict or remove all benefits of the adopted embodiment or aspect. Various other embodiments of the present invention exist. Some of these embodiments may be based on a combination of the teachings herein set forth herein directly with various teachings incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A heat spreader for an electronic heat generating component, comprising:
   (a) an enclosed chamber comprising a floor, a lid, and side walls, wherein the floor of the chamber provides an external surface that may be placed in contact with or in proximity to a heat generating electronic component;
   (b) a heat transfer fluid located within the chamber;
   (c) a condensation region located within the chamber comprising a first array of fins having a first spacing;
   (d) a vaporization region located with the chamber comprising a plurality of evaporation pores;
   (e) an intermediate region located within the chamber and between the condensation region and the evaporation region comprising at least one second array of fins having a second spacing;
   (f) a wicking structure located on or in proximity to the floor and extending from the condensation region to the vaporization region,
   (g) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the at least one second array of fins, or the wicking structure comprise a plurality of solid structures having an average size in the range of 20-60 microns that are spaced laterally from one another by gaps having average widths in the range of 5-50 microns and wherein the solid structures are joined vertically to one another in a laterally offset manner,
   wherein the solid structures are formed from vertically stacked, planarized layers of electrodeposited material, and
   wherein at least a portion of the solid structures have micron and submicron surface texturing with an average spacing of texturing features being less than 2 microns and an average size of texturing features being less than 2 microns.

2. The heat spreader of claim 1 wherein the wicking structure has a thickness in the range of 30-150 microns and has an average pore size in the range of 10-50 microns.

3. The heat spreader of claim 1 wherein the evaporation region also comprises an array of third fins.

4. The heat spreader of claim 1 wherein the 20-60 micron structures are formed into clusters having average lateral dimensions in the range of 100-600 microns.

5. The heat spreader of claim 4 wherein the clusters form individual fins.

6. The heat spreader of claim 5 wherein the fins are condensation fins.

7. The heat spreader of claim 5 wherein the fins are intermediate region fins.

8. The heat spreader of claim 4 wherein individual clusters are grouped into structured wick arrays having dimensions in the 1000-10000 micron range.

9. The heat spreader of claim 1 wherein a plurality of the solid structures form the wicking structure.

10. The heat spreader of claim 1 wherein at least a portion of the solid structures have micron and submicron surface texturing with an average spacing of texturing features being less than 1 micron and an average size of texturing features being less than 2 microns.

11. The heat spreader of claim 1 wherein at least a portion of the solid structures have micron and submicron surface texturing with an average spacing of texturing features being less than 0.5 microns and an average size of texturing features being less than 2 microns.

12. A heat spreader for an electronic heat generating component, comprising:
   (a) an enclosed chamber comprising a floor, a lid, and side walls, wherein the floor of the chamber provides an external surface that may be placed in contact with or in proximity to a heat generating electronic component;
   (b) a heat transfer fluid located within the chamber;
   (c) a condensation region located within the chamber comprising a first array of fins having a first spacing;
   (d) a vaporization region located with the chamber comprising a plurality of evaporation pores;

(e) an intermediate region located within the chamber and between the condensation region and the evaporation region comprising at least one second array of fins having a second spacing;

(f) a wicking structure located on or in proximity to the floor and extending from the condensation region to the vaporization region, (g) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the at least one second array of fins, or the wicking structure comprise a plurality of solid structures having an average size in the range of 20-60 microns that are spaced laterally from one another by gaps having average widths in the range of 5-50 microns and wherein the solid structures are joined vertically to one another in a laterally offset manner, wherein the first fin spacing is smaller than the second fin spacing and wherein the first fins have a height in the range of 200-600 microns with a base size of 100-300 microns and with an average pore size of 10-60 microns.

13. A heat spreader for an electronic heat generating component, comprising:

(a) an enclosed chamber comprising a floor, a lid, and side walls, wherein the floor of the chamber provides an external surface that may be placed in contact with or in proximity to a heat generating electronic component;

(b) a heat transfer fluid located within the chamber;

(c) a condensation region located within the chamber comprising a first array of fins having a first spacing;

(d) a vaporization region located with the chamber comprising a plurality of evaporation pores;

(e) an intermediate region located within the chamber and between the condensation region and the evaporation region comprising at least one second array of fins having a second spacing;

(f) a wicking structure located on or in proximity to the floor and extending from the condensation region to the vaporization region, (g) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the at least one second array of fins, or the wicking structure comprise a plurality of solid structures having an average size in the range of 20-60 microns that are spaced laterally from one another by gaps having average widths in the range of 5-50 microns and wherein the solid structures are joined vertically to one another in a laterally offset manner, wherein the first fins have first average lateral dimension and the second fins have a second average lateral dimension which is larger than the first average lateral dimension.

14. A heat spreader for an electronic heat generating component, comprising:

(a) an enclosed chamber comprising a floor, a lid, and side walls, wherein the floor of the chamber provides an external surface that may be placed in contact with or in proximity to a heat generating electronic component;

(b) a heat transfer fluid located within the chamber;

(c) a condensation region located within the chamber comprising a first array of fins having a first spacing;

(d) a vaporization region located with the chamber comprising a plurality of evaporation pores;

(e) an intermediate region located within the chamber and between the condensation region and the evaporation region comprising at least one second array of fins having a second spacing;

(f) a wicking structure located on or in proximity to the floor and extending from the condensation region to the vaporization region, (g) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the at least one second array of fins, or the wicking structure comprise a plurality of solid structures having an average size in the range of 20-60 microns that are spaced laterally from one another by gaps having average widths in the range of 5-50 microns and wherein the solid structures are joined vertically to one another in a laterally offset manner, wherein the evaporation region also comprises an array of third fins, having an average height which is less than an average height of the first or second fins.

15. An electronic component with a heat spreader, comprising:

(a) an electronic component;

(b) an enclosed chamber comprising a floor, a lid, and side walls, wherein the floor of the chamber comprises a surface of the heat generating component;

(c) a heat transfer fluid located within the chamber;

(d) a condensation region located within the chamber comprising a first array of fins having a first spacing;

(e) a vaporization region located within the chamber comprising a plurality of evaporation pores;

(f) an intermediate region located within the chamber and between the condensation region and the evaporation region comprising at least one second array of fins having a second spacing;

(g) a wicking structure located on or in proximity to the floor and extending from the condensation region to the vaporization region, (h) a space extending from the evaporation region to the condensation region through which vaporized heat transfer fluid may travel, such that upon application of sufficient heat to the external surface of the floor by the electronic component, a portion of liquid heat transfer fluid is evaporated from the evaporation pores, flows through the space, and condenses at the condensation surface, and by capillary force is moved from the condensation region to the evaporation region via the wicking structure in a continuous flow that moves heat from the evaporation region to the condensation region, wherein at least one of the first array of fins, the second array of fins, or the wicking structure comprise a plurality of solid structures having an average size in the range of 20-60 micron that are spaced laterally from one another by gaps having average widths in the range of 5-50 microns and wherein the solid structures are joined vertically to one another in a laterally offset manner, wherein the solid structures are formed from vertically stacked, planarized layers of electrodeposited material, and wherein at least a portion of the solid structures have micron and submicron surface texturing with an average spacing of texturing features being less than 2 microns and an average size of texturing features being less than 2 microns.

16. The electronic component of claim 15 wherein the wicking structure comprises texturing formed on the surface of the electronic component via an etching operation.

17. The electronic component of claim 16 wherein the wicking structure comprises material deposited on to the surface of the electronic component prior to attaching the walls on lid of the heat spreader to the electronic component.

18. The electronic component of claim 17 wherein the first and second fin areas are attached to the lid or walls of the heat spreader prior to attaching the lid and walls to the electronic device.

19. The electronic component of claim 17 additionally comprising a mesh located between the first and second fin arrays and the electronic component.

* * * * *